US012718881B2

(12) United States Patent
Doornbos

(10) Patent No.: US 12,718,881 B2
(45) Date of Patent: Aug. 25, 2026

(54) TERNARY CONTENT-ADDRESSABLE MEMORY CELLS AND METHODS FOR FORMING THE SAME

(71) Applicant: Taiwan Semiconductor Manufacturing Company Limited, Hsinchu (TW)

(72) Inventor: Gerben Doornbos, Kessel-Lo (BE)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 438 days.

(21) Appl. No.: 18/446,390

(22) Filed: Aug. 8, 2023

(65) Prior Publication Data

US 2025/0054546 A1 Feb. 13, 2025

(51) Int. Cl.

| | |
|---|---|
| ***G11C 15/04*** | (2006.01) |
| ***G11C 5/06*** | (2006.01) |
| ***H10B 41/10*** | (2023.01) |
| ***H10B 41/30*** | (2023.01) |
| ***H10B 51/10*** | (2023.01) |

(Continued)

(52) U.S. Cl.

CPC ............ *G11C 15/046* (2013.01); *G11C 5/063* (2013.01); *H10B 41/10* (2023.02); *H10B 41/30* (2023.02); *H10B 51/10* (2023.02); *H10B 51/30* (2023.02); *H10D 30/0411* (2025.01); *H10D 30/0415* (2025.01); *H10D 30/6757* (2025.01); *H10D 30/68* (2025.01); *H10D 30/6891* (2025.01);

(Continued)

(58) Field of Classification Search

CPC ...... G11C 15/046; G11C 5/063; H10B 41/30; H10B 41/10; H10B 51/10; H10B 51/30; H10D 30/0411; H10D 30/6757; H10D 30/0415; H10D 30/701; H10D 30/6891; H01L 23/5226; H01L 23/5283

USPC .......................................................... 257/314

See application file for complete search history.

(56) References Cited

U.S. PATENT DOCUMENTS

| | | | |
|---|---|---|---|
| 6,256,216 B1 * | 7/2001 | Lien ..................... | G11C 15/046 365/204 |
| 6,262,907 B1 | 7/2001 | Lien et al. | |

(Continued)

FOREIGN PATENT DOCUMENTS

| | | | |
|---|---|---|---|
| JP | H09186240 A * | 7/1997 | |
| JP | 2002260388 A * | 9/2002 | ........... G11C 15/046 |

(Continued)

OTHER PUBLICATIONS

Jianq Chyun Intellectual Property Office; TW Application No. 112136985; Notice of Allowance of Sep. 9, 2024; 14 pages.

*Primary Examiner* — Phuc T Dang

(74) *Attorney, Agent, or Firm* — The Marbury Law Group, PLLC

(57) ABSTRACT

A four transistor ternary content-addressable memory cell includes a first series connection of a first non-hysteretic transistor (e.g., a thin-film transistor) and a first memory transistor (e.g., a thin-film transistor) including a first memory element configured to store a first binary bit; and a second series connection of a second non-hysteretic transistor and a second memory transistor including a second memory element configured to store a second binary bit. The first series connection and the second series connection are connected in parallel between a match line and a word line.

20 Claims, 42 Drawing Sheets

(51) Int. Cl.

| | |
|---|---|
| ***H10B 51/30*** | (2023.01) |
| ***H10D 30/01*** | (2025.01) |
| ***H10D 30/67*** | (2025.01) |
| ***H10D 30/68*** | (2025.01) |
| ***H10D 30/69*** | (2025.01) |
| ***H10W 20/41*** | (2026.01) |
| ***H10W 20/42*** | (2026.01) |

(52) U.S. Cl.

CPC .......... *H10D 30/701* (2025.01); *H10W 20/42* (2026.01); *H10W 20/435* (2026.01)

(56) References Cited

U.S. PATENT DOCUMENTS

| | | | | |
|---|---|---|---|---|
| 7,570,503 | B1 | 8/2009 | Maheshwari et al. | |
| 9,934,857 | B2 | 4/2018 | Zheng et al. | |
| 2023/0045806 | A1 * | 2/2023 | Jiang .................. | H10D 30/0415 |
| 2023/0197155 | A1 | 6/2023 | Tseng et al. | |
| 2023/0200075 | A1 * | 6/2023 | Gomes .................. | G11C 11/223<br>257/213 |

FOREIGN PATENT DOCUMENTS

| | | | |
|---|---|---|---|
| TW | 201435873 | A | 9/2014 |
| TW | I654609 | B | 3/2019 |

* cited by examiner 90
92
80
82
70
72
742
250
240
220
218
215
12
628(BLn*)
620
222

90
92
80
82
70
72
741
250
240
220
218
215
12
628(BLn)
620
221

98
88
78
90
80
70
350
340
320
315
628(SLn)
620
742
12
322

98
88
78
90
80
70
350
340
320
315
628(SLn*)
620
741
12
321

628(SLn*) 628(BLn) 628(BLn*) 628(SLn)

620

620
218L
628(SLn*) 628(BLn) 628(BLn*) 628(SLn)

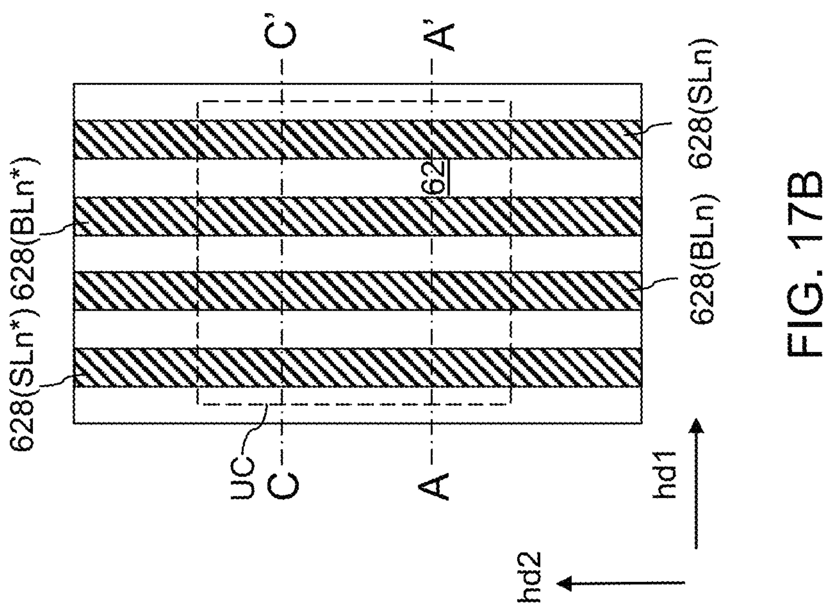
FIG. 17B
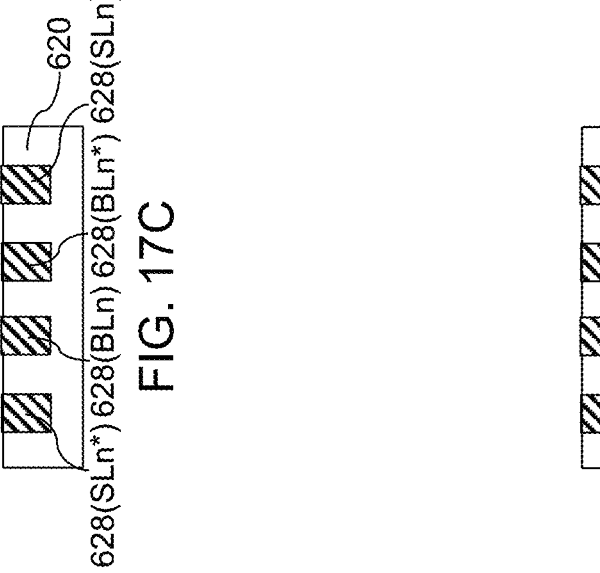
FIG. 17C
FIG. 17A

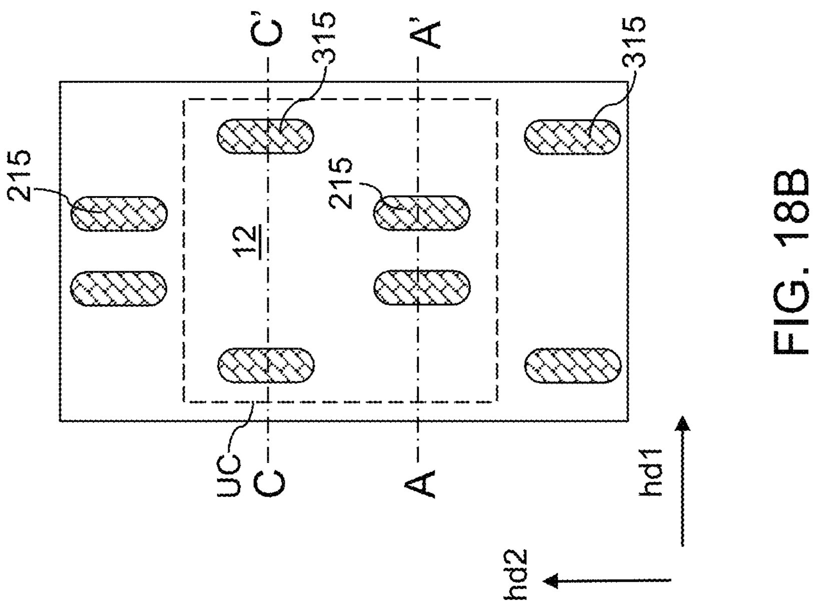
FIG. 18B
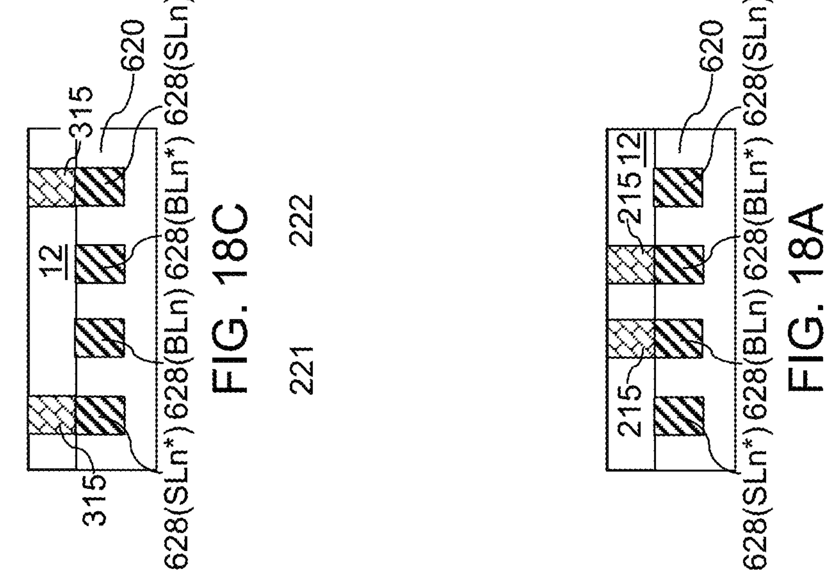
FIG. 18C
FIG. 18A

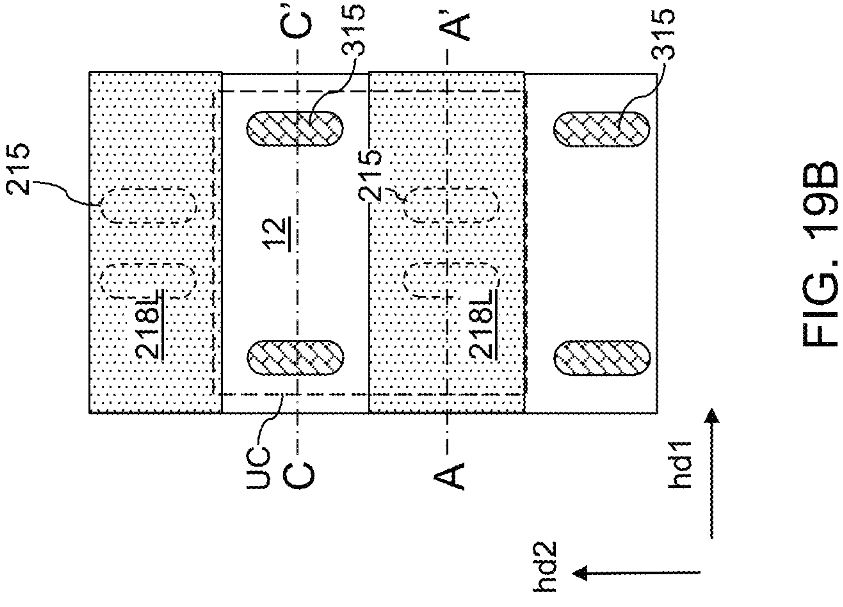
FIG. 19B
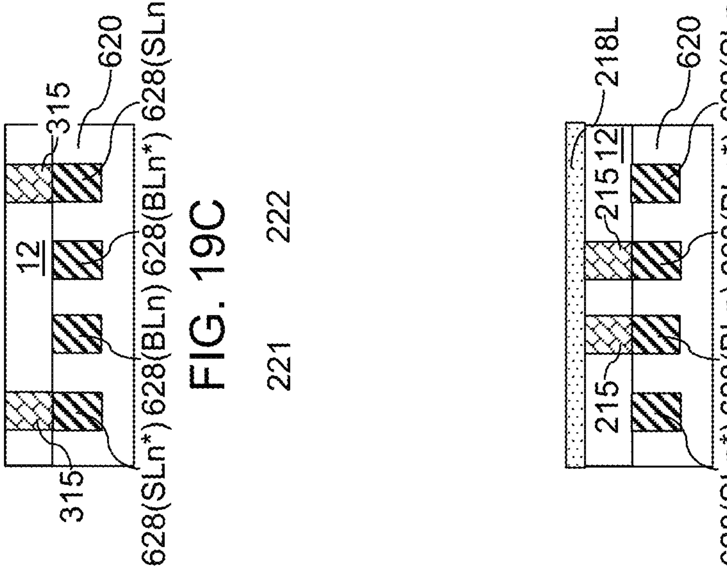
FIG. 19C
FIG. 19A

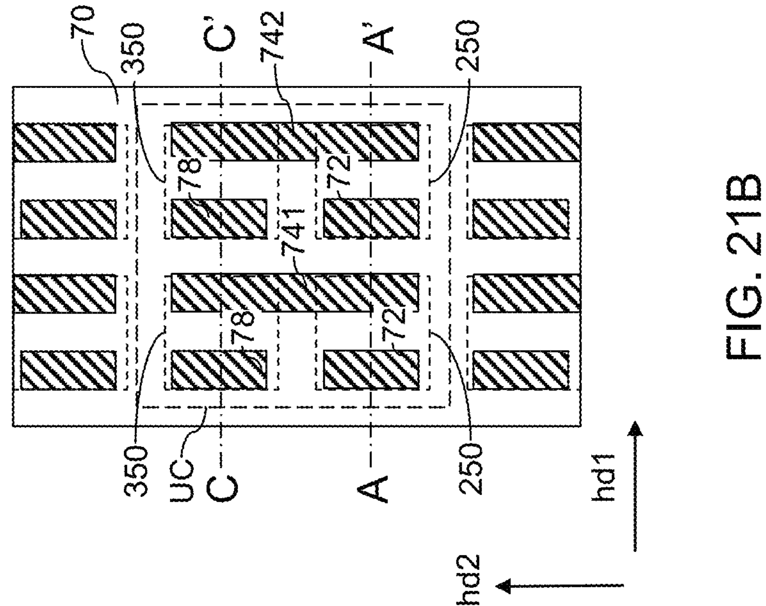
FIG. 21B
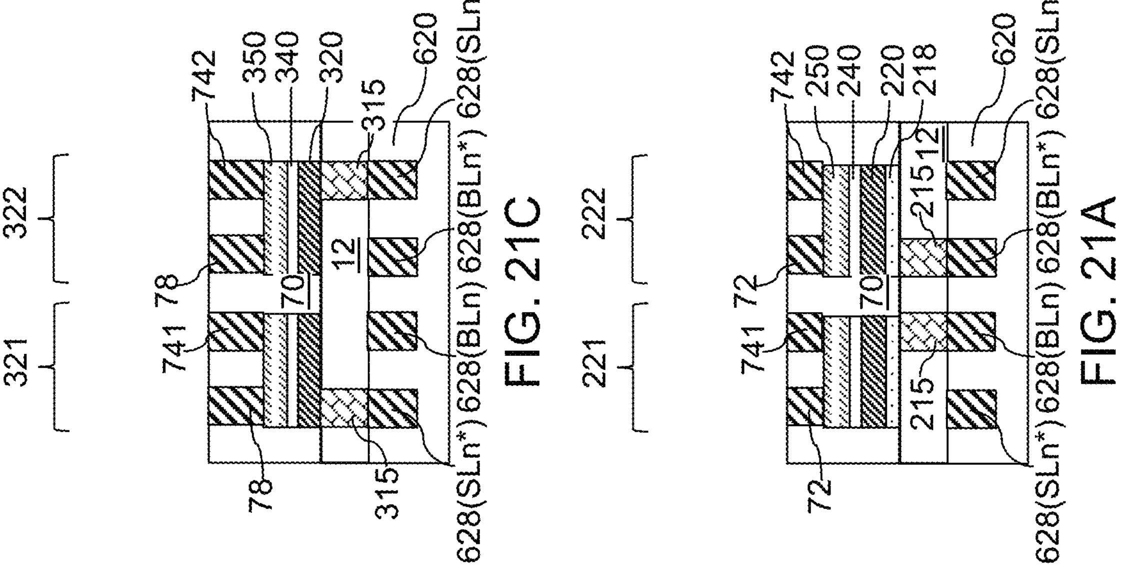
FIG. 21C
FIG. 21A

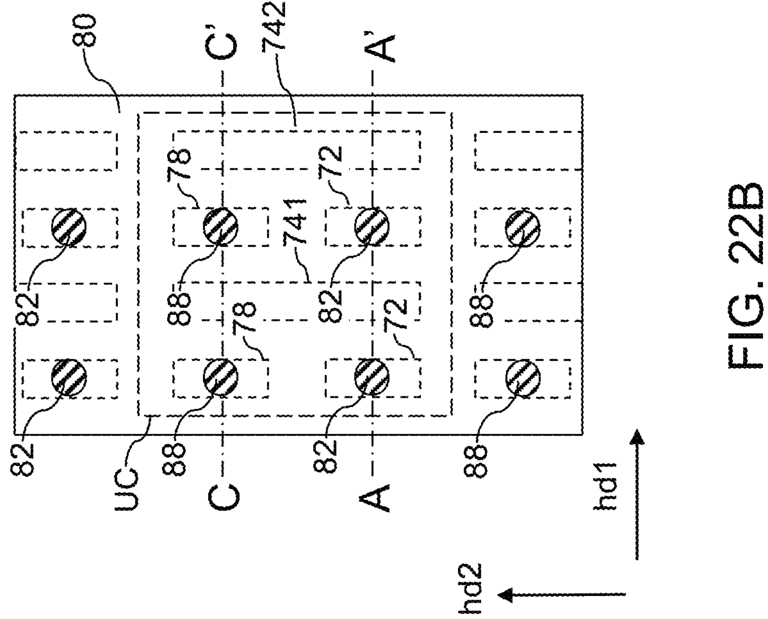
FIG. 22B
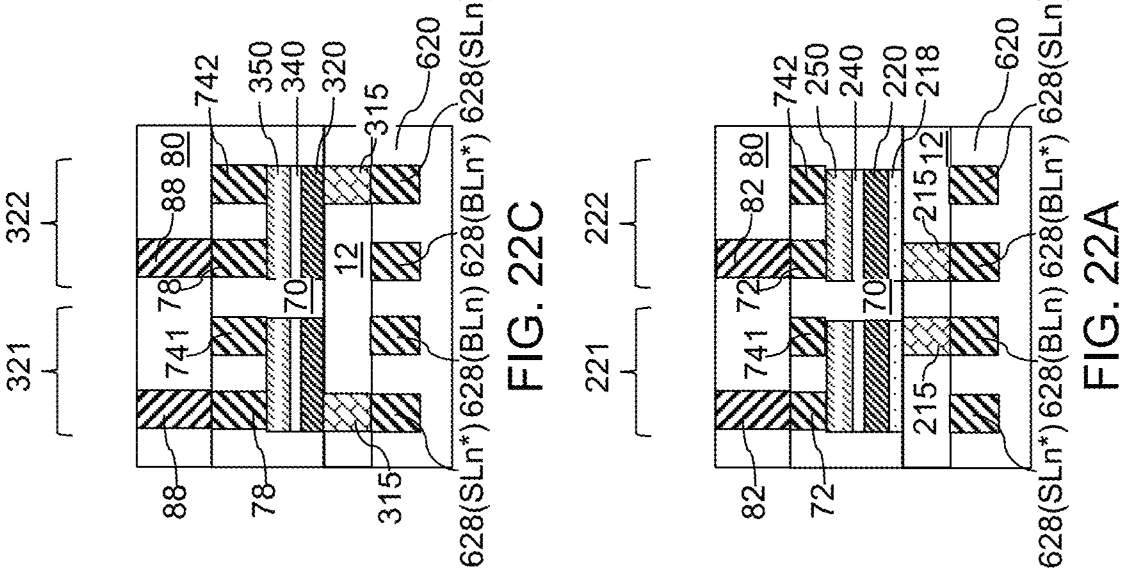
FIG. 22C
FIG. 22A

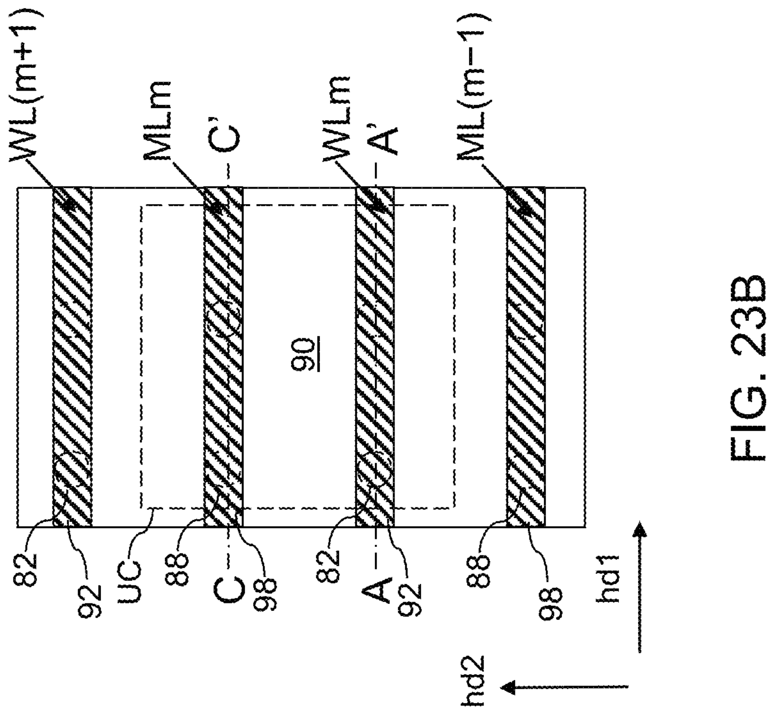
FIG. 23B
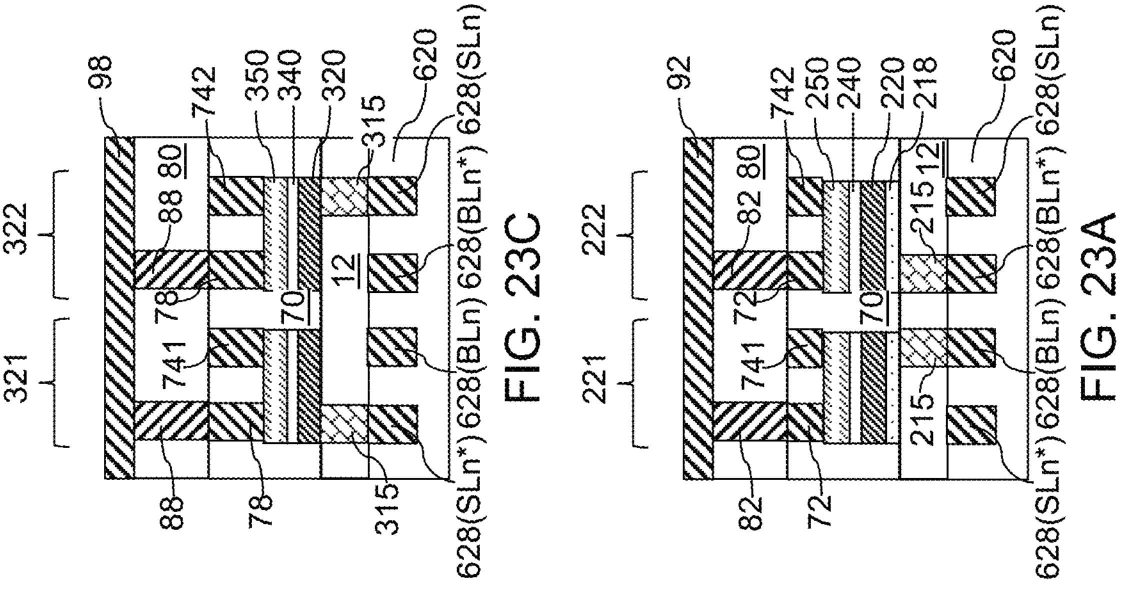
FIG. 23C
FIG. 23A

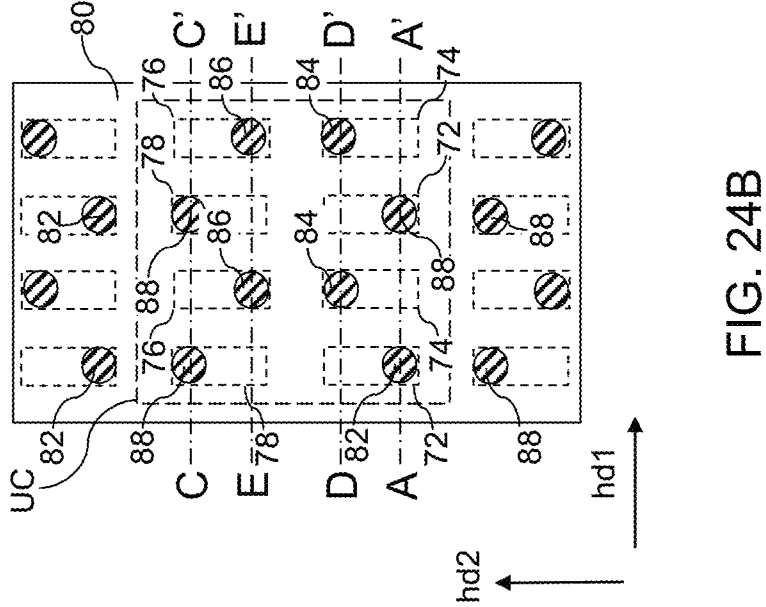
FIG. 24B
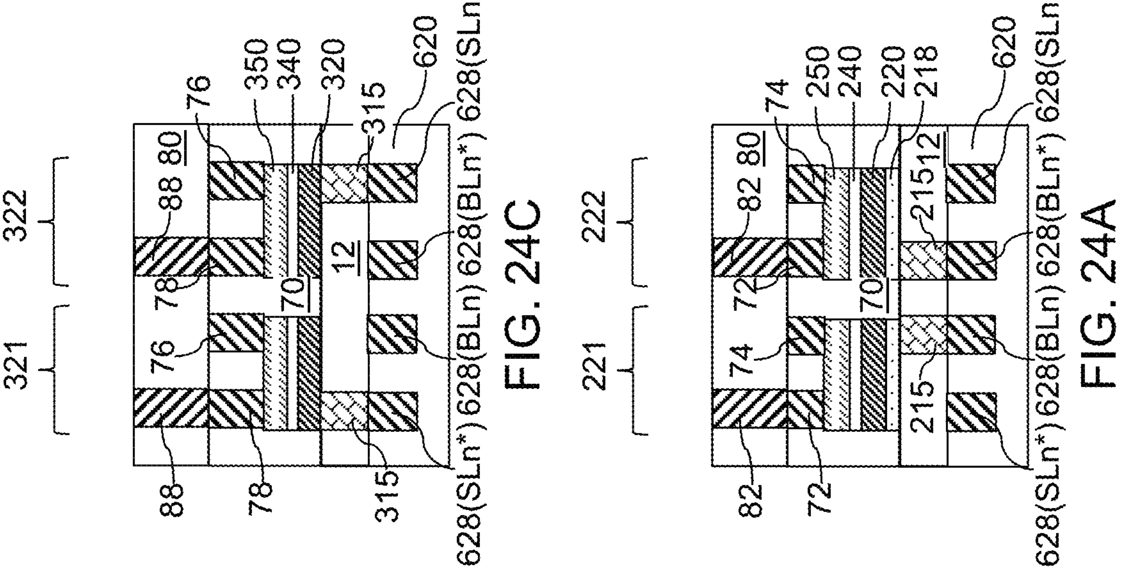
FIG. 24C
FIG. 24A

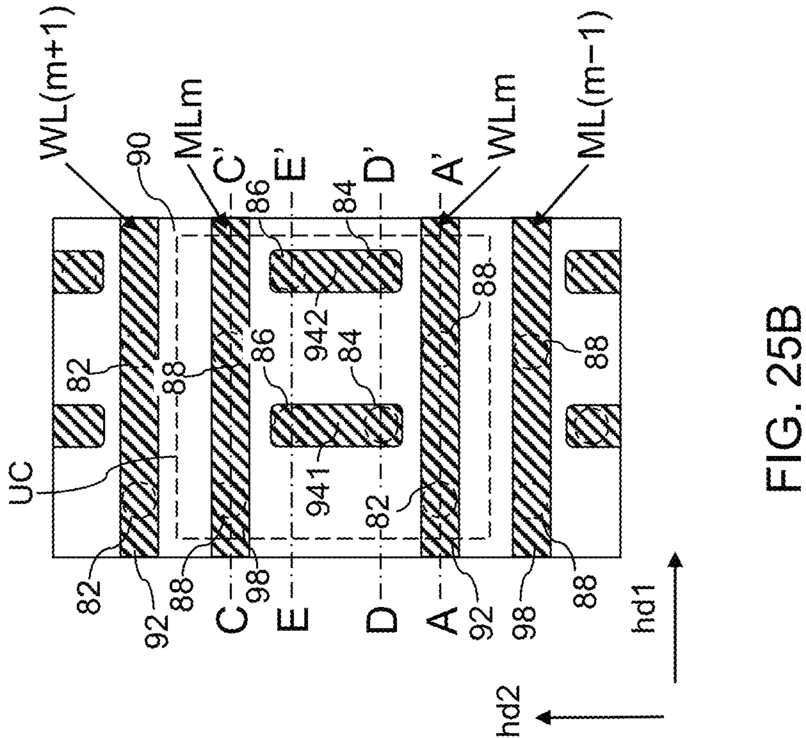
FIG. 25B
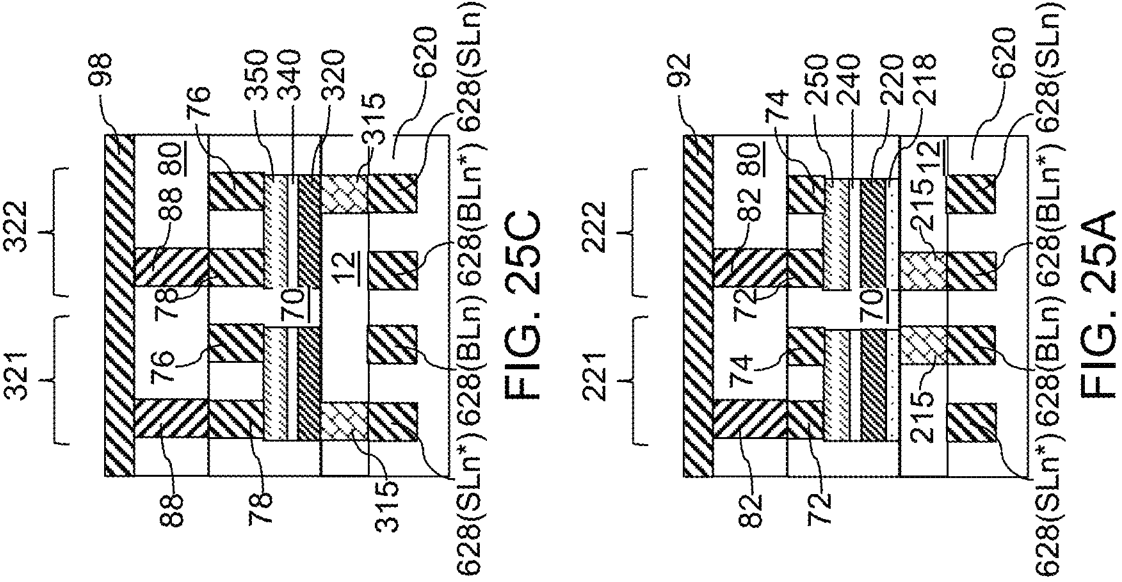
FIG. 25C
FIG. 25A

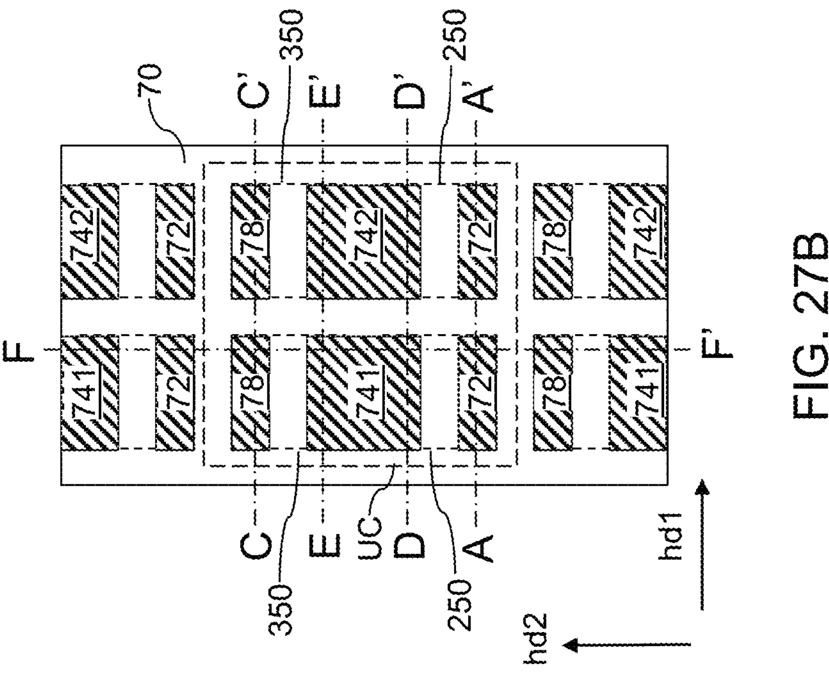
FIG. 27B
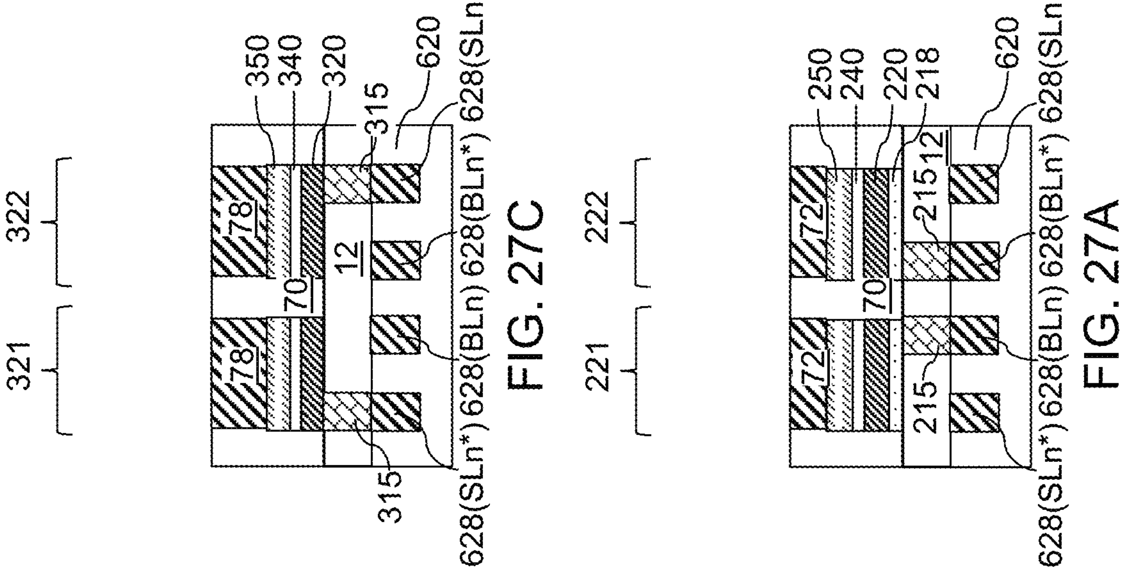
FIG. 27C
FIG. 27A

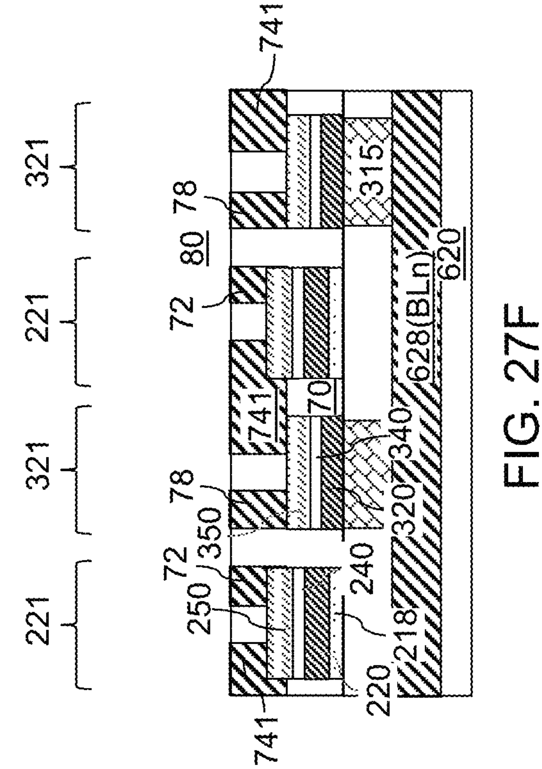
221
321
221
321
741
72
350
250
78
80
78
741
70
240
218
220
320
340
315
628(BLn)
620
741
FIG. 27F
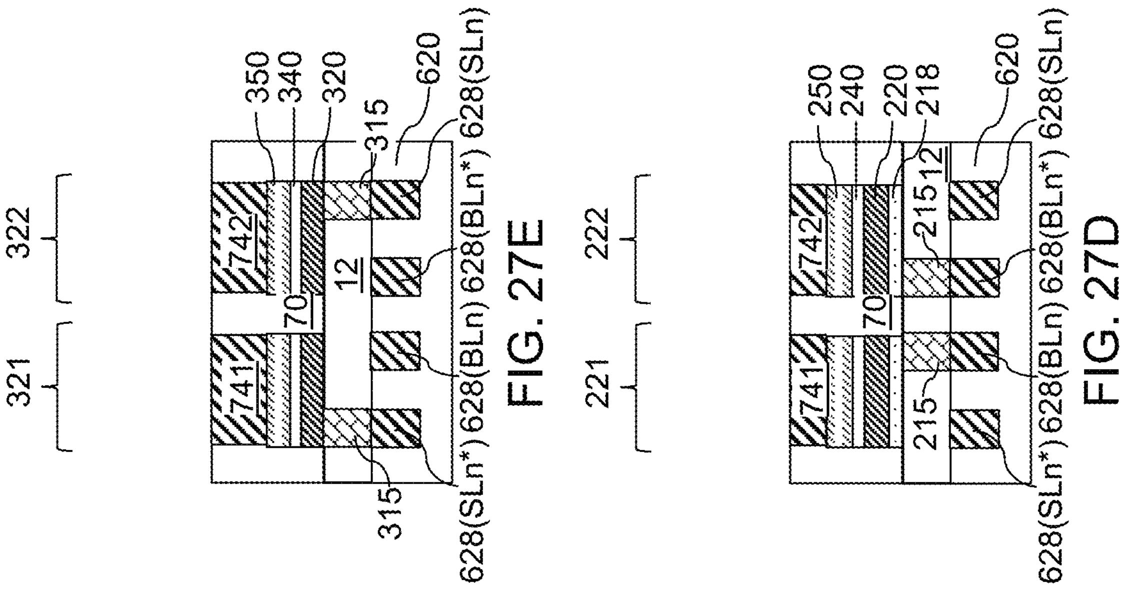
321
322
741
742
70
350
340
320
315
12
620
628(SLn*) 628(BLn) 628(BLn*) 628(SLn)
FIG. 27E
221
222
741
742
70
250
240
220
218
215
12
620
628(SLn*) 628(BLn) 628(BLn*) 628(SLn)
FIG. 27D

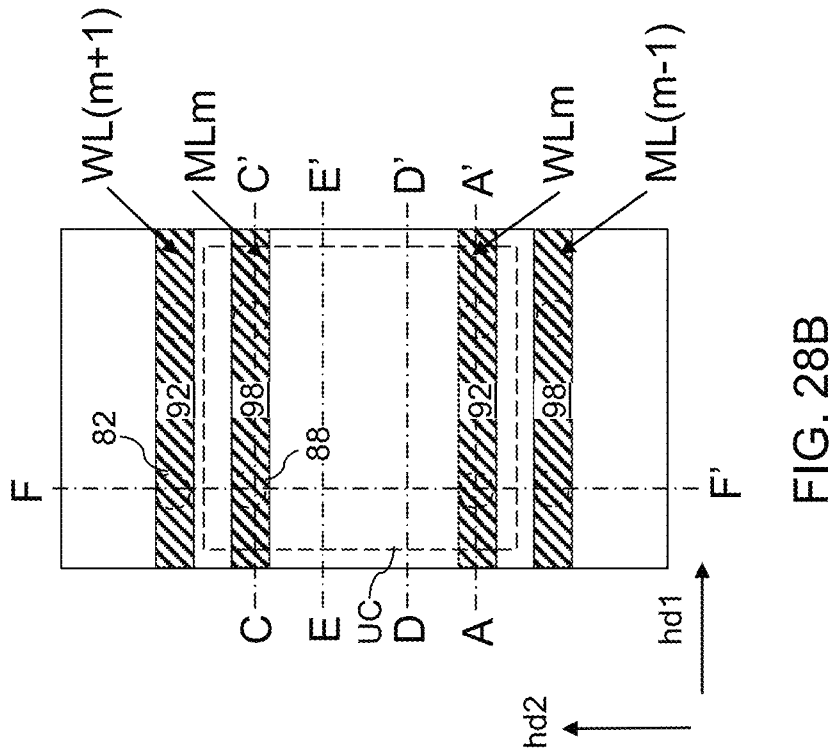
FIG. 28B
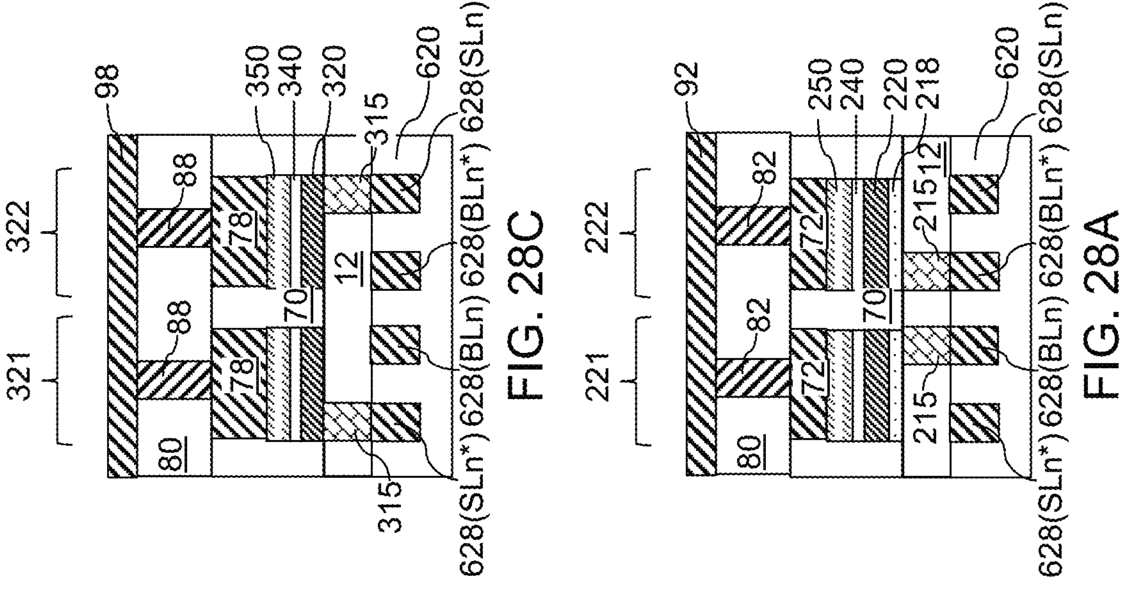
FIG. 28C
FIG. 28A

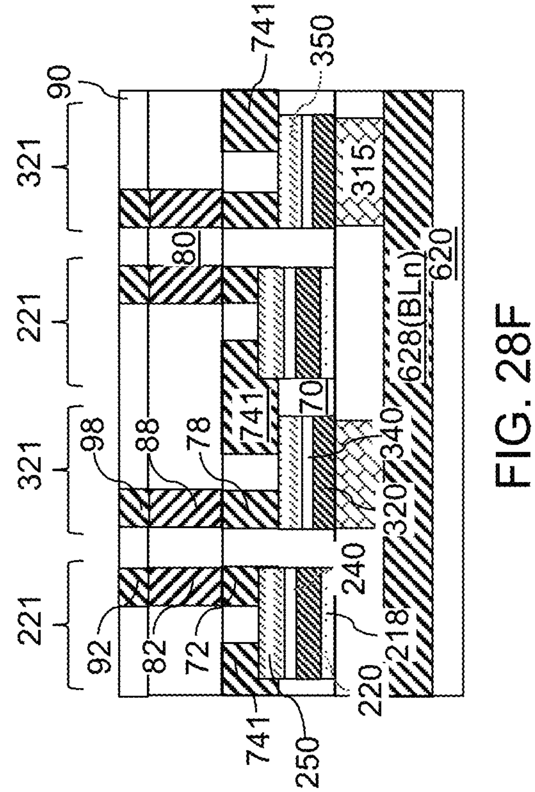
FIG. 28F
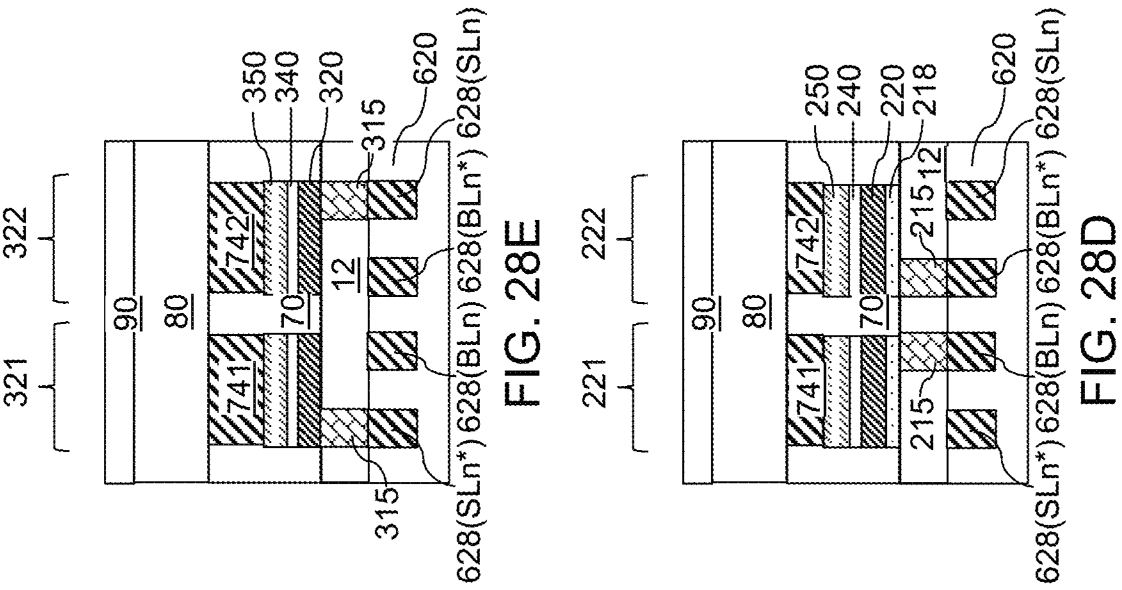
FIG. 28E
FIG. 28D

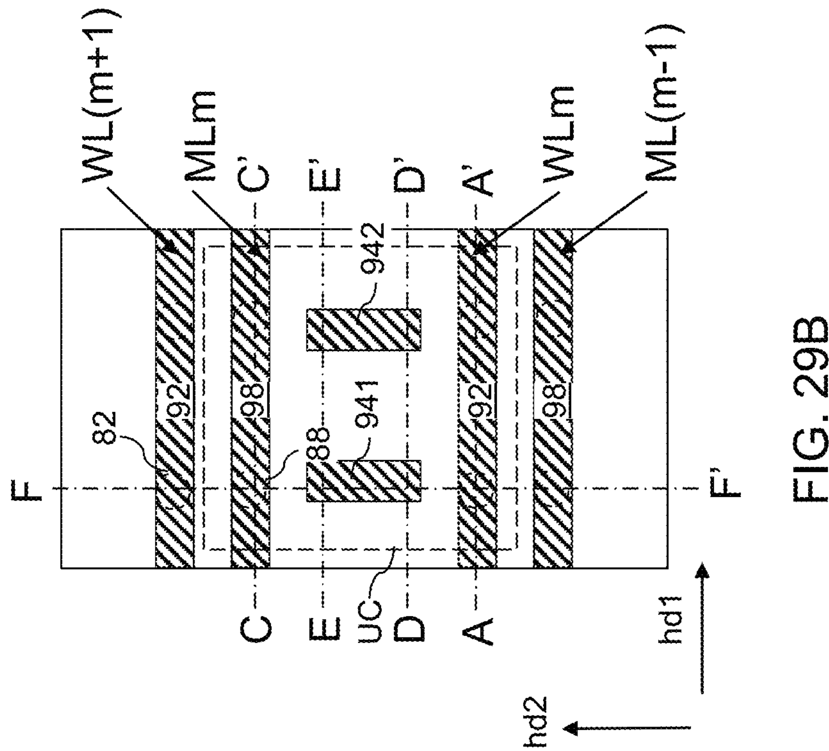
FIG. 29B
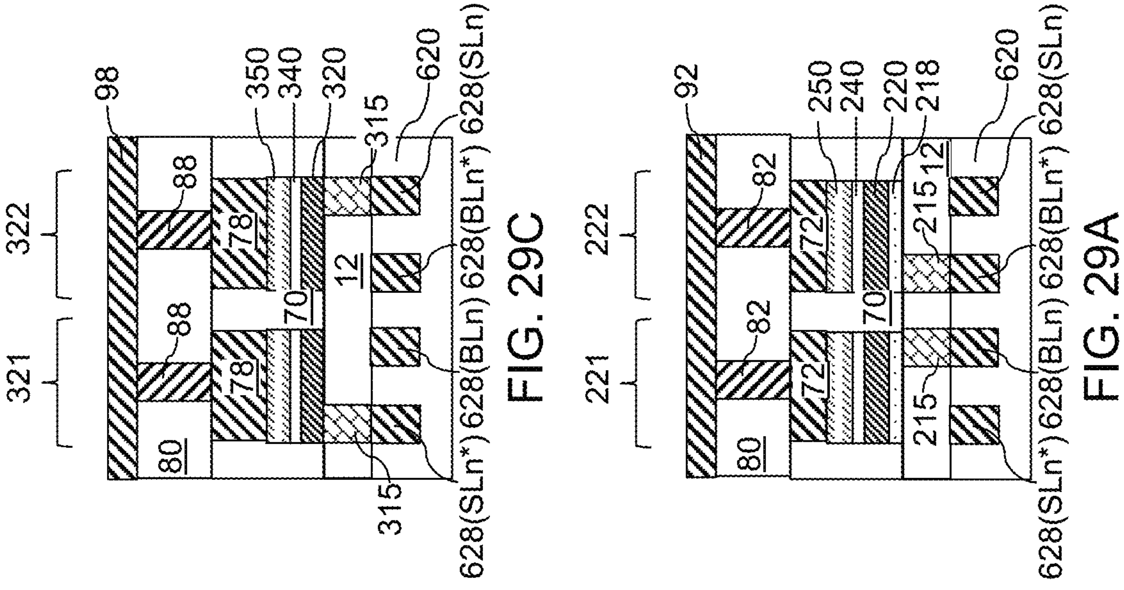
FIG. 29C
FIG. 29A

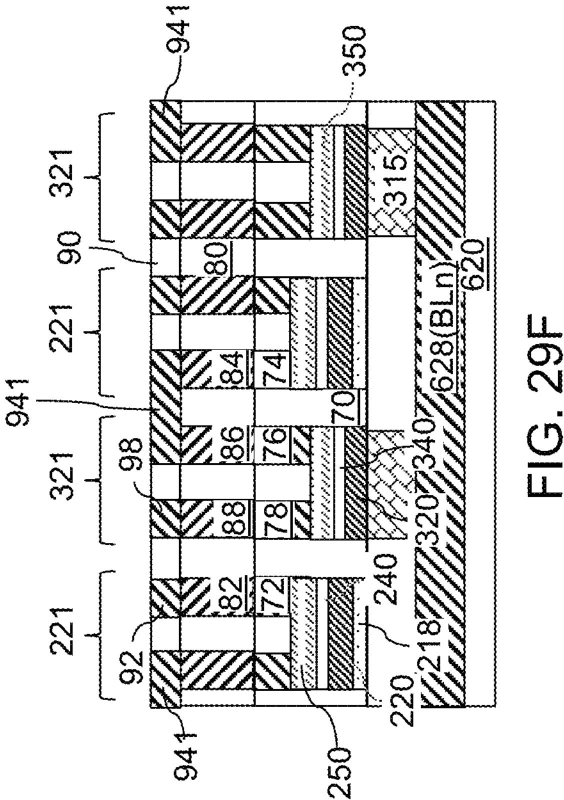
FIG. 29F
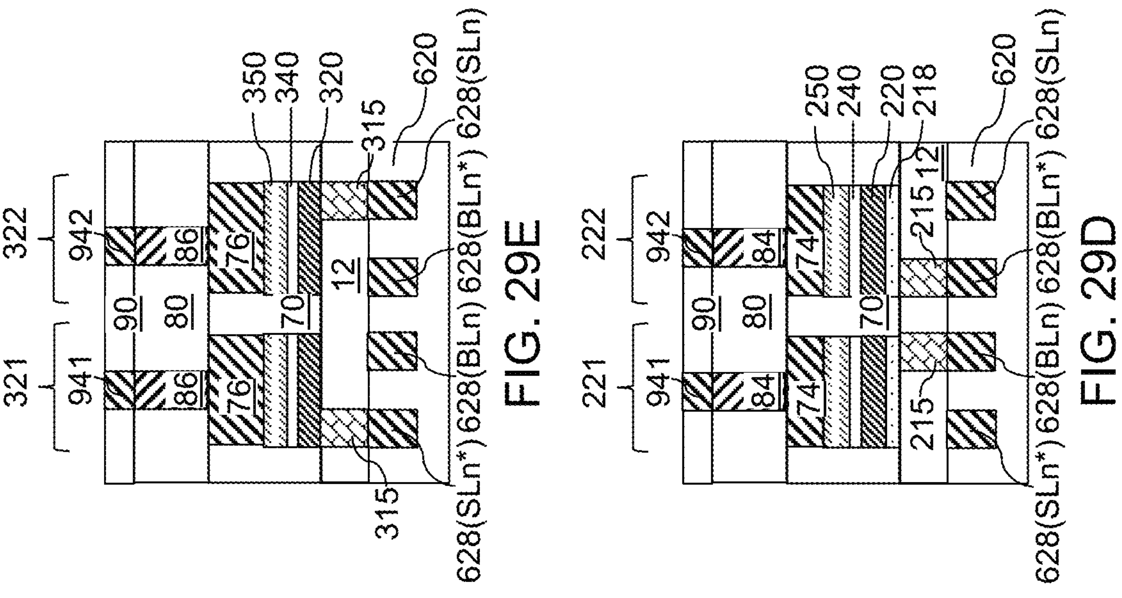
FIG. 29E
FIG. 29D

| During program of cell (m,n) | | | During search | | |
|---|---|---|---|---|---|
| BL | BL* | State | SL | SL* | ML discharge? |
| 0 | 0 | "x" or "don't care" | 0 | 0 | N |
| | | | 0 | 1 | N |
| | | | 1 | 0 | N |
| | | | 1 | 1 | *Not utilized* |
| 0 | 1 | "0" | 0 | 0 | N |
| | | | 0 | 1 | N |
| | | | 1 | 0 | Y |
| | | | 1 | 1 | *Not utilized* |
| 1 | 0 | "1" | 0 | 0 | N |
| | | | 0 | 1 | Y |
| | | | 1 | 0 | N |
| | | | 1 | 1 | *Not utilized* |
| 1 | 1 | *Not utilized* | - | - | - |
| | | | - | - | - |
| | | | - | - | - |
| | | | - | - | - |

FIG. 31

TERNARY CONTENT-ADDRESSABLE MEMORY CELLS AND METHODS FOR FORMING THE SAME

BACKGROUND

A ternary content-addressable memory (TCAM) cell is a type of high-speed memory cell that may be used in networking devices, such as routers and switches, for performing fast table lookups and matching operations. A TCAM cell may accelerate packet forwarding and routing processes by allowing simultaneous parallel searches across multiple entries. A TCAM cell differs from traditional memory technologies, such as random-access memory (RAM), in that a TCAM cell provides ternary logic-based comparisons. Ternary logic allows for three possible states: “0,” “1,” and “don’t care” (alternatively represented as “X” or “*”). This capability makes TCAM devices well-suited for performing complex matching operations with wildcard and range-based patterns.

In a typical networking application, a TCAM device may be used to store forwarding tables, access control lists (ACLs), and other types of data used in packet processing. In instances in which a packet arrives, a header information is compared against the entries in the TCAM device to determine the appropriate action to take, such as forwarding the packet to a specific port or applying a particular policy. TCAM cells in a TCAM device may operate in parallel, enabling the TCAM device to perform high-speed searches on large datasets in a single clock cycle. This characteristic makes TCAM devices highly efficient for tasks requiring fast matching and decision-making, but such efficiency comes at the cost of device complexity for a TCAM cell. For example, typical TCAM cells known in the art include 10 or more transistors per cell. Further, as a consequence of containing many transistors per TCAM cell, TCAM devices consumes more power compared to alternative memory cells.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A is a vertical cross-sectional view of a first region for forming a memory transistor. FIG. 3B is a top-down view of the first region illustrated in FIG. 3A. FIG. 3C is a vertical cross-sectional view of a second region for forming a non-hysteretic transistor. FIG. 3D is a top-down view of the second region illustrated in FIG. 3C.

FIG. 4A is a vertical cross-sectional view of the first region. FIG. 4B is a top-down view of the first region. FIG. 4C is a vertical cross-sectional view of the second region. FIG. 4D is a top-down view of the second region.

FIG. 5A is a vertical cross-sectional view of a first memory transistor. FIG. 5B is a vertical cross-sectional view of a second memory transistor. FIG. 5C is a vertical cross-sectional view of a first non-hysteretic transistor. FIG. 5D is a vertical cross-sectional view of a second non-hysteretic transistor.

FIG. 6A is a vertical cross-sectional view of the first memory transistor.

FIG. 6B is a vertical cross-sectional view of the second memory transistor. FIG. 6C is a vertical cross-sectional view of the first non-hysteretic transistor. FIG. 6D is a vertical cross-sectional view of the second non-hysteretic transistor.

FIG. 7A is a vertical cross-sectional view of the first memory transistor. FIG. 7B is a vertical cross-sectional view of the second memory transistor. FIG. 7C is a vertical cross-sectional view of the first non-hysteretic transistor. FIG. 7D is a vertical cross-sectional view of the second non-hysteretic transistor.

FIG. 9A is a vertical cross-sectional view. FIG. 9B is a top-down view. The vertical plane A-A' in FIG. 9B is a cut plane for the vertical cross-sectional view of FIG. 9A.

FIG. 10A is a vertical cross-sectional view. FIG. 10B is a top-down view. The vertical plane A-A' in FIG. 10B is a cut plane for the vertical cross-sectional view of FIG. 10A.

FIG. 11A is a vertical cross-sectional view. FIG. 11B is a top-down view. The vertical plane A-A' in FIG. 11B is a cut plane for the vertical cross-sectional view of FIG. 11A.

FIG. 12A is a vertical cross-sectional view. FIG. 12B is a top-down view. The vertical plane A-A' in FIG. 12B is a cut plane for the vertical cross-sectional view of FIG. 12A.

FIG. 13A is a vertical cross-sectional view. FIG. 13B is a top-down view. The vertical plane A-A' in FIG. 13B is a cut plane for the vertical cross-sectional view of FIG. 13A.

FIG. 14A is a first vertical cross-sectional view. FIG. 14B is a top-down view. FIG. 14C is a second vertical cross-sectional view. The vertical plane A-A' in FIG. 14B is a cut plane for the vertical cross-sectional view of FIG. 14A. The vertical plane C-C' in FIG. 14B is a cut plane for the vertical cross-sectional view of FIG. 14C.

FIG. 15A is a first vertical cross-sectional view. FIG. 15B is a top-down view. FIG. 15C is a second vertical cross-sectional view. The vertical plane A-A' in FIG. 15B is a cut plane for the vertical cross-sectional view of FIG. 15A. The vertical plane C-C' in FIG. 15B is a cut plane for the vertical cross-sectional view of FIG. 15C.

FIG. 16A is a first vertical cross-sectional view. FIG. 16B is a top-down view. FIG. 16C is a second vertical cross-sectional view. The vertical plane A-A' in FIG. 16B is a cut plane for the vertical cross-sectional view of FIG. 16A. The vertical plane C-C' in FIG. 16B is a cut plane for the vertical cross-sectional view of FIG. 16C.

FIGS. 17A-17C are views of a region of a third exemplary structure after formation of search lines and bit lines according to a third embodiment of the present disclosure. FIG. 17A is a first vertical cross-sectional view. FIG. 17B is a top-down view. FIG. 17C is a second vertical cross-sectional view. The vertical plane A-A' in FIG. 17B is a cut plane for the vertical cross-sectional view of FIG. 17A. The vertical plane C-C' in FIG. 17B is a cut plane for the vertical cross-sectional view of FIG. 17C.

FIGS. 18A-18C are views of a region of the third exemplary structure after formation of a lower via-level dielectric layer and conductive via structures according to the third embodiment of the present disclosure. FIG. 18A is a first vertical cross-sectional view. FIG. 18B is a top-down view. FIG. 18C is a second vertical cross-sectional view. The vertical plane A-A' in FIG. 18B is a cut plane for the vertical cross-sectional view of FIG. 18A. The vertical plane C-C' in FIG. 18B is a cut plane for the vertical cross-sectional view of FIG. 18C.

FIGS. 19A-19C are views of a region of the third exemplary structure after formation of backside gate dielectric layers according to the third embodiment of the present disclosure. FIG. 19A is a first vertical cross-sectional view. FIG. 19B is a top-down view. FIG. 19C is a second vertical cross-sectional view. The vertical plane A-A' in FIG. 19B is a cut plane for the vertical cross-sectional view of FIG. 19A. The vertical plane C-C' in FIG. 19B is a cut plane for the vertical cross-sectional view of FIG. 19C.

FIG. 20A is a first vertical cross-sectional view. FIG. 20B is a top-down view. FIG. 20C is a second vertical cross-sectional view. The vertical plane A-A' in FIG. 20B is a cut plane for the vertical cross-sectional view of FIG. 20A. The vertical plane C-C' in FIG. 20B is a cut plane for the vertical cross-sectional view of FIG. 20C.

FIGS. 21A-21C are views of a region of the third exemplary structure after formation of a contact-level dielectric layer and contact via structures according to the third embodiment of the present disclosure. FIG. 21A is a first vertical cross-sectional view. FIG. 21B is a top-down view. FIG. 21C is a second vertical cross-sectional view. The vertical plane A-A' in FIG. 21B is a cut plane for the vertical cross-sectional view of FIG. 21A. The vertical plane C-C' in FIG. 21B is a cut plane for the vertical cross-sectional view of FIG. 21C.

FIGS. 22A-22C are views of a region of the third exemplary structure after formation of a via-level dielectric layer and connection via structures according to the third embodiment of the present disclosure. FIG. 22A is a first vertical cross-sectional view. FIG. 22B is a top-down view. FIG. 22C is a second vertical cross-sectional view. The vertical plane A-A' in FIG. 22B is a cut plane for the vertical cross-sectional view of FIG. 22A. The vertical plane C-C' in FIG. 22B is a cut plane for the vertical cross-sectional view of FIG. 22C.

FIGS. 23A-23C are views of a region of the third exemplary structure after formation of a line-level dielectric layer, word lines, and match lines according to the third embodiment of the present disclosure. FIG. 23A is a first vertical cross-sectional view. FIG. 23B is a top-down view. FIG. 23C is a second vertical cross-sectional view. The vertical plane A-A' in FIG. 23B is a cut plane for the vertical cross-sectional view of FIG. 23A. The vertical plane C-C' in FIG. 23B is a cut plane for the vertical cross-sectional view of FIG. 23C.

FIGS. 24A-24E are views of a region of an alternative configuration of the third exemplary structure after formation of a via-level dielectric layer and connection via structures according to the third embodiment of the present disclosure. FIG. 24A is a first vertical cross-sectional view. FIG. 24B is a top-down view. FIG. 24C is a second vertical cross-sectional view. FIG. 24D is a third vertical cross-sectional view.

FIG. 24E is a fourth vertical cross-sectional view. The vertical plane A-A' in FIG. 24B is a cut plane for the vertical cross-sectional view of FIG. 24A. The vertical plane C-C' in FIG. 24B is a cut plane for the vertical cross-sectional view of FIG. 24C. The vertical plane D-D' in FIG. 24B is a cut plane for the vertical cross-sectional view of FIG. 24D. The vertical plane E-E' in FIG. 24B is a cut plane for the vertical cross-sectional view of FIG. 24E.

FIGS. 25A-25E are views of a region of the alternative configuration of the third exemplary structure after formation of a line-level dielectric layer, word lines, and match lines according to the third embodiment of the present disclosure. FIG. 25A is a first vertical cross-sectional view. FIG. 25B is a top-down view. FIG. 25C is a second vertical cross-sectional view. FIG. 25D is a third vertical cross-sectional view. FIG. 25E is a fourth vertical cross-sectional view. The vertical plane A-A' in FIG. 25B is a cut plane for the vertical cross-sectional view of FIG. 25A. The vertical plane C-C' in FIG. 25B is a cut plane for the vertical cross-sectional view of FIG. 25C. The vertical plane D-D' in FIG. 25B is a cut plane for the vertical cross-sectional view of FIG. 25D. The vertical plane E-E' in FIG. 25B is a cut plane for the vertical cross-sectional view of FIG. 25E.

FIG. 26A is a first vertical cross-sectional view. FIG. 26B is a top-down view. FIG. 26C is a second vertical cross-sectional view. The vertical plane A-A' in FIG. 26B is a cut plane for the vertical cross-sectional view of FIG. 26A. The vertical plane C-C' in FIG. 26B is a cut plane for the vertical cross-sectional view of FIG. 26C.

FIGS. 27A-27F are views of a region of the fourth exemplary structure after formation of a contact-level dielectric layer and contact via structures according to the fourth embodiment of the present disclosure. FIG. 27A is a first vertical cross-sectional view. FIG. 27B is a top-down view. FIG. 27C is a second vertical cross-sectional view. FIG. 27D is a third vertical cross-sectional view. FIG. 27E is a fourth vertical cross-sectional view. FIG. 27F is a fifth vertical cross-sectional view. The vertical plane A-A' in FIG. 27B is a cut plane for the vertical cross-sectional view of FIG. 27A. The vertical plane C-C' in FIG. 27B is a cut plane for the vertical cross-sectional view of FIG. 27C. The vertical plane D-D' in FIG. 27B is a cut plane for the vertical cross-sectional view of FIG. 27D. The vertical plane E-E' in FIG. 27B is a cut plane for the vertical cross-sectional view of FIG. 27E. The vertical plane F-F' in FIG. 27B is a cut plane for the vertical cross-sectional view of FIG. 27F.

FIGS. 28A-28F are views of a region of the fourth exemplary structure after formation of a via-level dielectric layer, connection via structures, a line-level dielectric layer, word lines, and match lines according to the fourth embodiment of the present disclosure. FIG. 28A is a first vertical cross-sectional view. FIG. 28B is a top-down view. FIG. 28C is a second vertical cross-sectional view. FIG. 28D is a third vertical cross-sectional view. FIG. 28E is a fourth vertical cross-sectional view. FIG. 28F is a fifth vertical cross-sectional view. The vertical plane A-A' in FIG. 28B is a cut plane for the vertical cross-sectional view of FIG. 28A. The vertical plane C-C' in FIG. 28B is a cut plane for the vertical cross-sectional view of FIG. 28C. The vertical plane D-D' in FIG. 28B is a cut plane for the vertical cross-sectional view of FIG. 28D. The vertical plane E-E' in FIG. 28B is a cut plane for the vertical cross-sectional view of FIG. 28E. The vertical plane F-F' in FIG. 28B is a cut plane for the vertical cross-sectional view of FIG. 28F.

FIGS. 29A-29F are views of a region of an alternative embodiment of the fourth exemplary structure after formation of a via-level dielectric layer, connection via structures, a line-level dielectric layer, word lines, and match lines according to the fourth embodiment of the present disclosure. FIG. 29A is a first vertical cross-sectional view. FIG. 29B is a top-down view. FIG. 29C is a second vertical cross-sectional view. FIG. 29D is a third vertical cross-sectional view. FIG. 29E is a fourth vertical cross-sectional view. FIG. 29F is a fifth vertical cross-sectional view. The vertical plane A-A' in FIG. 29B is a cut plane for the vertical cross-sectional view of FIG. 29A. The vertical plane C-C' in FIG. 29B is a cut plane for the vertical cross-sectional view of FIG. 29C. The vertical plane D-D' in FIG. 29B is a cut plane for the vertical cross-sectional view of FIG. 29D. The vertical plane E-E' in FIG. 29B is a cut plane for the vertical cross-sectional view of FIG. 29E. The vertical plane F-F' in FIG. 29B is a cut plane for the vertical cross-sectional view of FIG. 29F.

FIG. 31 is a table illustrating programming conditions and search conditions that may be used during operation of a four-transistor ternary content-addressable memory cell of the present disclosure.

DETAILED DESCRIPTION

Figure 1:
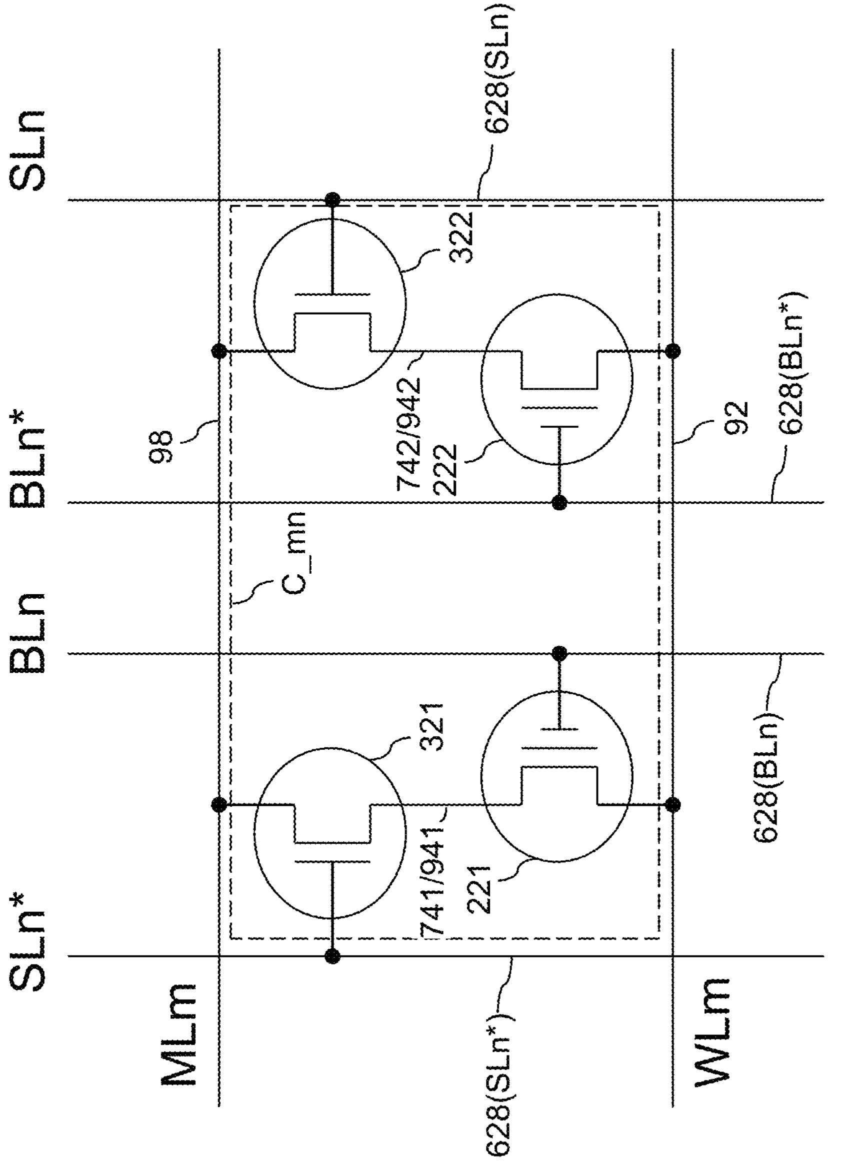
FIG. 1 is a circuit diagram for a four-transistor ternary content-addressable memory cell according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Same reference numerals refer to the same element or similar elements, and a same material composition and a same function are presumed for elements with the same reference numeral unless otherwise stated explicitly.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise.

Generally, embodiments of the present disclosure are directed to four transistor ternary content-addressable memory (4TFT-TCAM) cells and methods for forming the same. As used herein, a ternary content-addressable memory (TCAM) cell refers to a memory cell configured to store a ternary value data, which includes three possible states: "0," "1," and "X" ("X" may also be represented as "*"). The ternary logic allows for flexible pattern matching and wildcard-based searches. A TCAM cell may store a combination of these three states in its storage element. A match line and an provide line are provided for each TCAM cell. The match line is used to compare the stored data with an input pattern. The match line receives the input pattern and compares it with the stored value within the cell. The match line operates in parallel with other TCAM cells in a TCAM array, allowing for simultaneous searches across multiple entries. The provide line controls the activation of the TCAM cells during a search operation. The provide line determines whether the stored data within a TCAM cell will participate in the comparison process. By selectively enabling or disabling specific TCAM cells, the TCAM may perform complex matching operations and accommodate varying search requirements. The four transistors may be thin-film transistors (TFTs).

According to an aspect of the present disclosure, a TCAM cell includes two memory transistors and two non-hysteretic transistors that are formed using a common set of processing steps. As used herein, a "non-hysteretic" device refers to a device exhibiting device characteristics that do not depend on device history, and thus, does not store data. Memory transistors include a hysteretic element that may store data, of which the value may be detected by measuring the characteristics of the memory transistors. The TCAM cell of the present disclosure may be formed solely within a back-end-of-line (BEOL) level within interlayer dielectric (ILD) layers. Thus, the TCAM device of the present disclosure does not occupy any front-end-of-line (FEOL) real estate in a semiconductor die, but is provided as a BEOL structure formed within a metal interconnect level. Further, the total number of transistors per TCAM cell is limited (e.g., four transistors). In addition, the TCAM cell of the present disclosure is non-volatile. Thus, the TCAM cell does not consume energy in a standby state in which data is stored but is not actively used. The various aspects of the TCAM cell of the present disclosure are now described with reference to accompanying drawings.

Referring to FIG. 1, a circuit diagram is illustrated for a four-transistor ternary content-addressable memory (TCAM) cell C_mn according to an embodiment of the present disclosure. The ternary content-addressable memory cell C_mn comprises a limited number of transistors (e.g., no more than four field effect transistors), and provides the functionality of a ternary content-addressable memory cell, i.e., provides storage of a ternary bit data. In some embodiments, the ternary content-addressable memory cell C_mn may be referred to as a four-transistor ternary content-addressable memory cell C_mn. The ternary content-addressable memory cell C_mn is a memory cell at the location of an m-th row and an n-th column within an M×N array of ternary content-addressable memory cells. The row index m may be a positive integer between 1 and M, and the column index n may be a positive integer between 1 and N. The value of M may be in a range from 2 to $2^{20}$, and the value of N may be in a range from 2 to $2^{20}$, although lesser and greater values may also be used.

The four-transistor ternary content-addressable memory cell C_mn comprises a first series connection of a first non-hysteretic transistor 321 (e.g., thin-film transistor) and a first memory transistor 221 (e.g., thin-film transistor) comprising a first memory element (such as a floating gate electrode or a ferroelectric gate dielectric 230) configured to store a first binary bit. The four-transistor ternary content-addressable memory cell C_mn may further comprise a second series connection of a second non-hysteretic transistor 322 and a second memory transistor 222 comprising a second memory element (such as a floating gate electrode or a ferroelectric gate dielectric 230) configured to store a second binary bit. The combination of the first binary bit and the second binary bit may have a set of values of (0, 0), (1, 0), and (0, 1). The three sets of values may be used to store a ternary bit data. Generally, use of the set of values of (1, 1) is not necessary.

A primary search line SLn, a complementary search line SLn*, a primary bit line BLn, and a complementary bit line BLn* may be used to electrically bias the gate electrodes of the four transistors (221, 222, 321, 322). For the four-transistor ternary content-addressable memory cell C_mn, the primary search line SLn may be an n-th primary search line selected from N primary search lines, the complementary search line SLn* may be an n-th complementary search line selected from N complementary search lines, the primary bit line BLn may be an n-th primary bit line selected from N primary bit lines, and the complementary bit line BLn* may be an n-th complementary bit line selected from N complementary bit lines. The gate electrode of the first memory transistor 221 may be electrically biased by the primary bit line BLn; the gate electrode of the second memory transistor 222 may be electrically biased by the complementary bit line BLn*; the gate electrode of the first non-hysteretic transistor 321 may be electrically biased by the complementary search line SLn*; and the gate electrode of the second non-hysteretic transistor 322 may be electrically biased by the primary search line SLn.

The first series connection comprises a first electrically conductive path (741, 941) between a source/drain structure of the first non-hysteretic transistor 321 and a source/drain structure of the first memory transistor 221. The first electrically conductive path (741, 941) may comprise a first contact via structure 741 in direct contact with the source/drain structure of the first non-hysteretic transistor 321 and the source/drain structure of the first memory transistor 221, or may comprise a metal connection line 941 that is connected to the source/drain structure of the first non-hysteretic transistor 321 and the source/drain structure of the first memory transistor 221 through intervening via structures. The second series connection comprises a second electrically conductive path (742, 942) between a source/drain structure of the second non-hysteretic transistor 322 and a source/drain structure of the second memory transistor 222. The second electrically conductive path (742, 942) may comprise a second contact via structure 742 in direct contact with the source/drain structure of the second non-hysteretic transistor 322 and the source/drain structure of the second memory transistor 222, or may comprise a metal connection line 942 that is connected to the source/drain structure of the second non-hysteretic transistor 322 and the source/drain structure of the second memory transistor 222 through intervening via structures.

Generally, the primary search line SLn, the complementary search line SLn*, the primary bit line BLn, and the complementary bit line BLn* may comprise first metal lines formed within a first dielectric material layer. The first metal line level may be any metal line level in a metal interconnect structure. In an illustrative non-limiting example, the first metal line level may comprise i-th metal line structures formed within in an i-th interconnect-level dielectric material layer. For example, if the index is 2, the primary search line SLn, the complementary search line SLn*, the primary bit line BLn, and the complementary bit line BLn* may comprise second metal line structures 628.

The field effect transistors (221, 222, 321, 322) may be formed within a second dielectric material layer, which is herein referred to as a memory-level dielectric layer or a contact-level dielectric layer. The match line 98 (MLm) and the word line 92 (WLm) may comprise second metal lines formed within in a third dielectric material layer that overlies the second dielectric material layer. For example, the match line 98 (MLm) may comprise a second metal line structure, and the word line 92 (WLm) may comprise an additional second metal line structure.

Figure 2:
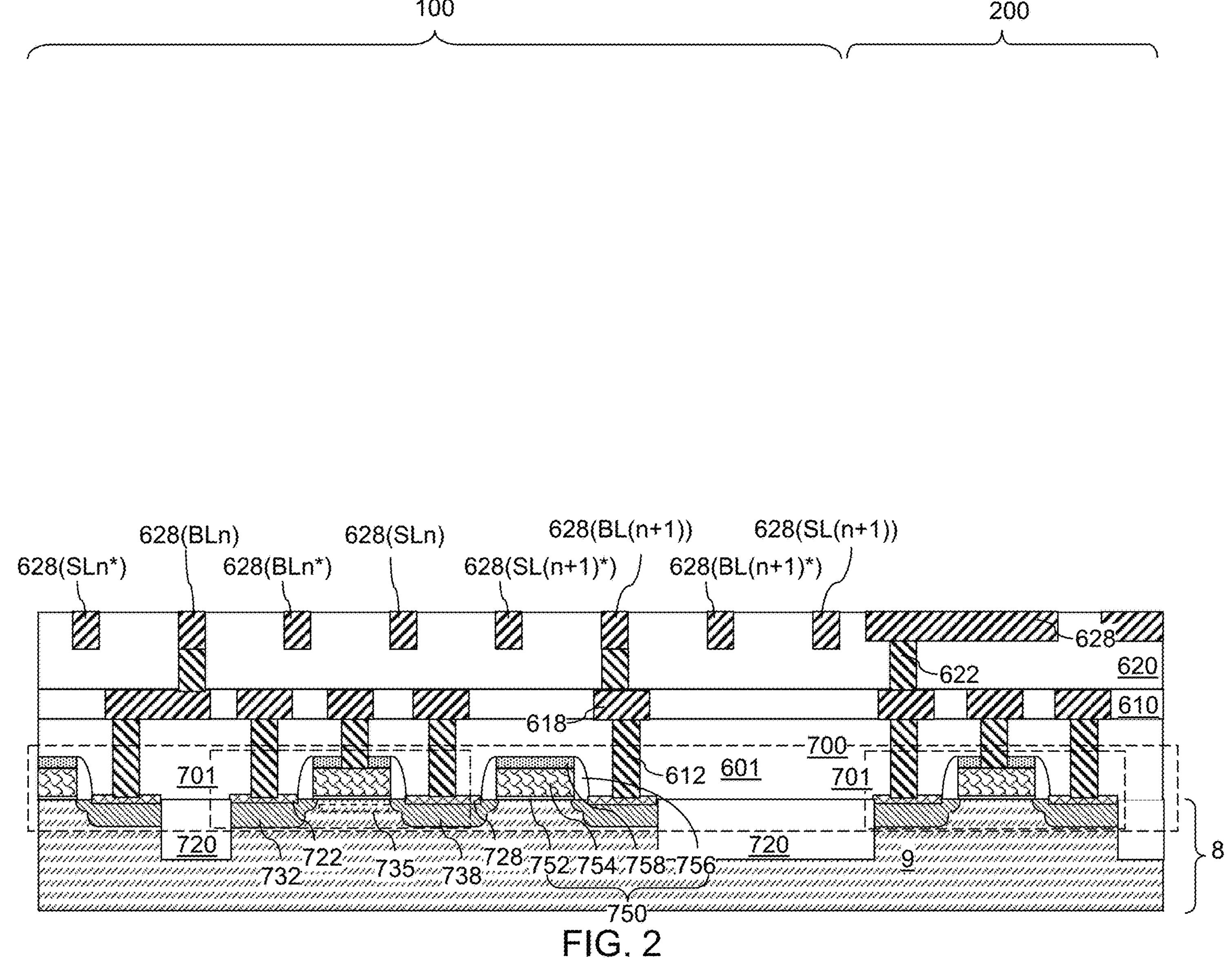
FIG. 2 is a vertical cross-sectional view of a first exemplary structure after formation of complementary metal-oxide-semiconductor (CMOS) transistors and first metal interconnect structures embedded in lower-level dielectric material layers according to a first embodiment of the present disclosure.

Referring to FIG. 2, a first exemplary structure according to a first embodiment of the present disclosure is illustrated. The first exemplary structure includes a substrate 8, which may be a semiconductor substrate such as a commercially available silicon substrate. The substrate 8 may include a semiconductor material layer 9 at least at an upper portion thereof. The semiconductor material layer 9 may be a surface portion of a bulk semiconductor substrate, or may be a top semiconductor layer of a semiconductor-on-insulator (SOI) substrate. In one embodiment, the semiconductor material layer 9 includes a single crystalline semiconductor material such as single crystalline silicon. In one embodiment, the substrate 8 may include a single crystalline silicon substrate including a single crystalline silicon material.

Shallow trench isolation structures 720 including a dielectric material such as silicon oxide may be formed in an upper portion of the semiconductor material layer 9. Suitable doped semiconductor wells, such as p-type wells and n-type wells, may be formed within each area that is laterally enclosed by a portion of the shallow trench isolation structures 720. Field effect transistors 701 may be formed over the top surface of the semiconductor material layer 9. For example, each field effect transistor 701 may include a source region 732, a drain region 738, a semiconductor channel 735 that includes a surface portion of the substrate 8 extending between the source region 732 and the drain region 738, and a gate structure 750. The semiconductor channel 735 may include a single crystalline semiconductor material. Each gate structure 750 may include a gate dielectric layer 752, a gate electrode 754, a gate cap dielectric 758, and a dielectric gate spacer 756. A source-side metal or metal-semiconductor alloy region may be formed on each source region 732 and act as a source electrode 722, and a drain-side metal or metal-semiconductor alloy region may be formed on each drain region 738 and act as a drain electrode 728.

The first exemplary structure may include a memory array region 100 in which an array of four transistor ternary content-addressable memory cells may be subsequently formed. The first exemplary structure may further include a peripheral region 200 in which peripheral metal wiring for the array of four transistor ternary content-addressable memory cells is provided. Generally, the field effect transistors 701 in the CMOS circuitry 700 may be electrically connected to an electrode of a respective four transistor ternary content-addressable memory cell by a respective set of metal interconnect structures.

Devices (such as field effect transistors 701) on the semiconductor material layer 9 may provide functions that operate the array of four transistor ternary content-addressable memory cells to be subsequently formed. Specifically, devices on the semiconductor material layer 9 may be configured to control the programming operation, the erase operation, and the sensing (read) operation of the array of four transistor ternary content-addressable memory cells. For example, the devices on the semiconductor material layer 9 may include a sensing circuitry and/or a programming circuitry. The devices formed on the top surface of the semiconductor material layer 9 may include complementary metal-oxide-semiconductor (CMOS) transistors and optionally additional semiconductor devices (such as resistors, diodes, capacitors, etc.), and are collectively referred to as CMOS circuitry 700.

One or more of the field effect transistors 701 in the CMOS circuitry 700 may include a semiconductor channel 735 that contains a portion of the semiconductor material layer 9 in the substrate 8. In embodiments in which the semiconductor material layer 9 includes a single crystalline semiconductor material such as single crystalline silicon, the semiconductor channel 735 of each field effect transistor 701 in the CMOS circuitry 700 may include a single crystalline semiconductor channel such as a single crystalline silicon channel. In one embodiment, a plurality of field effect transistors 701 in the CMOS circuitry 700 may include a respective node that is subsequently electrically connected to a node of a respective memory cell to be subsequently formed. For example, a plurality of field effect transistors 701 in the CMOS circuitry 700 may include a respective source region 732 or a respective drain region 738, or a respective source electrode 722, or a respective source electrode 722, or a selective drain electrode 728, that is subsequently electrically connected to a node of a respective memory cell to be subsequently formed.

In one embodiment, the substrate 8 may include a single-crystalline semiconductor material such as single crystalline silicon, and the field effect transistors 701 may include a respective semiconductor channel 735 containing a portion of the single-crystalline semiconductor material or comprising a same material as the single-crystalline semiconductor material. In one embodiment, the semiconductor channel may be semiconducting.

According to an aspect of the present disclosure, the field effect transistors 701 may be subsequently electrically connected to drain electrodes and gate electrodes of memory transistors to be formed above the field effect transistors 701. In one embodiment, a subset of the field effect transistors 701 may be subsequently electrically connected to at least one of the drain electrodes and the gate electrodes. For example, the field effect transistors 701 may comprise first word line drivers configured to apply a first gate voltage to first word lines through a first subset of lower-level metal interconnect structures to be subsequently formed, and second word line drivers configured to apply a second gate voltage to second word lines through a second subset of the lower-level metal interconnect structures. Further, the field effect transistors 701 may comprise bit line drivers configured to apply a bit line bias voltage to bit lines to be subsequently formed, and sense amplifiers configured to detect electrical current that flows through the match lines during a read operation.

Various metal interconnect structures formed within dielectric material layers may be subsequently formed over the substrate 8 and the semiconductor devices thereupon (such as field effect transistors 701). In an illustrative example, the dielectric material layers may include, for example, a first dielectric material layer 601 that may be a layer that surrounds the contact structure connected to the source and drains (sometimes referred to as a contact-level dielectric material layer 601), a first interconnect-level dielectric material layer 610, and a second interconnect-level dielectric material layer 620. The metal interconnect structures may include device contact via structures 612 formed in the first dielectric material layer 601 and contacting a respective component of the CMOS circuitry 700, first metal line structures 618 formed in the first interconnect-level dielectric material layer 610, first metal via structures 622 formed in a lower portion of the second interconnect-level dielectric material layer 620, and second metal line structures 628 formed in an upper portion of the second interconnect-level dielectric material layer 620.

Each of the dielectric material layers (601, 610, 620) may include a dielectric material such as undoped silicate glass, a doped silicate glass, organosilicate glass, amorphous fluorinated carbon, porous variants thereof, or combinations thereof. Each of the metal interconnect structures (612, 618, 622, 628) may include at least one conductive material, which may be a combination of a metallic liner (such as a metallic nitride or a metallic carbide) and a metallic fill material. Each metallic liner may include TiN, TaN, WN, TiC, TaC, and WC, and each metallic fill material portion may include W, Cu, Al, Co, Ru, Mo, Ta, Ti, alloys thereof, and/or combinations thereof. Other suitable metallic liner and metallic fill materials within the contemplated scope of disclosure may also be used. In one embodiment, the first metal via structures 622 and the second metal line structures 628 may be formed as integrated line and via structures by a dual damascene process. The dielectric material layers (601, 610, 620) are herein referred to as lower-level dielectric material layers, or first dielectric material layers. The metal interconnect structures (612, 618, 622, 628) formed within in the lower-level dielectric material layers are herein referred to as lower-level metal interconnect structures, or first metal interconnect structures.

Generally, a dielectric material layer (such as a second interconnect-level dielectric material layer 620) may be formed over the field effect transistor 701. The four transistor ternary content-addressable memory cell C_mn may be formed above the dielectric material layer. In one embodiment, the primary search line SLn, the complementary search line SLn*, the primary bit line BLn, and the complementary bit line BLn* may be formed within an upper portion of such a dielectric material layer (such as the second interconnect-level dielectric layer 620). In this embodiment, the primary search line SLn, the complementary search line SLn*, the primary bit line BLn, and the complementary bit line BLn* may comprise the second metal line structures 628.

Figures 3A, 3B:
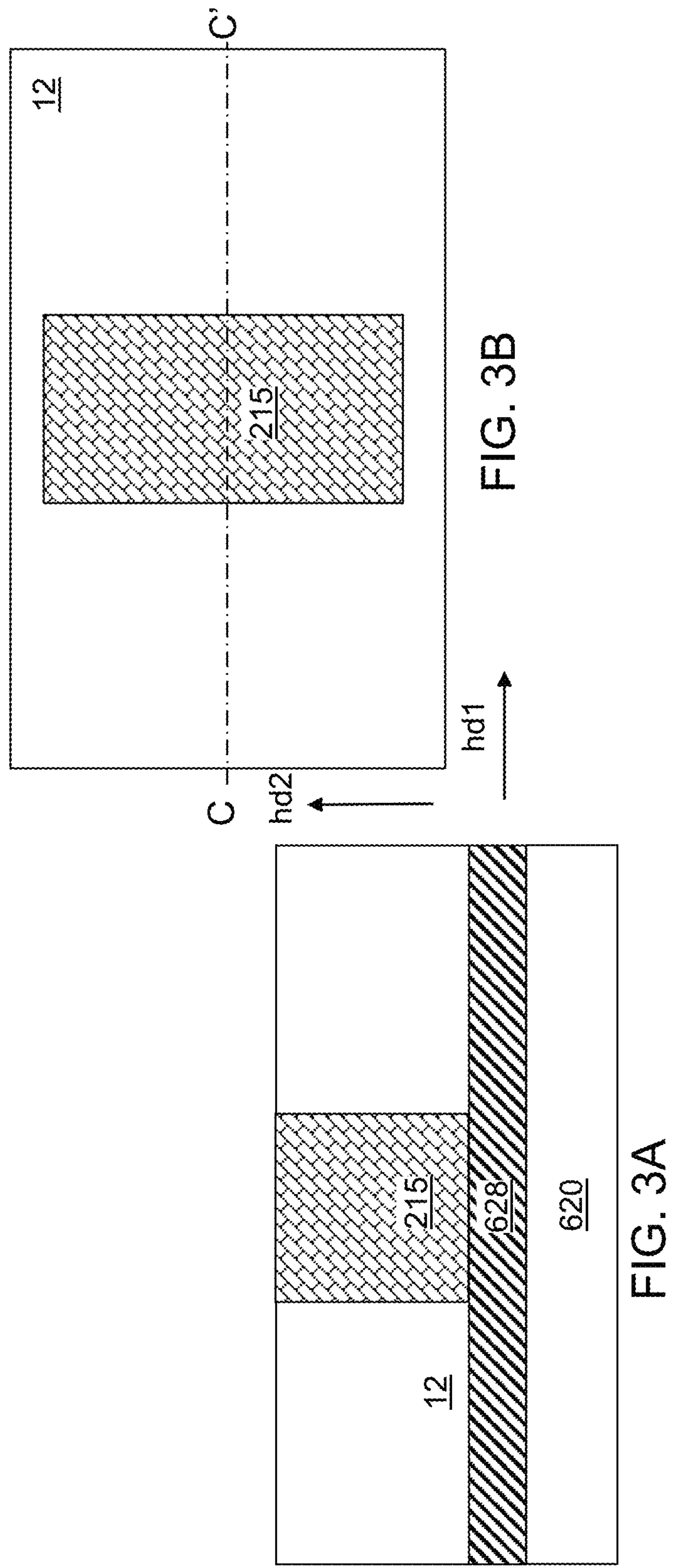
FIGS. 3A-3D are various views of a region of the first exemplary structure after formation of conductive via structures embedded in a via-level dielectric layer according to the first embodiment of the present disclosure.
Figures 3C, 3D:
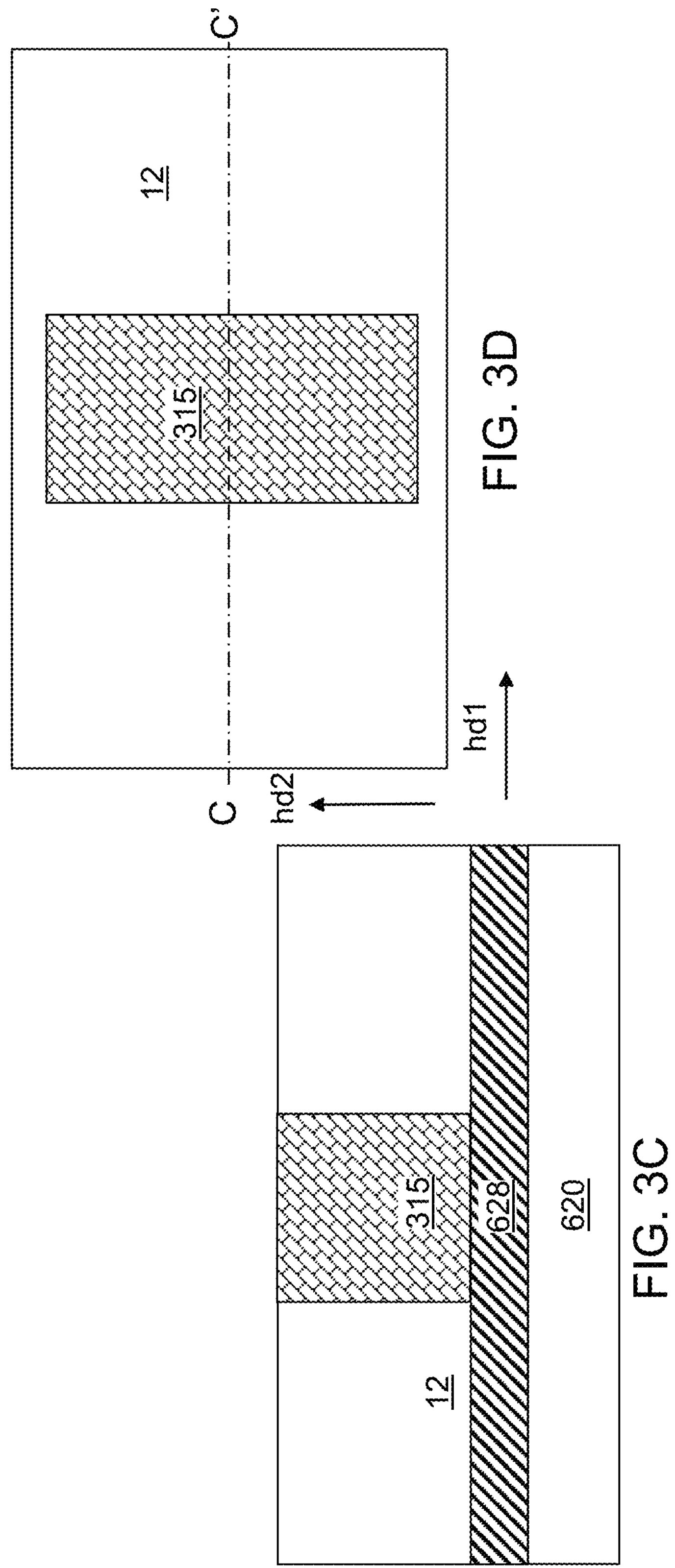

FIGS. 3A-3D are various views of a region of the first exemplary structure after formation of conductive via structures formed within a via-level dielectric layer according to the first embodiment of the present disclosure. FIG. 3A is a vertical cross-sectional view of a first region for forming a memory transistor such as the first memory transistor 221 or the second memory transistor 222 illustrated in FIG. 1. FIG. 3B is a top-down view of the first region illustrated in FIG. 3A. FIG. 3C is a vertical cross-sectional view of a second region for forming a non-hysteretic transistor such as the first non-hysteretic transistor 321 or the second non-hysteretic transistor 322 illustrated in FIG. 1. FIG. 3D is a top-down view of the second region illustrated in FIG. 3C. A first horizontal direction hd1 and a second horizontal direction hd2 that is perpendicular to the first horizontal direction hd1 are shown in FIGS. 3B and 3D.

Referring collectively to FIGS. 1 and 3A-3D, a via-level dielectric layer may be optionally formed over the second metal line structures 628. The via-level dielectric layer, if formed, is herein referred to as a lower via-level dielectric layer 12. The lower via-level dielectric layer 12 may function as a first dielectric material layer in which first conductive via structures 215 and second conductive via structures 315 are formed. The first conductive via structures 215 may function as gate electrodes (also referred to as first gate electrodes) of the first memory transistor 221 and the second memory transistor 222. The second conductive via structures 314 may function as portions of gate electrodes (also referred to as second gate electrodes) of the first non-hysteretic transistor 321 and the second non-hysteretic transistor 322.

Generally speaking, the first conductive via structures 215 and second conductive via structures 315 are optional structures. In embodiments in which the first conductive via structures 215 and second conductive via structures 315 are not formed, portions of the primary search line SLn, the complementary search line SLn*, the primary bit line BLn, and the complementary bit line BLn* that comprise the second metal line structures 628 located within a unit cell area UC may be used as gate electrodes or portions of gate electrodes for the transistors (221, 222, 321, 322) of each four-transistor ternary content-addressable memory cell C_mn.

Figures 4A, 4B:
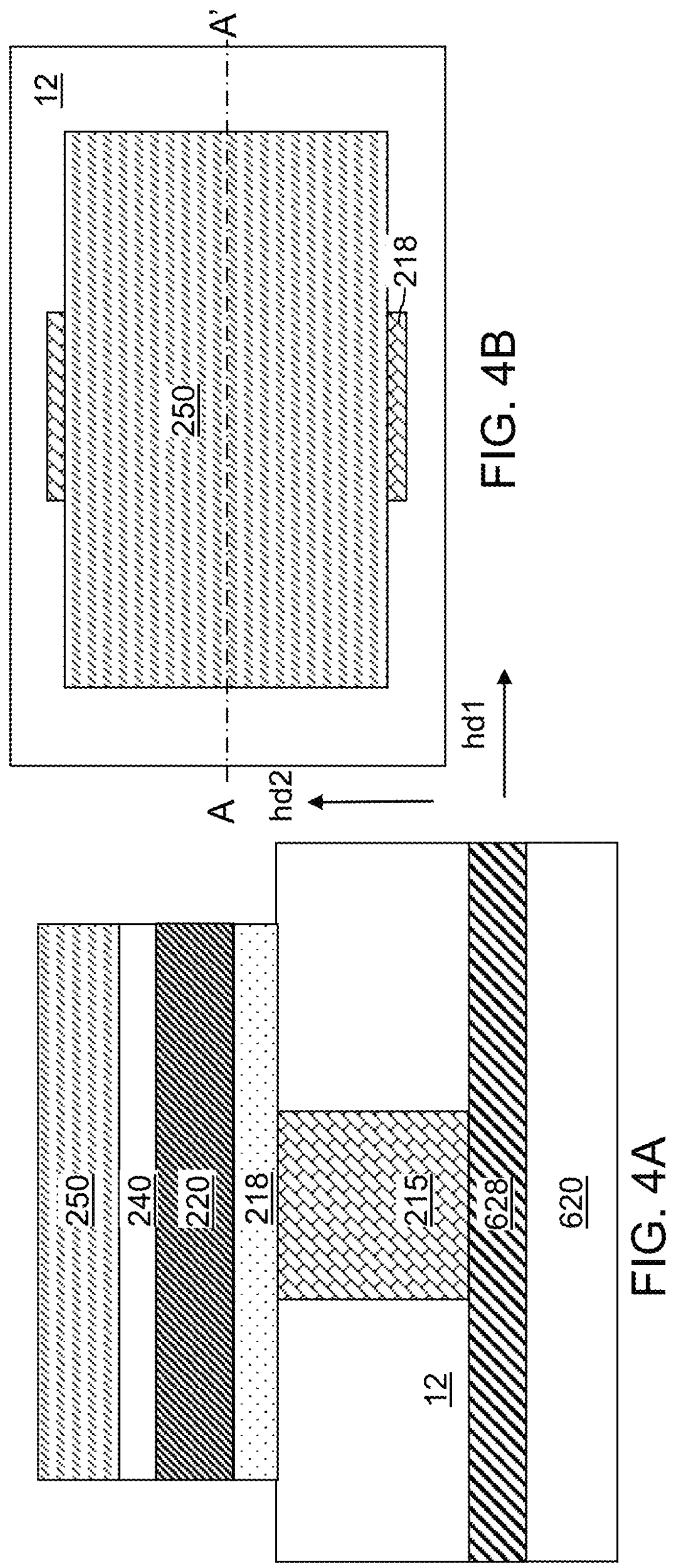
FIGS. 4A-4D are various views of a region of the first exemplary structure after formation of patterned layer stacks according to the first embodiment of the present disclosure.
Figures 4C, 4D:
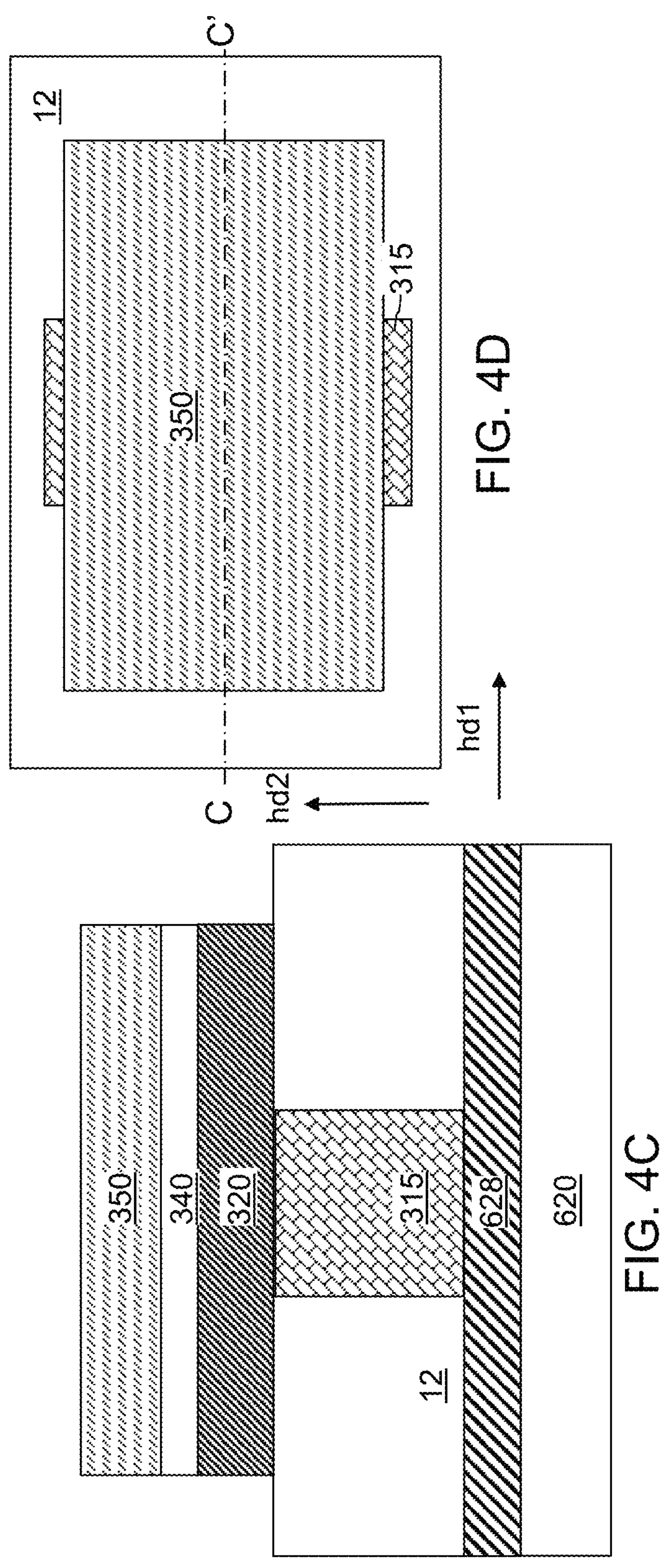

FIGS. 4A-4D are various views of a region of the first exemplary structure after formation of patterned layer stacks according to the first embodiment of the present disclosure. FIG. 4A is a vertical cross-sectional view of the first region. FIG. 4B is a top-down view of the first region. FIG. 4C is a vertical cross-sectional view of the second region. FIG. 4D is a top-down view of the second region.

Referring collectively to FIGS. 1 and 4A-4D, a backside gate dielectric layer 218 may be formed in the areas of the first memory transistor 221 and the second memory transistor 222 without covering the areas of the first non-hysteretic transistor 321 and the second non-hysteretic transistor 322. The backside gate dielectric layer 218 comprises a gate dielectric material such as silicon oxide, silicon oxynitride, a dielectric metal oxide, or a combination thereof. The backside gate dielectric layer 218 may be deposited as a blanket material layer, and may be patterned to cover a first area of a first dielectric material layer (such as a lower via-level dielectric layer 12 and/or a second interconnect-level dielectric material layer 620) for forming the first memory transistor 221 and the second memory transistor 222 without covering a second area of the first dielectric material layer for forming the first non-hysteretic transistor 321 and the second non-hysteretic transistor 322. The thickness of the backside gate dielectric layer may be in a range from 1 nm to 30 nm, although lesser and greater thicknesses may also be used.

A layer stack of a gate electrode material layer 220/230, a front gate dielectric layer 240/340, and a semiconductor material layer 250/350 may be subsequently formed in the first area and the second area. The gate electrode material layer 220/320 comprises a conductive material such as a metallic material or a heavily-doped semiconductor material. For example, the gate electrode material layer 220/320 may comprise, and/or may consist essentially of, at least one conductive material such as a conductive metallic nitride material (e.g., TIN, TaN, MON, WN, etc.), at least one elemental metal, and/or an intermetallic alloy. The thickness of the gate electrode material layer may be in a range from 20 nm to 200 nm, although lesser and greater thicknesses may also be used.

The front gate dielectric layer 240/340 comprises a gate dielectric material such as silicon oxide, silicon oxynitride, a dielectric metal oxide, or a combination thereof. The thickness of the front gate dielectric layer may be in a range from 1 nm to 30 nm, although lesser and greater thicknesses may also be used.

The semiconductor material layer 250/350 comprises a semiconducting material. Exemplary compound semiconductor materials that may be used for the semiconductor material layer include, but are not limited to, indium gallium zinc oxide (IGZO), indium oxide, indium tin oxide, indium zinc oxide, indium tungsten oxide, gallium oxide, gallium zinc oxide, doped zinc oxide, doped indium oxide (such as tungsten-doped indium oxide), doped cadmium oxide, gallium nitride, indium phosphide, gallium phosphide, gallium antimonide, indium antimonide, gallium arsenide, aluminum arsenide, indium arsenide, aluminum gallium arsenide, gallium indium arsenide, indium gallium arsenide, gallium indium phosphide, indium aluminum arsenide, silicon carbide, aluminum indium gallium phosphide, cadmium sulfide, cadmium selenide, cadmium telluride, zinc sulfide, zinc selenide, zinc telluride, lead sulfide, led telluride, mercury telluride, silicon, germanium, a silicon-germanium alloy, semiconducting carbon materials, and various other doped variants derived therefrom. Other suitable semiconducting materials are within the contemplated scope of disclosure. In one embodiment, the semiconductor material layer may include indium gallium zinc oxide.

The semiconductor material layer 250/350 may include a polycrystalline semiconducting material, or an amorphous semiconducting material. The semiconductor material layer may be deposited by physical vapor deposition, atomic layer deposition, chemical vapor deposition, pulsed laser deposition, etc. The thickness of the semiconductor material layer may be in a range from 1 nm to 100 nm, such as from 2 nm to 50 nm and/or from 3 nm to 20 nm, although lesser and greater thicknesses may also be used.

The layer stack and the backside gate dielectric layer 218 may be patterned, for example, by applying and patterning a photoresist layer over the semiconductor material layer 250/350, and by performing an anisotropic etch process that transfers the pattern in the photoresist layer through the layer stack and the backside gate dielectric layer 218. First patterned portions of the layer stack and patterned portions of the backside gate dielectric 218 layer are formed in the areas for the first memory transistor 221 and the second memory transistor 222. Second patterned portions of the layer stack are formed in the areas for the first non-hysteretic transistor 321 and the second non-hysteretic transistor 322.

A first vertical stack of a backside gate dielectric 218, a first gate electrode plate 220, a front gate dielectric 240, and a first semiconductor channel 250 may be formed within each area for the first memory transistor 221 (e.g., a first thin-film memory transistor) and the second memory transistor 222 (e.g., a second thin-film memory transistor). Sidewalls of the backside gate dielectric 218, the first gate electrode plate 220, the front gate dielectric 240, and the first semiconductor channel 250 may be vertically coincident to one another within each first vertical stack. As used herein, a first surface and a second surface are "vertically coincident" in instances in which there the second surface overlies or underlies the first surface and if there exists a vertical plane including the first surface and the second surface. A second vertical stack of a second gate electrode plate 320, a non-hysteretic gate dielectric 340, and a second semiconductor channel 350 may be formed within each area for the first non-hysteretic transistor 321 and the second non-hysteretic transistor 322. Sidewalls of the second gate electrode plate 320, the non-hysteretic gate dielectric 340, and the second semiconductor channel 350 may be vertically coincident to one another within each second vertical stack.

Each backside gate dielectric 218 may be a patterned portion of the backside gate dielectric layer, and may have a uniform thickness throughout. Each first gate electrode plate 220 and each second gate electrode plate 320 are patterned portions of the gate electrode material layer, and may have the same conductive material composition and the same thickness. Each front gate dielectric 240 and each non-hysteretic gate dielectric 340 are patterned portions of the front gate dielectric layer, and may have the same dielectric material composition and the same thickness. Each first semiconductor channel 250 and each second semiconductor channel 350 are patterned portions of the semiconductor material layer, and may have the same semiconductor material composition and the same thickness.

In one embodiment, each memory transistor (221, 222) may be a flash memory device configured to store electrical charges in a floating gate electrode. Each memory transistor (221, 222) may be a thin-film transistor. In one embodiment, each first gate electrode plate 220 functions as a floating gate electrode for a respective memory transistor (221, 222). In this embodiment, the first conductive via structures 215 (or alternatively, portions of the second metal line structures 628 contacting bottom surfaces of the backside gate dielectric 218) function as control gate electrodes for the memory transistors (221, 222). In one embodiment, each non-hysteretic transistor (321, 322) comprises a non-floating gate electrode (comprising a second gate electrode plate 320). The floating gate electrodes (comprising first gate electrode plates 220) and the non-floating gate electrodes (comprising second gate electrode plates 320) have a same material composition and a same thickness.

In one embodiment, each floating gate electrode (comprising a first gate electrode plate 220) may be vertically spaced from a top surface of a dielectric material layer (such as a lower via-level dielectric layer 12 and/or a second interconnect-level dielectric material layer 620) by a backside gate dielectric 218 that contacts a first segment of the top surface of the dielectric material layer (e.g., lower via-level dielectric layer 12 and/or a second interconnect-level dielectric material layer 620). In one embodiment, each non-floating gate electrode (comprising a second gate electrode plate 320) is in contact with a second segment of the top surface of the dielectric material layer. In one embodiment, sidewalls of each floating gate electrode (comprising a first gate electrode plate 220) are vertically coincident with sidewalls of a respective underlying backside gate dielectric 218.

Each front gate dielectric 240 contacts a first semiconductor channel 250 of a first memory transistor 221. Each non-hysteretic gate dielectric 340 contacts a second semiconductor channel 350 of a first non-hysteretic transistor 321. The front gate dielectrics 240 and the non-hysteretic gate dielectrics 340 have a same material composition and a same thickness. In one embodiment, within each memory transistor (221, 222), one of the front gate dielectric 240 and the backside gate dielectric 218 comprises a tunneling dielectric layer that provides charge tunneling therethrough, another of the front gate dielectric 240 and the backside gate dielectric 218 comprises a blocking dielectric layer that suppresses charge tunneling therethrough. Thus, charge tunneling during operation of the memory transistors (221, 222) may occur through the front gate dielectric 240 or through the backside gate dielectric 218.

Figures 5A, 5B:
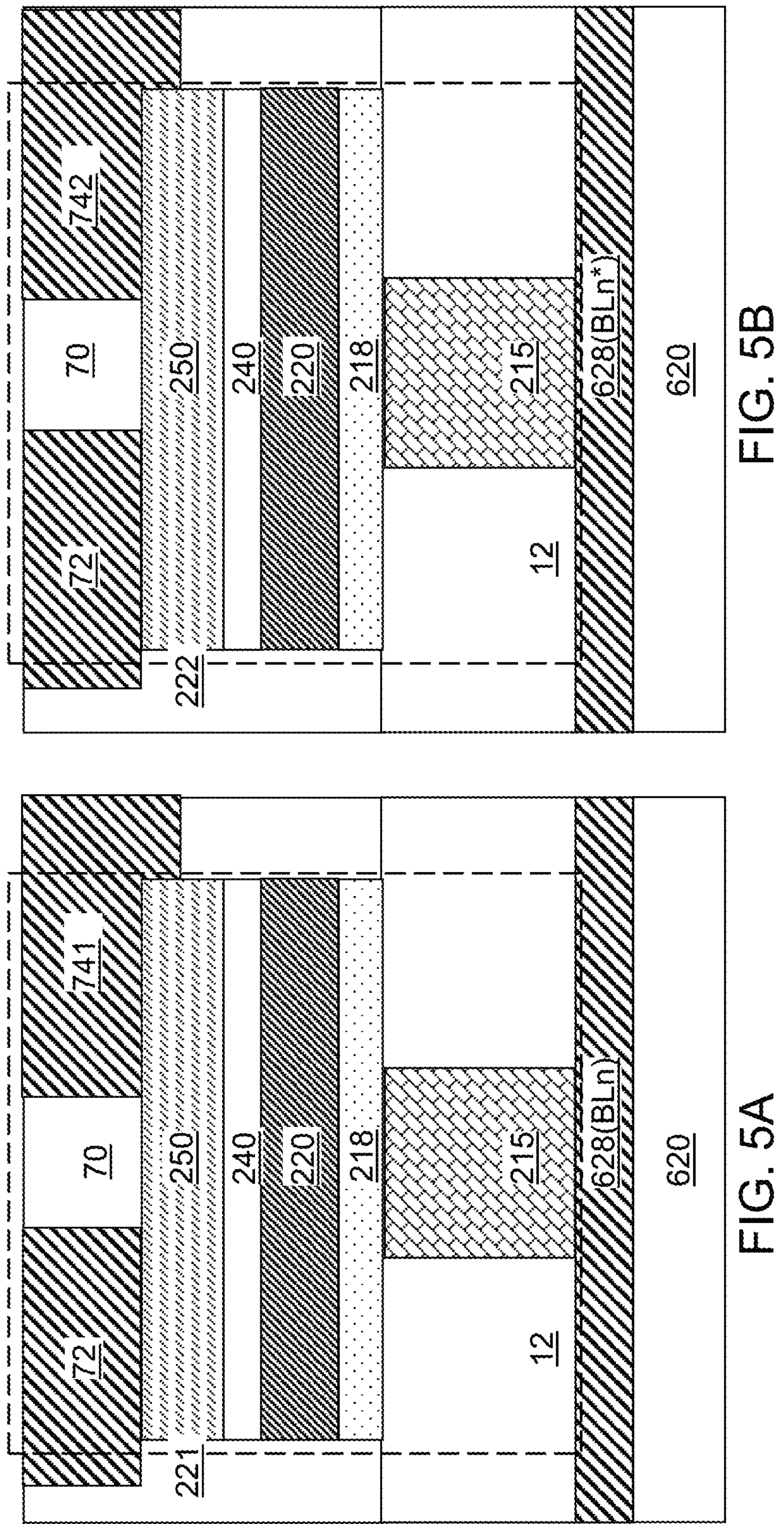
FIGS. 5A-5D are various views of a region of the first exemplary structure after formation of a contact-level dielectric layer and contact via structures according to the first embodiment of the present disclosure.
Figures 5C, 5D:
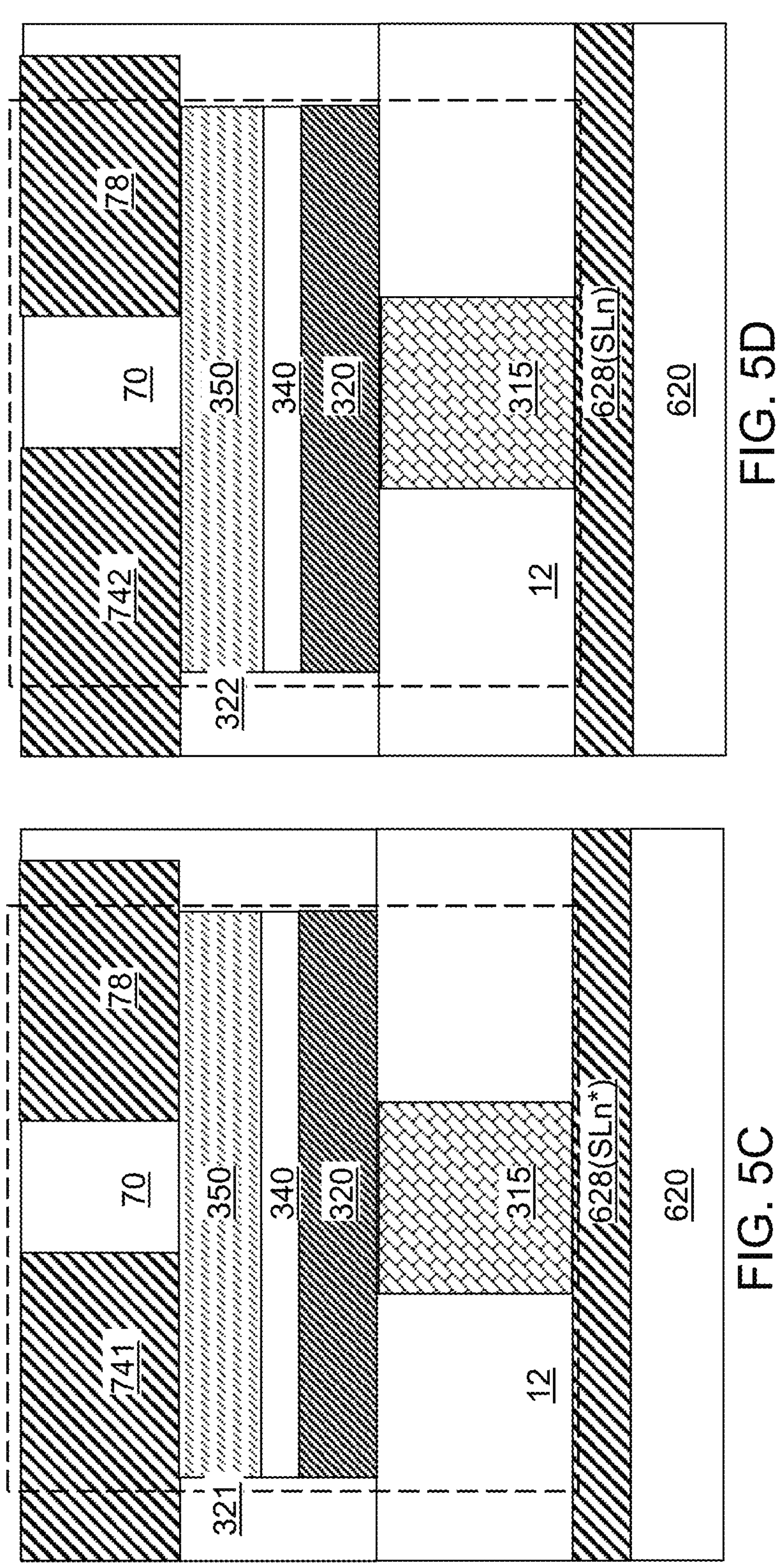

FIGS. 5A-5D are various views of a region of the first exemplary structure after formation of a contact-level dielectric layer 70 and contact via structures (72, 741, 742, 78) according to the first embodiment of the present disclosure. FIG. 5A is a vertical cross-sectional view of the first memory transistor 221. FIG. 5B is a vertical cross-sectional view of the second memory transistor 222. FIG. 5C is a vertical cross-sectional view of the first non-hysteretic transistor 321. FIG. 5D is a vertical cross-sectional view of the second non-hysteretic transistor 322.

Referring collectively to FIGS. 1 and 5A-5D, a contact-level dielectric layer 70 may be formed over the layer stacks {(218, 220, 240, 250), (320, 340, 350)}. The contact-level dielectric layer 70 comprises an interlayer dielectric (ILD) material such as undoped silicate glass, doped silicate glass, organosilicate glass, or a combination thereof. In one embodiment, the contact-level dielectric layer 70 may comprise a self-planarizing dielectric material or a planarizable dielectric material (such as undoped silicate glass or a doped silicate glass). Optionally, a planarization process may be performed to planarize the top surface of the contact-level dielectric layer 70. In one embodiment, the top surface of the contact-level dielectric layer 70 may be planar, i.e., may be located within a horizontal plane.

Via cavities may be formed through the contact-level dielectric layer 70. Two end portions of each semiconductor channel (250, 350) may be physically exposed to a respective via cavity extending through the contact-level dielectric layer 70. In one embodiment, a first via cavity 741 selected from the via cavities may continuously extend between a first end portion of a first semiconductor channel 250 of the first memory transistor 221 and a first end portion of a second semiconductor channel 350 of the first non-hysteretic transistor 321; and a second via cavity 742 selected from the via cavities may continuously extend between a first end portion of a first semiconductor channel 250 of the second memory transistor 222 and a first end portion of a second semiconductor channel 350 of the second non-hysteretic transistor 322. The bottom surfaces of the via cavities may be formed above the horizontal plane including the top surfaces of the first gate electrodes (comprising first gate electrode plates 220).

At least one conductive material, such as at least one metallic material, may be deposited in the via cavities. In one embodiment, the at least one conductive material may comprise a metallic barrier material (such as TIN, TaN, MON, WN, or a stack thereof) and a metallic fill material (such as W, Ti, Ta, Co, Mo, Ru, Cu, etc.). Excess portions of the at least one conductive material may be removed from above the horizontal plane including the top surface of the contact-level dielectric layer 70 by a planarization process such as a chemical mechanical polishing process.

A remaining portion of the at least one conductive material that fills the first via cavity constitutes a first contact via structure 741 that functions as a first source/drain structure of the first memory transistor 221 and as a first source/drain structure of the first non-hysteretic transistor 321, and provides electrical connection between the first memory transistor 221 and the first non-hysteretic transistor 321. A remaining portion of the at least one conductive material that fills the second via cavity constitutes a second contact via structure 742 that functions as a first source/drain structure of the second memory transistor 222 and as a first source/drain structure of the second non-hysteretic transistor 322, and provides electrical connection between the second memory transistor 222 and the second non-hysteretic transistor 322.

Each via cavity overlying the memory transistors (221, 222) and not filled with the first contact via structure 741 or the second contact via structure 742 is filled with a third contact via structure 72, which functions as a second source/drain structure of a respective memory transistor (221, 222). Each via cavity overlying the non-hysteretic transistors (321, 322) and not filled with the first contact via structure 741 or the second contact via structure 742 may be filled with a fourth contact via structure 78, which functions as a second source/drain structure of a respective non-hysteretic transistor (321, 322). A four-transistor ternary content-addressable memory cell C_mn may comprise a first contact via structure 741, a second contact via structure 742, two third contact via structures 72, and two fourth contact via structures 78.

Generally, a first memory transistor 221, a second memory transistor 222, a first non-hysteretic transistor 321, and a second non-hysteretic transistor 322 may be formed for a four-transistor ternary content-addressable memory cell C_mn. The first memory transistor 221 comprises a first memory element (such as a floating gate electrode 220, or a ferroelectric gate dielectric 230) configured to store a first binary bit, and the second memory transistor 222 comprises a second memory element (such as a floating gate electrode 220 or a ferroelectric gate dielectric 230) configured to store a second binary bit. A first series connection of the first memory transistor 221 and the first non-hysteretic transistor 321 may be formed, for example, through the first contact via structure 741. A second series connection of the second memory transistor 222 and the second non-hysteretic transistor 322 may be formed, for example, through the second contact via structure 742. In one embodiment, the first contact via structure 741 may be formed directly on the first memory transistor 221 and the first non-hysteretic transistor 321 to provide the first series connection; and the second contact via structure 742 may be formed directly on the second memory transistor 222 and the second non-hysteretic transistor 322 to provide the second series connection.

In one embodiment, the first memory transistor 221 comprises a first semiconductor channel 250; the first non-hysteretic transistor 321 comprises a second semiconductor channel 350; and the first semiconductor channel 250 and the second semiconductor channel 350 have a same material composition and a same thickness. In one embodiment, the first memory transistor 221 comprises a floating gate electrode (comprising a first gate electrode plate 220); the first non-hysteretic transistor 321 comprises a non-floating gate electrode (comprising a second gate electrode plate 320); and the floating gate electrode (comprising a first gate electrode plate 220) and the non-floating gate electrode (comprising a second gate electrode plate 320) have a same material composition and a same thickness.

In one embodiment, the floating gate electrode (comprising a first gate electrode plate 220) is vertically spaced from a top surface of a dielectric material layer (such as a lower via-level dielectric layer 12 and/or a second interconnect-level dielectric material layer 620) by a backside gate dielectric 218 that contacts a first segment of the top surface of the dielectric material layer; and the non-floating gate electrode (comprising a second gate electrode plate 320) is in contact with a second segment of the top surface of the dielectric material layer. In one embodiment, sidewalls of the floating gate electrode (comprising a first gate electrode plate 220) are vertically coincident with sidewalls of the backside gate dielectric 218.

In one embodiment, the first memory transistor 221 comprises a front gate dielectric 240 that contacts a first semiconductor channel 250 of the first memory transistor 221; the first non-hysteretic transistor 321 comprises a non-hysteretic gate dielectric 340 that contacts a second semiconductor channel 350 of the first non-hysteretic transistor 321; and the front gate dielectric 240 and the non-hysteretic gate dielectric 340 have a same material composition and a same thickness. In one embodiment, one of the front gate dielectric 240 and the backside gate dielectric 218 comprises a tunneling dielectric layer that provides charge tunneling therethrough; and another of the front gate dielectric 240 and the backside gate dielectric 218 comprises a blocking dielectric layer that suppresses charge tunneling therethrough.

In one embodiment, the first memory transistor 221 comprises a first gate electrode (comprising a first gate electrode plate 220), a first gate dielectric (such as a front gate dielectric 240 or a ferroelectric gate dielectric 230), and a first semiconductor channel 250; and sidewalls of the first gate electrode (comprising a first gate electrode plate 220), the first gate dielectric (such as the front gate dielectric 240 or the ferroelectric gate dielectric 230), and the first semiconductor channel 250 are vertically coincident to one another. In one embodiment, the first non-hysteretic transistor 321 comprises a second gate electrode (comprising a second gate electrode plate 320), a second gate dielectric (such as a non-hysteretic gate dielectric 340), and a second semiconductor channel 350; the first semiconductor channel 250 and the second semiconductor channel 350 have a same semiconductor material composition and a same semiconductor material thickness; and the first gate electrode (comprising a first gate electrode plate 220) and the second gate electrode (comprising a second gate electrode plate 320) have a same conductive material composition and a same conductive material thickness.

In one embodiment, a first contact via structure 741 may be formed within the second dielectric material layer (such as a contact-level dielectric layer 70) and may contact each of the first non-hysteretic transistor 321 and the first memory transistor 221; and a second contact via structure 742 may be formed within the second dielectric material layer (such as a contact-level dielectric layer 70) and may contact each of the second non-hysteretic transistor 322 and the second memory transistor 222.

Figures 6A, 6B:
FIGS. 6A-6D are various views of a region of the first exemplary structure after formation of a via-level dielectric layer, connection via structures, a line-level dielectric layer, and metal lines according to the first embodiment of the present disclosure.
Figures 6C, 6D:

FIGS. 6A-6D are various views of a region of the first exemplary structure after formation of a via-level dielectric layer, connection via structures, a line-level dielectric layer, and metal lines according to the first embodiment of the present disclosure. FIG. 6A is a vertical cross-sectional view of the first memory transistor 221. FIG. 6B is a vertical cross-sectional view of the second memory transistor 222. FIG. 6C is a vertical cross-sectional view of the first non-hysteretic transistor 321. FIG. 6D is a vertical cross-sectional view of the second non-hysteretic transistor 322.

Referring collectively to FIGS. 1 and 6A-6D, a via-level dielectric layer may be formed over the contact-level dielectric layer 70. The via-level dielectric layer is herein referred to as an upper via-level dielectric layer 80. Via cavities may be formed through the upper via-level dielectric layer 80 over the third contact via structures 72 and the fourth contact via structures 78, and may be filled with at least one conductive material to form first connection via structures 82 and second connection via structures 88. Each first connection via structure 82 may contact a top surface of a respective third contact via structure 72, and each second connection via structure 88 may contact a stop surface of a respective fourth contact via structure 78.

A line-level dielectric layer 90 may be formed over the upper via-level dielectric layer 80. Line cavities may be formed through the line-level dielectric layer 90 so that top surfaces of the connection via structures (82, 88) are physically exposed. Word lines 92 and match lines 98 may be formed in the line cavities. The word lines 92 may contact top surfaces of the first connection via structures 82, and the match lines 98 may contact top surfaces of the second connection via structures 88. Generally, a match line 98 (MLm) and a word line 92 (WLm) may be formed such that the first series connection and the second series connection may be connected in parallel between the match line 98 (MLm) and the word line 92 (WLm). A four transistor ternary content-addressable memory cell C_mn may be thus formed.

Figures 7A, 7B:
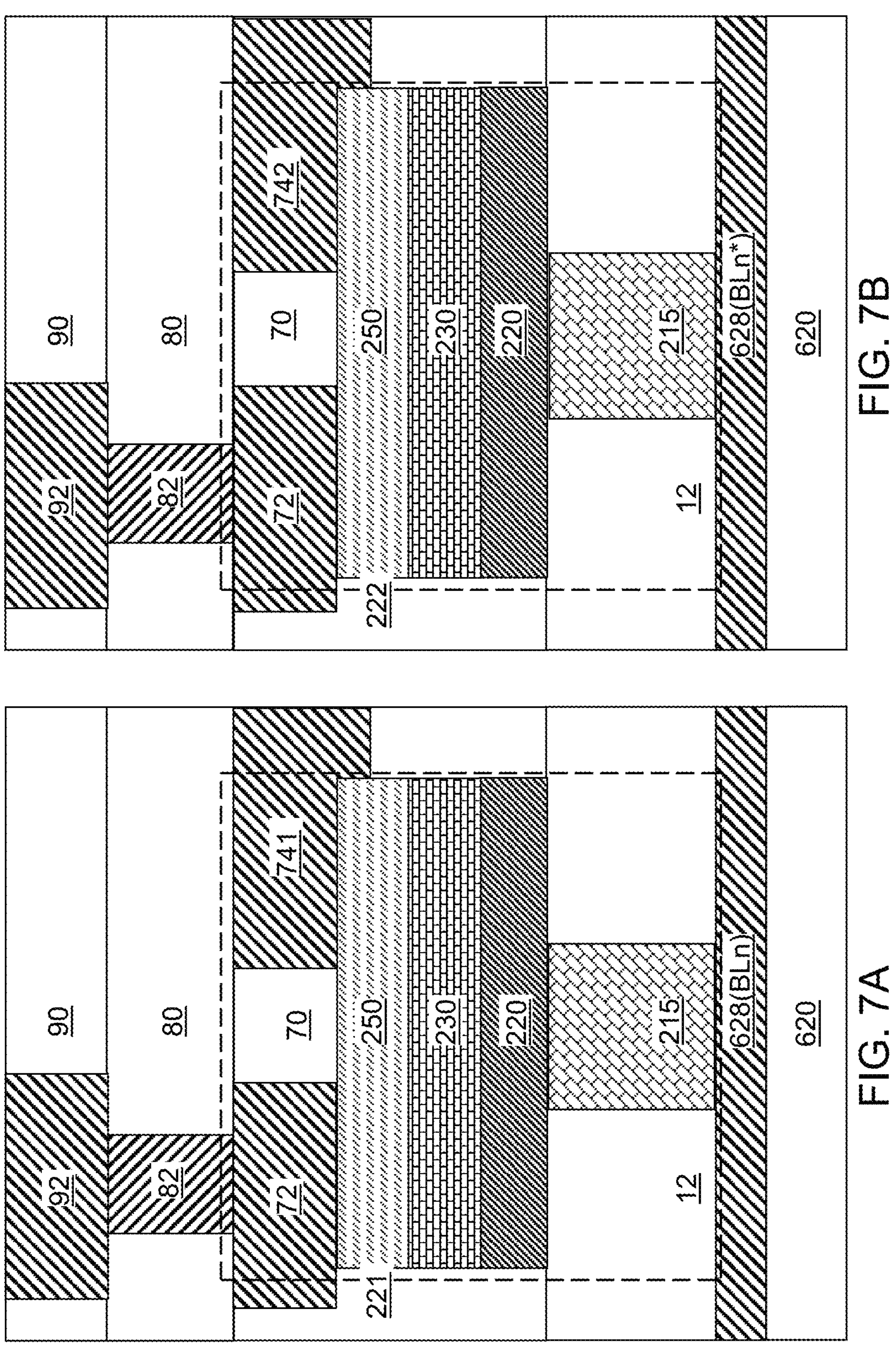
FIGS. 7A-7D are various views of a region of an alternative configuration of the first exemplary structure after formation of a via-level dielectric layer, connection via structures, a line-level dielectric layer, and metal lines according to the first embodiment of the present disclosure.
Figures 7C, 7D:

FIGS. 7A-7D are various views of a region of an alternative configuration of the first exemplary structure after formation of a via-level dielectric layer, connection via structures, a line-level dielectric layer, and metal lines according to the first embodiment of the present disclosure. FIG. 7A is a vertical cross-sectional view of the first memory transistor 221. FIG. 7B is a vertical cross-sectional view of the second memory transistor 222. FIG. 7C is a vertical cross-sectional view of the first non-hysteretic transistor 321. FIG. 7D is a vertical cross-sectional view of the second non-hysteretic transistor 322.

Referring collective to FIGS. 1 and 7A-7D, the first alternative configuration of the first exemplary structure may be derived from the first exemplary structure illustrated in FIGS. 6A-6D by using two ferroelectric transistors for the two memory transistors (221, 222). In various embodiments, the two ferroelectric transistors used as memory transistors may be ferroelectric thin-film transistors. In this embodiment, the first memory element configured to store a first binary bit within the first memory transistor 221 may comprise a first ferroelectric gate dielectric 230, and the second memory element configurated to store a second binary bit within the second memory transistor 222 may comprise a second ferroelectric gate dielectric 230.

The first alternative configuration of the first exemplary structure may be formed by forming a first dielectric material layer (such as a lower via-level dielectric layer 12 and/or a second interconnect-level dielectric material layer 620) over a substrate 8. The first exemplary structure illustrated in FIG. 2 may be used without formation of a lower via-level dielectric layer 12 and conductive via structures (215, 315) illustrated in FIGS. 3A-3D. Alternatively, the first exemplary structure illustrated in FIGS. 3A-3D may be used. A gate electrode material layer over the first dielectric material layer (such as a lower via-level dielectric layer 12 and/or a second interconnect-level dielectric material layer 620). A ferroelectric dielectric layer over the gate electrode material layer in a first area for forming the memory transistors (221, 222) without covering a second area for forming the non-hysteretic transistors (321, 322). A gate dielectric layer may be formed over the gate electrode material layer in the second area without covering the first area. Subsequently, a semiconductor material layer may be formed over the ferroelectric dielectric layer and the gate dielectric layer.

The gate electrode material layer may be the same as the gate electrode material layer described with reference to FIGS. 4A-4D. Generally, any ferroelectric material known in the art may be used for the ferroelectric dielectric layer. For example, the ferroelectric dielectric layer comprises, and/or consists essentially of, a ferroelectric dielectric material such as titanium oxide ($TiO_2$), lead zirconate titanate ($Pb[Zr,Ti]O_3$ or PZT), barium titanate ($BaTiO_3$), lead titanate ($PbTiO_3$), lithium niobate ($LiNbO_3$), strontium titanate ($SrTiO_3$), potassium niobate ($KNbO_3$), sodium potassium niobate ($NaNbO_3$—$KNbO_3$ or NKN), bismuth titanate ($Bi_4Ti_3O_{12}$ or BIT), lithium tantalate ($LiTaO_3$), potassium titanyl phosphate ($KTiOPO_4$ or KTP), lanthanum-doped lead zirconate titanate ($Pb_{1-x}La_x[Zr,Ti]O_3$ or PLZT), sodium tungstate ($Na_2WO_4$), calcium copper titanate ($CaCu_3Ti_4O_{12}$ or CCTO), potassium sodium bismuth titanate ($K_{0.5}Na_{0.5}Bi_4Ti_4O_{15}$ or KNBT), and doped derivatives thereof. In one embodiment, the ferroelectric dielectric layer comprises, and/or consists essentially of, a doped hafnium oxide layer that is doped with at least one dopant species that is selected from Al, In, Si, Ge, alkaline earth metals (Mg, Sr, etc.), transition metals (Zr, Ta, etc.), and rare-earth metals (Y, Gd, La, etc.). In one embodiment, the ferroelectric dielectric layer comprises, and/or consists essentially of, a tantalum-doped hafnium oxide layer. The thickness of the ferroelectric dielectric layer may be in a range from 1 nm to 100 nm, although lesser and greater thicknesses may also be used. The gate dielectric layer may comprise any gate dielectric material known in the art. The semiconductor material layer may be the same as the semiconductor material layer described with reference to FIGS. 4A-4D.

The semiconductor material layer, the gate dielectric layer, the ferroelectric dielectric layer, and the gate electrode material layer may be patterned to form a first layer stack of a first gate electrode plate 220, a ferroelectric gate dielectric 230, and a first semiconductor channel 250 within each area for a memory transistor (221, 222); and to form a second layer stack of a second gate electrode plate 320, a non-hysteretic gate dielectric 340, and a second semiconductor channel 350 within each area for a non-hysteretic transistor (321, 322). Thus, the first memory transistor 221 and the second memory transistor 222 comprise first patterned portions of the semiconductor material layer and the gate electrode material layer and patterned portions of the ferroelectric dielectric layer, and the first non-hysteretic transistor 321 and the second non-hysteretic transistor 322 comprise second patterned portions of the semiconductor material layer and the gate electrode material layer and patterned portions of the gate dielectric layer.

Subsequently, the processing steps described with reference to FIGS. 5A-5D and 6A-6D may be performed to form a four transistor ternary content-addressable memory cell C_mn. A first series connection of a first memory transistor 221 (comprising a first ferroelectric thin-film transistor) and a first non-hysteretic transistor 321 may be formed; and a second series connection of a second memory transistor 222 (comprising a second ferroelectric thin-film transistor) and a second non-hysteretic transistor 322 may be formed. A match line MLm and a word line WLm may be formed. The first series connection and the second series connection may be connected in parallel between the match line 98 (MLm) and the word line 92 (WLm).

In the alternative configuration of the first exemplary structure illustrated in FIGS. 7A-7D, the first memory transistor 221 comprises a ferroelectric gate dielectric 230, a first semiconductor channel 250, and a first gate electrode (comprising a first gate electrode plate 220); and the first non-hysteretic transistor 321 comprises a non-hysteretic gate dielectric 340, a second semiconductor channel 350, and a second gate electrode (comprising a second gate electrode plate 320). In one embodiment, the first memory transistor 221 comprises a first gate electrode (comprising a first gate electrode plate 220), a first gate dielectric (such as a ferroelectric gate dielectric 230), and a first semiconductor channel 250; and sidewalls of the first gate electrode (comprising a first gate electrode plate 220), the first gate dielectric (such as the front gate dielectric 240 or the ferroelectric gate dielectric 230), and the first semiconductor channel 250 are vertically coincident to one another.

Generally speaking, a first memory transistor 221, a second memory transistor 222, a first non-hysteretic transistor 321, and a second non-hysteretic transistor 322 may be formed over a substrate 8. Each of the memory transistor (221, 222) and non-hysteretic transistors (321, 322) may be thin-film transistors) The first memory transistor 221 comprises a first memory element (such as a floating gate electrode or a ferroelectric gate dielectric 230) configured to store a first binary bit, and the second memory transistor 222 comprises a second memory element (such as a floating gate electrode or a ferroelectric gate dielectric 230) configured to store a second binary bit.

Figure 8:
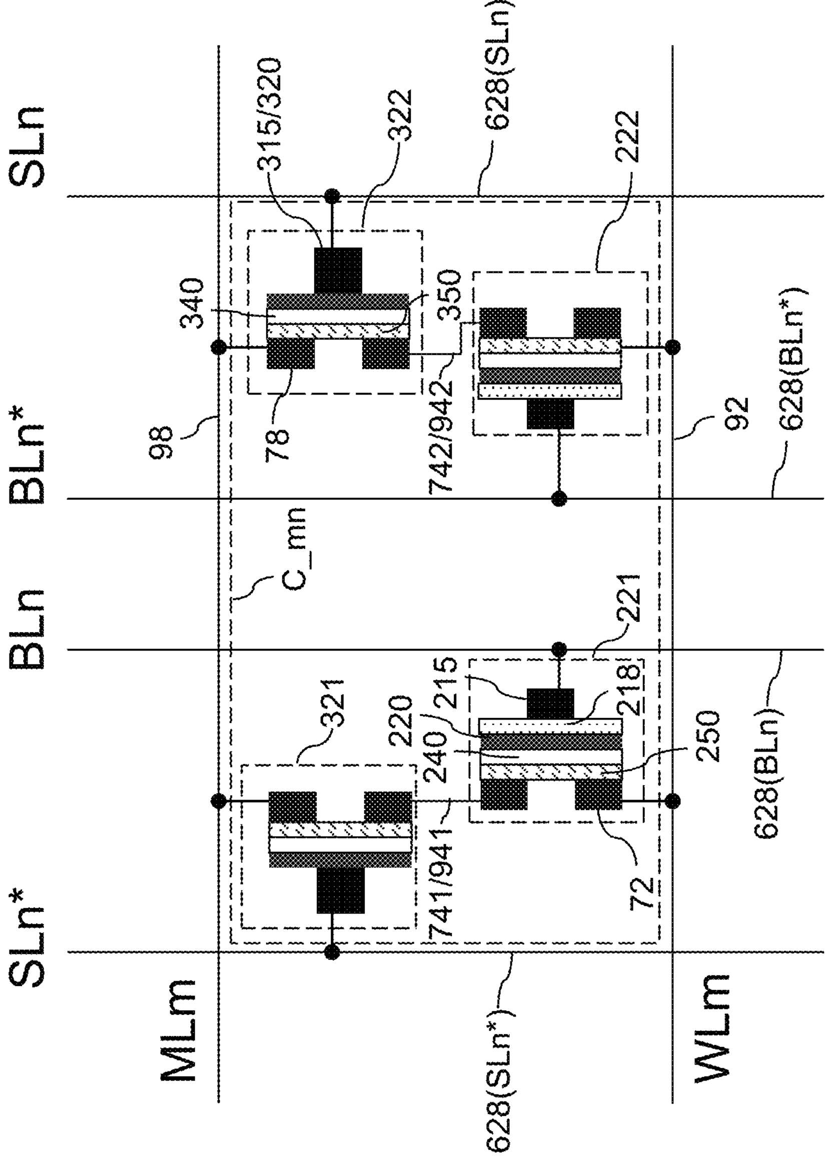
FIG. 8 is a schematic diagram of a device structure including a four-transistor ternary content-addressable memory cell using instances of transistors described with reference to FIGS. 6A-6D or using instances of transistors described with reference to FIGS. 7A-7D.

FIG. 8 is a schematic diagram of a device structure including a four-transistor ternary content-addressable memory cell C_mn using instances of transistors described with reference to FIGS. 6A-6D or using instances of transistors described with reference to FIGS. 7A-7D.

Referring collectively to FIGS. 1, 6A-6D, 7A-7D, and 8, for each four transistor ternary content-addressable memory cell C_mn, a primary bit line BLn is connected to (and thus, is electrically shorted to (i.e., electrically coupled to)) a gate electrode (comprises a first gate electrode plate 220) of the first memory transistor 221; and a complementary bit line BLn* is connected to (and thus, is electrically shorted to (i.e. electrically coupled to) a gate electrode (comprises another first gate electrode plate 220) of the second memory transistor 222 and configured to be biased at a complementary voltage of a voltage at the primary bit line BLn. For each four transistor ternary content-addressable memory cell C_mn, a primary search line SLn is connected to (and thus, is electrically shorted to (i.e., electrically coupled to)) a gate electrode of the second non-hysteretic transistor 322; and a complementary search line SLn* is connected to (and thus, is electrically shorted to (i.e., electrically coupled to)) a gate electrode of the first non-hysteretic transistor 321.

FIGS. 9A-16C illustrate a manufacturing sequence for forming a second exemplary structure, which may be derived from the first exemplary structure by re-arranging the layout of various components in the first exemplary structure illustrated in FIGS. 2-7D. While the second exemplary structure is illustrated for an embodiment in which the memory transistors (221, 222) are formed as flash memory transistors, embodiments are expressly contemplated herein in which the memory transistors (221, 222) are formed as ferroelectric memory transistors described with reference to FIGS. 7A-7D.

Figures 9A, 9B:
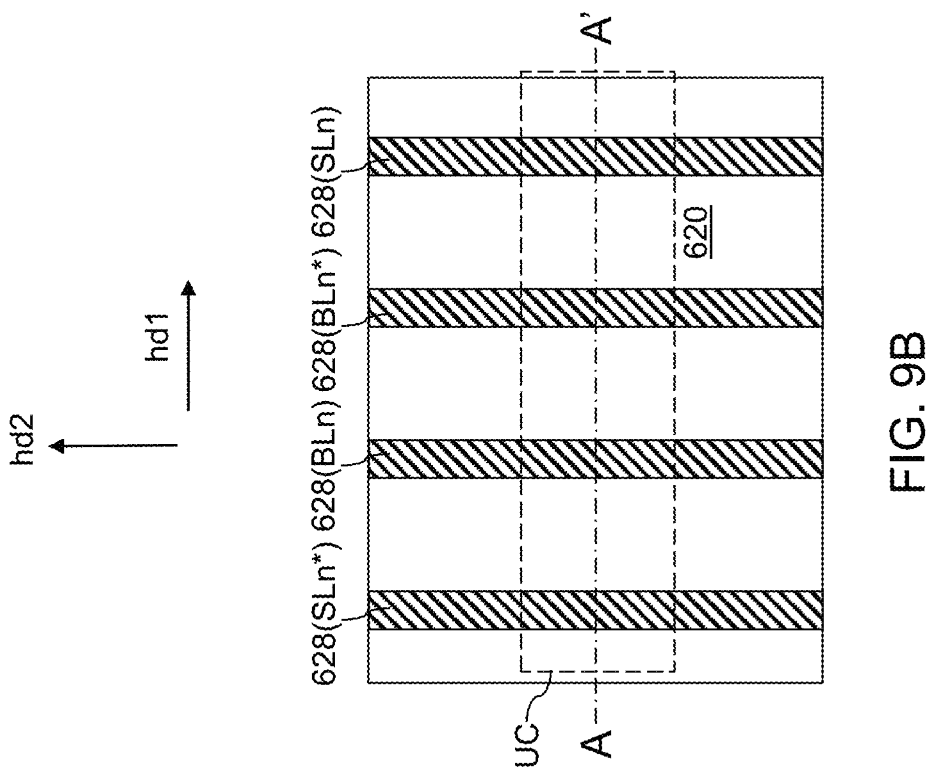
FIGS. 9A and 9B are views of a region of a second exemplary structure after formation of search lines and bit lines according to a second embodiment of the present disclosure.

FIGS. 9A and 9B are views of a region of a second exemplary structure after formation of search lines and bit lines according to a second embodiment of the present disclosure. FIG. 9A is a vertical cross-sectional view. FIG. 9B is a top-down view. The vertical plane A-A' in FIG. 9B is a cut plane for the vertical cross-sectional view of FIG. 9A.

Referring to FIGS. 9A and 9B, the second exemplary structure may be derived from the first exemplary structure illustrated in FIG. 2 by modifying the layout of the primary search line SLn, the complementary search line SLn*, the primary bit line BLn, and the complementary bit line BLn*. Specifically, the primary search line SLn, the complementary search line SLn*, the primary bit line BLn, and the complementary bit line BLn* may be formed as second metal line structures 628 formed within a second interconnect-level dielectric material layer 620, laterally spaced apart along a first horizontal direction hd1, and laterally extending along a second horizontal direction hd2 that is perpendicular to the first horizontal direction hd1.

The pitch of the second metal line structures 628 that are used as the primary search line SLn, the complementary search line SLn*, the primary bit line BLn, and the complementary bit line BLn* may be uniform, and may be about four times the width of the second metal line structures 628 along the first horizontal direction hd1. The width of each second metal line structure 628 may be in a range from 10 nm to 200 nm, such as from 20 nm to 60 nm, although lesser and greater widths may also be used. The lateral dimension of a unit cell UC along the first horizontal direction hd1 may be four times the pitch of the second metal line structures 628 along the first horizontal direction hd1. The lateral dimension of the unit cell UC along the second horizontal direction hd2 may be twice the pitch of metal line structures to be subsequently formed as the word lines and the match lines, and may be about four times the width of each metal line structure to be subsequently used as the word lines and the match lines. The transistors for a unit cell UC may be subsequently formed as a 4×1 array of thin film transistors.

Figures 10A, 10B:
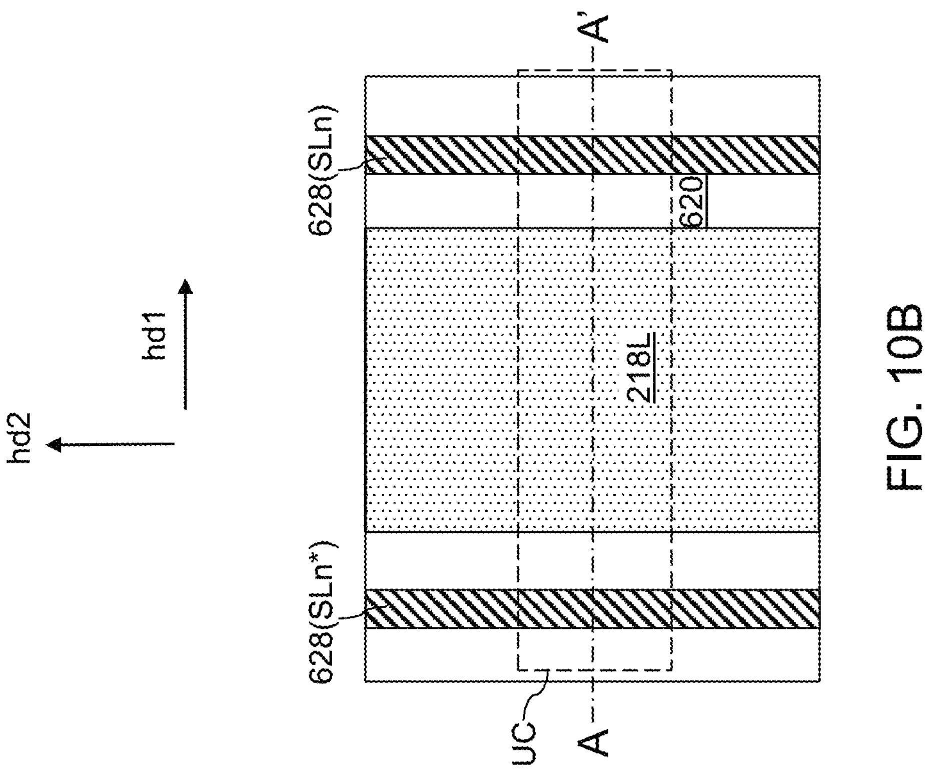
FIGS. 10A and 10B are views of a region of the second exemplary structure after formation of a backside gate dielectric layer according to the second embodiment of the present disclosure.

FIGS. 10A and 10B are views of a region of the second exemplary structure after formation of a backside gate dielectric layer according to the second embodiment of the present disclosure. FIG. 10A is a vertical cross-sectional view. FIG. 10B is a top-down view. The vertical plane A-A' in FIG. 10B is a cut plane for the vertical cross-sectional view of FIG. 10A.

Referring to FIGS. 10A-10B, a first subset of the processing steps described with reference to FIGS. 4A-4D may be performed to form a backside gate dielectric layer 218L. Generally, a first dielectric material layer (such as a lower via-level dielectric layer 12 and/or a second interconnect-level dielectric material layer 620) may be formed over a substrate 8. In the second embodiment, the first dielectric material layer may be the second interconnect-level dielectric material layer 620. The backside gate dielectric layer 218L may be formed over a first area of the first dielectric material layer (such as the second interconnect-level dielectric material layer 620) without covering a second area of the first dielectric material layer. Specifically, the first area is the area for subsequently forming the memory transistors (221, 222), and overlies the entirety of the primary bit line BLn and the complementary bit line BLn*. The second area is the area for subsequently forming the non-hysteretic transistors (321, 322), and overlies the entirety of the primary search line SLn and the complementary search line SLn*.

Figures 11A, 11B:
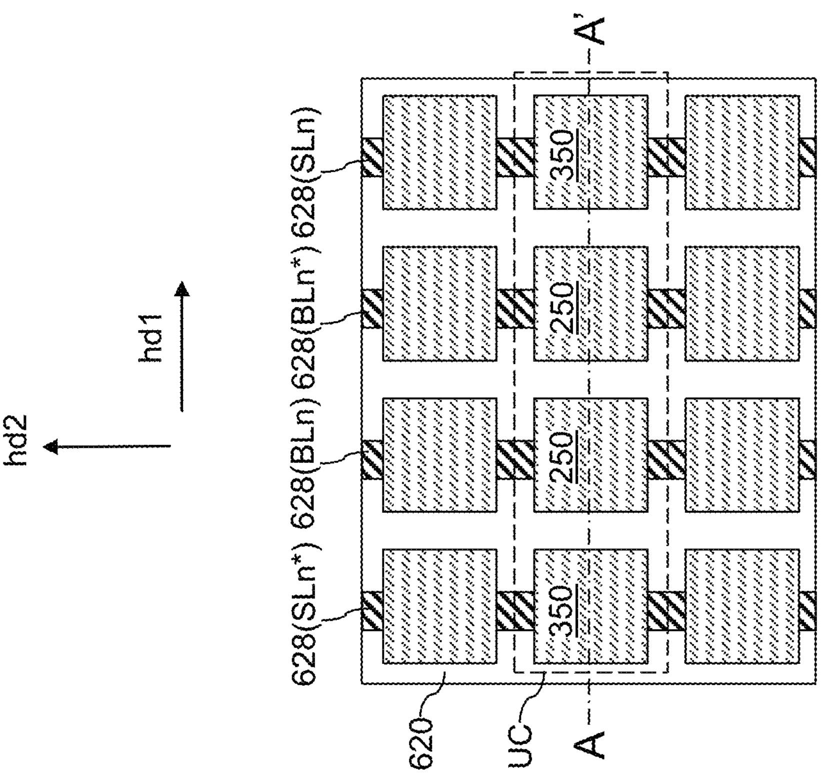
FIGS. 11A and 11B are views of a region of the second exemplary structure after formation of patterned layer stacks according to the second embodiment of the present disclosure.

FIGS. 11A and 11B are views of a region of the second exemplary structure after formation of patterned layer stacks according to the second embodiment of the present disclosure. FIG. 11A is a vertical cross-sectional view. FIG. 11B is a top-down view. The vertical plane A-A' in FIG. 11B is a cut plane for the vertical cross-sectional view of FIG. 11A.

Referring collectively to FIGS. 1, 8, 11A and 11B, a second subset of the processing steps described with reference to FIGS. 4A-4D may be performed to form a layer stack of a gate electrode material layer, a front gate dielectric layer, and a semiconductor material layer in the first area and the second area, i.e., in the entirety of the area for forming a four transistor ternary content-addressable memory array. The layer stack and the backside gate dielectric layer may be patterned to form patterned layer stacks described with reference to FIGS. 4A-4D.

As discussed with reference to FIGS. 4A-4D, the layer stack and the backside gate dielectric layer may be patterned, for example, by applying and patterning a photoresist layer over the semiconductor material layer, and by performing an anisotropic etch process that transfers the pattern in the photoresist layer through the layer stack and the backside gate dielectric layer. First patterned portions of the layer stack and patterned portions of the backside gate dielectric layer are formed in the areas for the first memory transistor 221 and the second memory transistor 222. Second patterned portions of the layer stack are formed in the areas for the first non-hysteretic transistor 321 and the second non-hysteretic transistor 322.

A first vertical stack of a backside gate dielectric 218, a first gate electrode plate 220, a front gate dielectric 240, and a first semiconductor channel 250 may be formed within each area for the first memory transistor 221 and the second memory transistor 222. Sidewalls of the backside gate dielectric 218, the first gate electrode plate 220, the front gate dielectric 240, and the first semiconductor channel 250 may be vertically coincident to one another within each first vertical stack. A second vertical stack of a second gate electrode plate 320, a non-hysteretic gate dielectric 340, and a second semiconductor channel 350 may be formed within each area for the first non-hysteretic transistor 321 and the second non-hysteretic transistor 322. Sidewalls of the second gate electrode plate 320, the non-hysteretic gate dielectric 340, and the second semiconductor channel 350 may be vertically coincident to one another within each second vertical stack.

Each backside gate dielectric 218 may be a patterned portion of the backside gate dielectric layer 218L, and may have a uniform thickness throughout. Each first gate electrode plate 220 and each second gate electrode plate 320 are patterned portions of the gate electrode material layer, and may have the same conductive material composition and the same thickness. Each front gate dielectric 240 and each non-hysteretic gate dielectric 340 are patterned portions of the front gate dielectric layer, and may have the same dielectric material composition and the same thickness. Each first semiconductor channel 250 and each second semiconductor channel 350 are patterned portions of the semiconductor material layer, and may have the same semiconductor material composition and the same thickness.

The first memory transistor 221 and the second memory transistor 222 comprise first patterned portions of the layer stack and patterned portions of the backside gate dielectric layer, and the first non-hysteretic transistor 321 and the second non-hysteretic transistor 322 comprise second patterned portions of the layer stack.

Figures 12A, 12B:
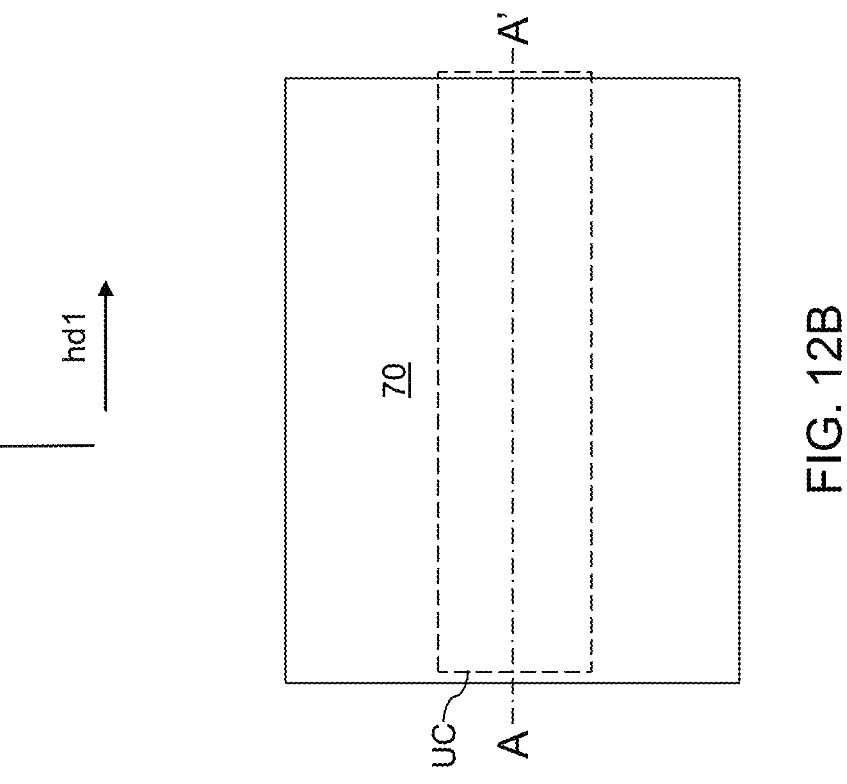
FIGS. 12A and 12B are views of a region of the second exemplary structure after formation of a contact-level dielectric layer according to the second embodiment of the present disclosure.

FIGS. 12A and 12B are views of a region of the second exemplary structure after formation of a contact-level dielectric layer according to the second embodiment of the present disclosure. FIG. 12A is a vertical cross-sectional view. FIG. 12B is a top-down view. The vertical plane A-A' in FIG. 12B is a cut plane for the vertical cross-sectional view of FIG. 12A.

Referring to FIGS. 12A and 12B, a first subset of the processing steps described with reference to FIGS. 5A-5D may be performed to form a contact-level dielectric layer 70.

Figures 13A, 13B:
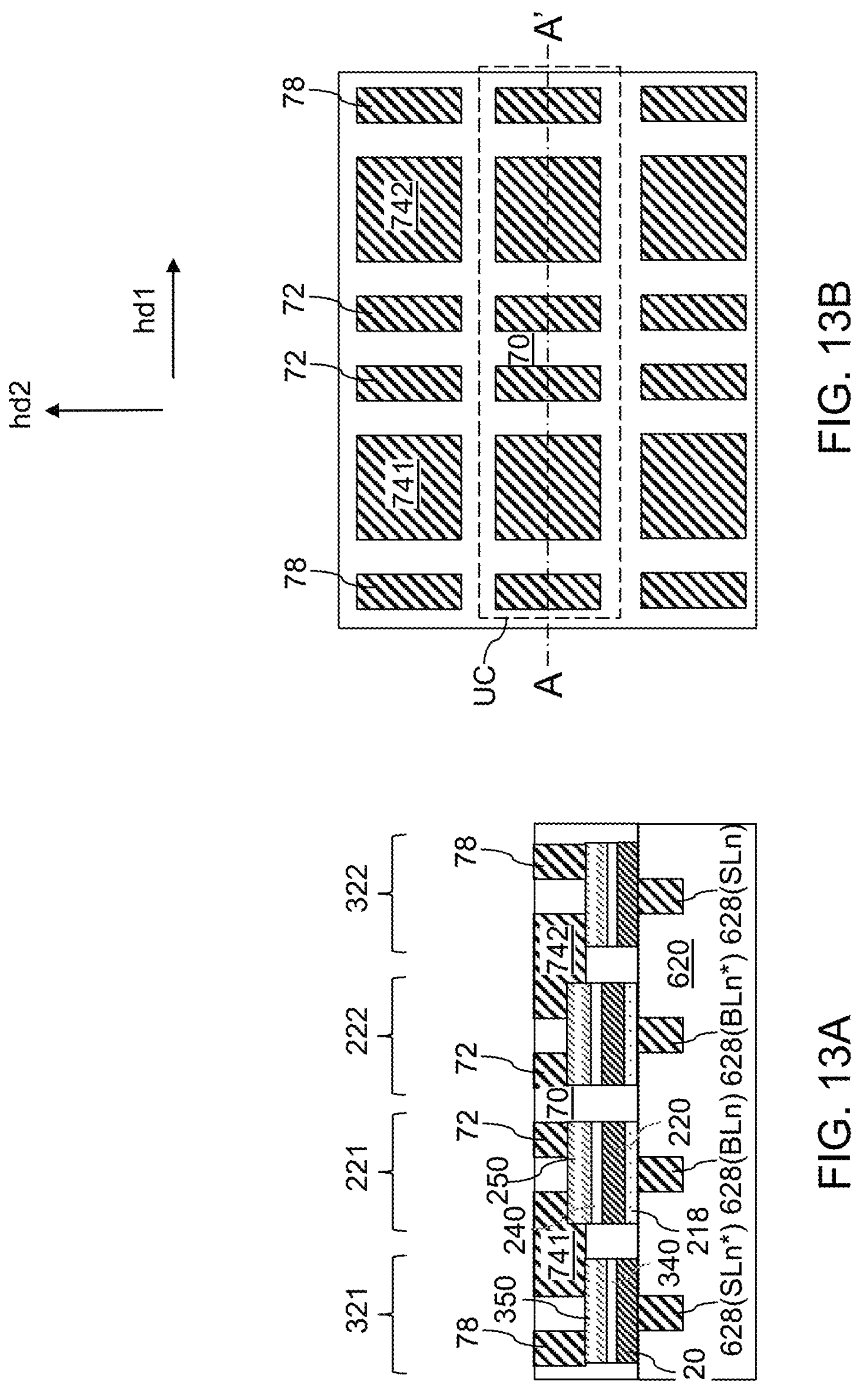
FIGS. 13A and 13B are views of a region of the second exemplary structure after formation of contact via structures according to the second embodiment of the present disclosure.

FIGS. 13A and 13B are views of a region of the second exemplary structure after formation of contact via structures according to the second embodiment of the present disclosure. FIG. 13A is a vertical cross-sectional view. FIG. 13B is a top-down view. The vertical plane A-A' in FIG. 13B is a cut plane for the vertical cross-sectional view of FIG. 13A.

Referring to FIGS. 13A and 13B, a second subset of the processing steps described with reference to FIGS. 5A-5D may be performed to form various contact via structures (741, 742, 72, 78). The various contact via structures (741, 742, 72, 78) function as source/drain structures for the various transistors (221, 222, 321, 322). Generally, a first memory transistor 221, a second memory transistor 222, a first non-hysteretic transistor 321, and a second non-hysteretic transistor 322 may be formed. The first memory transistor 221 comprises a first memory element (such as a floating gate electrode or a ferroelectric gate dielectric 230 as shown in FIGS. 7A and 7B) configured to store a first binary bit, and the second memory transistor 222 comprises a second memory element (such as a floating gate electrode or a ferroelectric gate dielectric 230 as shown in FIGS. 7A and 7B) configured to store a second binary bit.

A first series connection of the first memory transistor 221 and the first non-hysteretic transistor 321 may be formed by the first contact via structure 741. A second series connection of the second memory transistor 222 and the second non-hysteretic transistor 322 may be formed by the second contact via structure 742. The first contact via structure 741 may be formed directly on the first memory transistor 221 and the first non-hysteretic transistor 321 to provide the first series connection; and the second contact via structure 742 may be formed directly on the second memory transistor 222 and the second non-hysteretic transistor 322 to provide the second series connection.

In the second exemplary structure, the first memory transistor 221 and the first non-hysteretic transistor 321 are neighboring transistors that are laterally spaced apart along the first horizontal direction hd1 within a unit cell UC, and the first contact via structure 741 functions as a first source/drain structure of the first memory transistor 221 and as a first source/drain structure of the first non-hysteretic transistor 321. The first contact via structure 741 also functions as an electrically conductive path connecting the first source/drain structure of the first memory transistor 221 and the first source/drain structure of the first non-hysteretic transistor 321.

Further, the second memory transistor 222 and the second non-hysteretic transistor 322 are neighboring transistors that are laterally spaced apart along the first horizontal direction hd1 within the unit cell UC, and the second contact via structure 742 functions as a first source/drain structure of the second memory transistor 222 and as a first source/drain structure of the second non-hysteretic transistor 322. The second contact via structure 742 also functions as an electrically conductive path connecting the first source/drain structure of the second memory transistor 222 and the first source/drain structure of the second non-hysteretic transistor 322.

In one embodiment, the first memory transistor 221 comprises a first semiconductor channel 250; the first non-hysteretic transistor 321 comprises a second semiconductor channel 350; and the first semiconductor channel 250 and the second semiconductor channel 350 have a same material composition and a same thickness. In one embodiment, the first memory transistor 221 comprises a floating gate electrode (comprising a first gate electrode plate 220); the first non-hysteretic transistor 321 comprises a non-floating gate electrode (comprising a second gate electrode plate 320); and the floating gate electrode (comprising a first gate electrode plate 220) and the non-floating gate electrode (comprising a second gate electrode plate 320) have a same material composition and a same thickness.

In one embodiment, the floating gate electrode (comprising a first gate electrode plate 220) is vertically spaced from a top surface of a dielectric material layer (such as the second interconnect-level dielectric material layer 620) by a backside gate dielectric 218 that contacts a first segment of the top surface of the dielectric material layer; and the non-floating gate electrode (comprising a second gate electrode plate 320) is in contact with a second segment of the top surface of the dielectric material layer. In one embodiment, sidewalls of the floating gate electrode (comprising a first gate electrode plate 220) are vertically coincident with sidewalls of the backside gate dielectric 218.

In one embodiment, the first memory transistor 221 comprises a front gate dielectric 240 that contacts a first semiconductor channel 250 of the first memory transistor 221; the first non-hysteretic transistor 321 comprises a non-hysteretic gate dielectric 340 that contacts a second semiconductor channel 350 of the first non-hysteretic transistor 321; and the front gate dielectric 240 and the non-hysteretic gate dielectric 340 have a same material composition and a same thickness. In one embodiment, one of the front gate dielectric 240 and the backside gate dielectric 218 comprises a tunneling dielectric layer that provides charge tunneling therethrough; and another of the front gate dielectric 240 and the backside gate dielectric 218 comprises a blocking dielectric layer that suppresses charge tunneling therethrough.

Figures 14A, 14B, 14C:
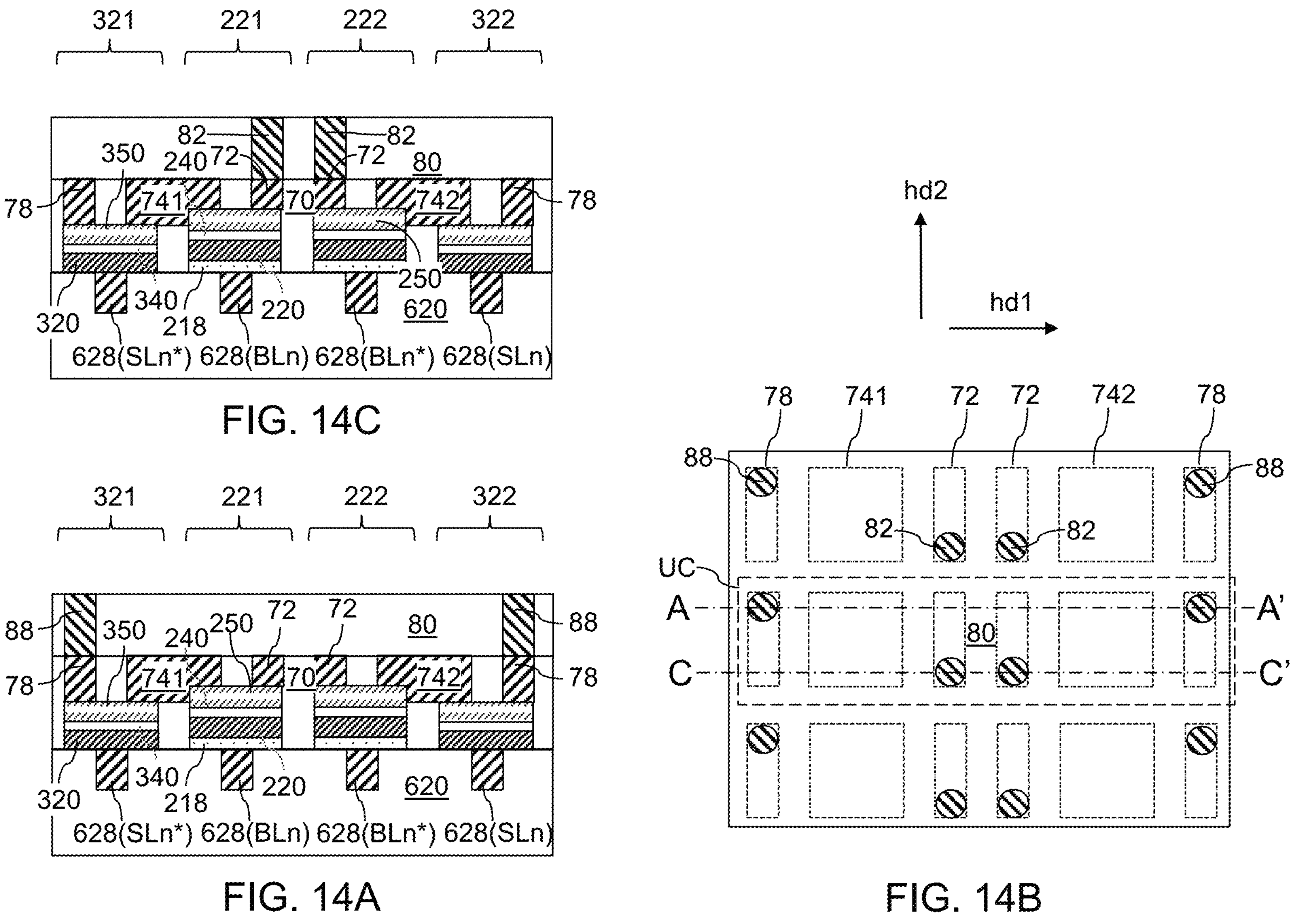
FIGS. 14A-14C are views of a region of the second exemplary structure after formation of a via-level dielectric layer and connection via structures according to the second embodiment of the present disclosure.

FIGS. 14A-14C are views of a region of the second exemplary structure after formation of a via-level dielectric layer and connection via structures according to the second embodiment of the present disclosure. FIG. 14A is a first vertical cross-sectional view. FIG. 14B is a top-down view. FIG. 14C is a second vertical cross-sectional view. The vertical plane A-A' in FIG. 14B is a cut plane for the vertical cross-sectional view of FIG. 14A. The vertical plane C-C' in FIG. 14B is a cut plane for the vertical cross-sectional view of FIG. 14C.

Referring to FIGS. 14A-14C, a first subset of processing steps described with reference to FIGS. 7A-7D may be performed to form an upper via-level dielectric layer 80. Via cavities may be formed through the upper via-level dielectric layer 80 over the third contact via structures 72 and the fourth contact via structures 78, and may be filled with at least one conductive material to form first connection via structures 82 and second connection via structures 88. Each first connection via structure 82 may contact a top surface of a respective third contact via structure 72, and each second connection via structure 88 may contact a stop surface of a respective fourth contact via structure 78.

Figures 15A, 15B, 15C:
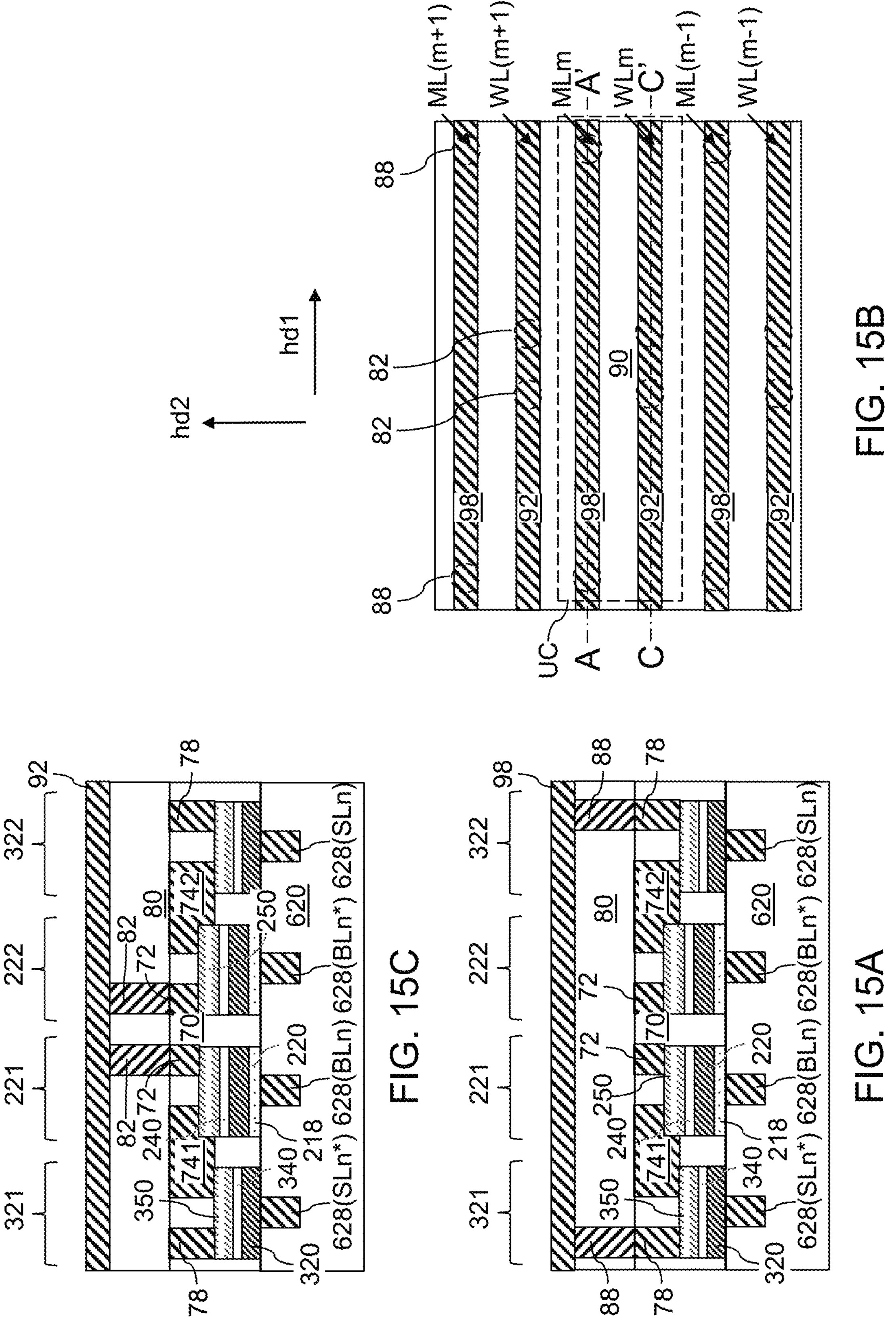
FIGS. 15A-15C are views of a region of the second exemplary structure after formation of a line-level dielectric layer, match lines, and word lines according to the second embodiment of the present disclosure.

FIGS. 15A-15C are views of a region of the second exemplary structure after formation of a line-level dielectric layer, match line MLms, and word line WLms according to the second embodiment of the present disclosure. FIG. 15A is a first vertical cross-sectional view. FIG. 15B is a top-down view. FIG. 15C is a second vertical cross-sectional view. The vertical plane A-A' in FIG. 15B is a cut plane for the vertical cross-sectional view of FIG. 15A. The vertical plane C-C' in FIG. 15B is a cut plane for the vertical cross-sectional view of FIG. 15C.

Referring to FIGS. 1, 8, and 15A-15C, a second subset of processing steps described with reference to FIGS. 7A-7D may be performed to form a line-level dielectric layer 90 over the upper via-level dielectric layer 80. Line cavities may be formed through the line-level dielectric layer 90 so that top surfaces of the connection via structures (82, 88) are physically exposed. Word lines 92 and match lines 98 may be formed in the line cavities. The word lines 92 may contact top surfaces of the first connection via structures 82, and the match lines 98 may contact top surfaces of the second connection via structures 88. Generally, match lines 98 and word lines 92 may be formed such that the first series connection 741 and the second series connection 742 may be connected in parallel between a match line 98 and a word line 92 within each unit cell UC. A four transistor ternary content-addressable memory cell C_mn may be formed within each unit cell. FIGS. 15A-15C illustrate three unit cells that are electrically connected to an (m−1)-th word line WL(m−1), an (m−1)-th match line ML(m−1), an m-th word line WLm, an m-th match line MLm, an (m+1)-th word line WL(m+1), and an (m+1)-th match line ML(m+1). In one embodiment, each match line 98 and each word line 92 may laterally extend along the first horizontal direction hd1, and may be laterally spaced apart along the second horizontal direction hd2. In one embodiment, the match lines 98 and the word lines 92 may comprise third metal line structures, and the line-level dielectric layer 90 may function as a component of a third interconnect-level dielectric material layer.

Generally, a four transistor ternary content-addressable memory cell C_mn may be formed by forming a match line MLm and a word line WLm and by connecting the first series connection 741 and the second series connection 742 in parallel between the match line MLm and the word line WLm. In one embodiment, a primary bit line BLn may be connected to a gate electrode (comprises a first gate electrode plate 220) of the first memory transistor 221; and a complementary bit line BLn* may be connected to a gate electrode (comprises another first gate electrode plate 220) of the second memory transistor 222. In one embodiment, a primary search line SLn may be connected to a gate electrode of the second non-hysteretic transistor 322; and a complementary search line SLn* may be connected to a gate electrode of the first non-hysteretic transistor 321.

Figures 16A, 16B, 16C:
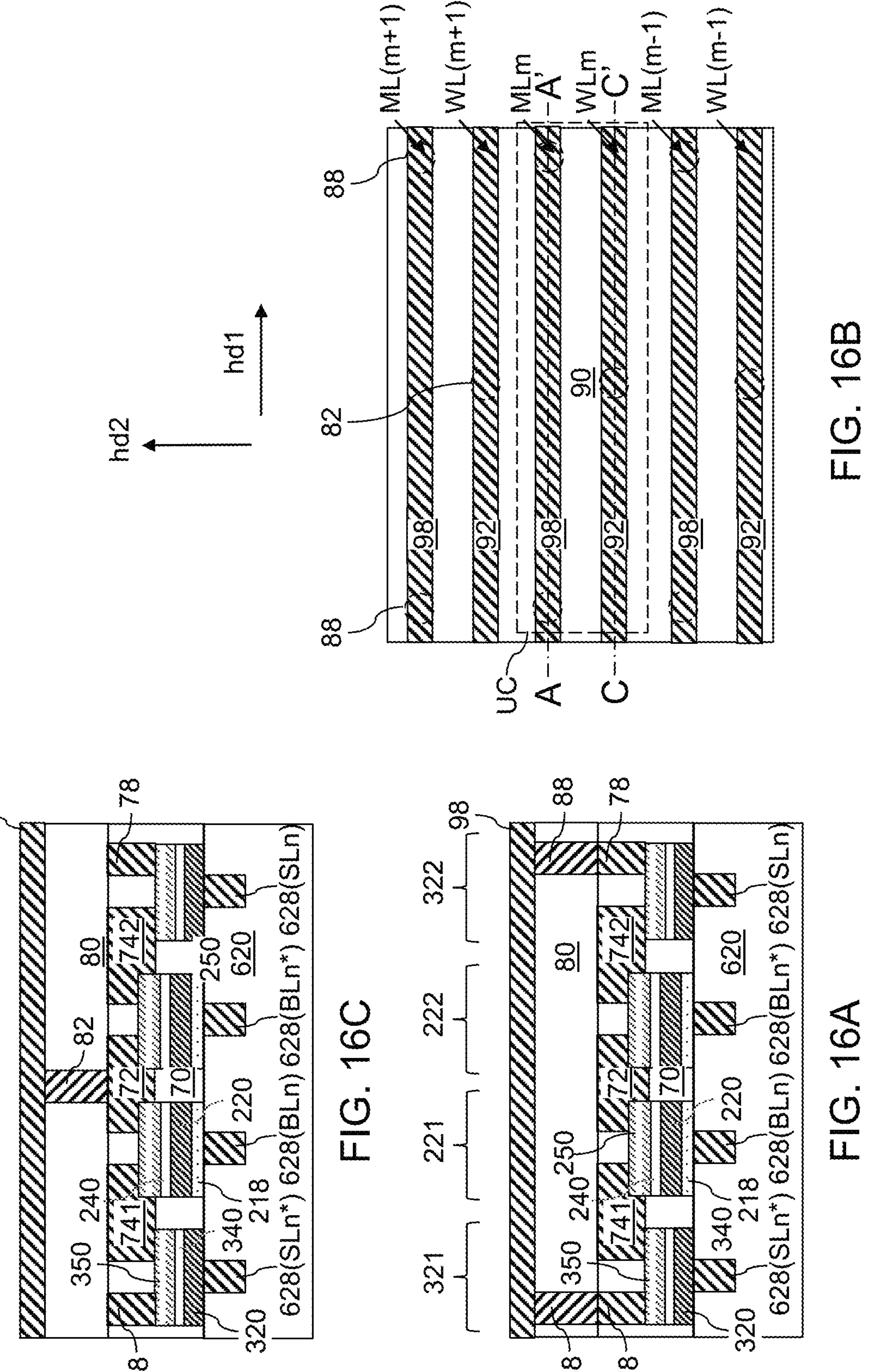
FIGS. 16A-16C are views of a region of an alternative configuration of the second exemplary structure after formation of a line-level dielectric layer, match lines, and word lines according to the second embodiment of the present disclosure.

FIGS. 16A-16C are views of a region of an alternative configuration of the second exemplary structure after formation of a line-level dielectric layer, match line MLms, and word line WLms according to the second embodiment of the present disclosure. FIG. 16A is a first vertical cross-sectional view. FIG. 16B is a top-down view. FIG. 16C is a second vertical cross-sectional view. The vertical plane A-A' in FIG. 16B is a cut plane for the vertical cross-sectional view of FIG. 16A. The vertical plane C-C' in FIG. 16B is a cut plane for the vertical cross-sectional view of FIG. 16C.

Referring to FIGS. 16A-16C, the alternative configuration of the second exemplary structure may be derived from the second exemplary structure by forming a single third contact via structure 72 that contacts a second end portion of the first semiconductor channel 250 of the first memory transistor 221 and contacts a second end portion of the first semiconductor channel 250 of the second memory transistor 222. In this embodiment, a unit cell comprises a first contact via structure 741, a second contact via structure 742, a third contact via structure 72, and two fourth contact via structures 78. In this embodiment, a single first connection via structure 82 may be used to electrically connect the third contact via structure 72 to a word line 92. The third contact via structure 72 functions as a second source/drain structure of the first memory transistor 221 and as a second source/drain structure of the second memory transistor 222. Further, the third contact via structure 72 provides an electrically conductive path between the second source/drain structure of the first memory transistor 221 and as a second source/drain structure of the second memory transistor 222.

FIGS. 17A-25E illustrate a manufacturing sequence for forming a third exemplary structure, which may be derived from the first exemplary structure by re-arranging the layout of various components in the first exemplary structure illustrated in FIGS. 2-7D. While the third exemplary structure is illustrated for an embodiment in which the memory transistors (221, 222) are formed as flash memory transistors, embodiments are expressly contemplated herein in which the memory transistors (221, 222) are formed as ferroelectric memory transistors described with reference to FIGS. 7A-7D.

FIGS. 17A-17C are views of a region of a third exemplary structure after formation of search lines and bit lines according to a third embodiment of the present disclosure. FIG. 17A is a first vertical cross-sectional view. FIG. 17B is a top-down view. FIG. 17C is a second vertical cross-sectional view. The vertical plane A-A' in FIG. 17B is a cut plane for the vertical cross-sectional view of FIG. 17A. The vertical plane C-C' in FIG. 17B is a cut plane for the vertical cross-sectional view of FIG. 17C.

Referring to FIGS. 17A-17C, the third exemplary structure may be derived from the first exemplary structure illustrated in FIG. 2 by modifying the layout of the primary search line SLn, the complementary search line SLn*, the primary bit line BLn, and the complementary bit line BLn*. Specifically, the primary search line SLn, the complementary search line SLn*, the primary bit line BLn, and the complementary bit line BLn* may be formed as second metal line structures 628 formed within a second interconnect-level dielectric material layer 620, laterally spaced apart along a first horizontal direction hd1, and laterally extending along a second horizontal direction hd2 that is perpendicular to the first horizontal direction hd1.

The pitch of the second metal line structures 628 that are used as the primary search line SLn, the complementary search line SLn*, the primary bit line BLn, and the complementary bit line BLn* may be uniform, and may be about two times the width of the second metal line structures 628 along the first horizontal direction hd1. The width of each second metal line structure 628 may be in a range from 10 nm to 200 nm, such as from 20 nm to 60 nm, although lesser and greater widths may also be used. The lateral dimension of a unit cell UC along the first horizontal direction hd1 may be four times the pitch of the second metal line structures 628 along the first horizontal direction hd1. The lateral dimension of the unit cell UC along the second horizontal direction hd2 may be twice the pitch of metal line structures to be subsequently formed as the word lines and the match lines, and may be about eight times of the width of each metal line structure to be used as the word lines and the match lines. The transistors for a unit cell UC may be subsequently formed as a 2×2 array of thin film transistors.

FIGS. 18A-18C are views of a region of the third exemplary structure after formation of a via-level dielectric layer and conductive via structures according to the third embodiment of the present disclosure. FIG. 18A is a first vertical cross-sectional view. FIG. 18B is a top-down view. FIG. 18C is a second vertical cross-sectional view. The vertical plane A-A' in FIG. 18B is a cut plane for the vertical cross-sectional view of FIG. 18A. The vertical plane C-C' in FIG. 18B is a cut plane for the vertical cross-sectional view of FIG. 18C.

Referring to FIGS. 18A-18C, the processing steps described with reference to FIGS. 3A-3D may be performed to form first conductive via structures 215 and second conductive via structures 315 formed within a first dielectric material layer (which may comprise a lower via-level dielectric layer 12. Thus, the first conductive via structures 215 and the second conductive via structures 315 may be formed within a first dielectric material layer (such as the lower via-level dielectric layer 12. The first conductive via structures 215 and the second conductive via structures 315 may alternate along the second horizontal direction. Each first conductive via structure 215 may be formed directly on a primary bit line BLn or directly on a complementary bit line BLn*. Each second conductive via structure 315 may be formed directly on a primary search line SLn or directly on a complementary search line SLn*.

FIGS. 19A-19C are views of a region of the third exemplary structure after formation of backside gate dielectric layers according to the third embodiment of the present disclosure. FIG. 19A is a first vertical cross-sectional view. FIG. 19B is a top-down view. FIG. 19C is a second vertical cross-sectional view. The vertical plane A-A' in FIG. 19B is a cut plane for the vertical cross-sectional view of FIG. 19A. The vertical plane C-C' in FIG. 19B is a cut plane for the vertical cross-sectional view of FIG. 19C.

Referring to FIGS. 19A-19C, a first subset of the processing steps described with reference to FIGS. 4A-4D may be performed to form backside gate dielectric layers 218L. Generally, a first dielectric material layer (such as a lower via-level dielectric layer 12 and/or a second interconnect-level dielectric material layer 620) may be formed over a substrate 8. In the third embodiment, the first dielectric material layer may be the lower via-level dielectric layer 12. The backside gate dielectric layers 218L may be formed by depositing a blanket gate dielectric layer, and by patterning the blanket gate dielectric layer to cover each first area of the first dielectric material layer (such as the lower via-level dielectric layer 12) without covering any second area of the first dielectric material layer. Specifically, the first areas are the areas for subsequently forming the memory transistors (221, 222), and includes strip areas having an overlap with a respective set of the first conductive via structures 215. The second areas are areas for subsequently forming the non-hysteretic transistors (321, 322), and includes strip areas having an areal overlap with a respective subset of the second conductive via structures 315.

As such, the backside gate dielectric layers 218L may be formed as discrete strips having a uniform width along the second horizontal direction hd2 and laterally extending along the first horizontal direction hd1. The backside gate dielectric layers 218L cover each of the first conductive via structures 215, and do not cover any of the second conductive via structures 315. The backside gate dielectric layers 218L are formed directly on the first conductive via structures 215, do not cover the second conductive via structures 315.

Figure 20B:
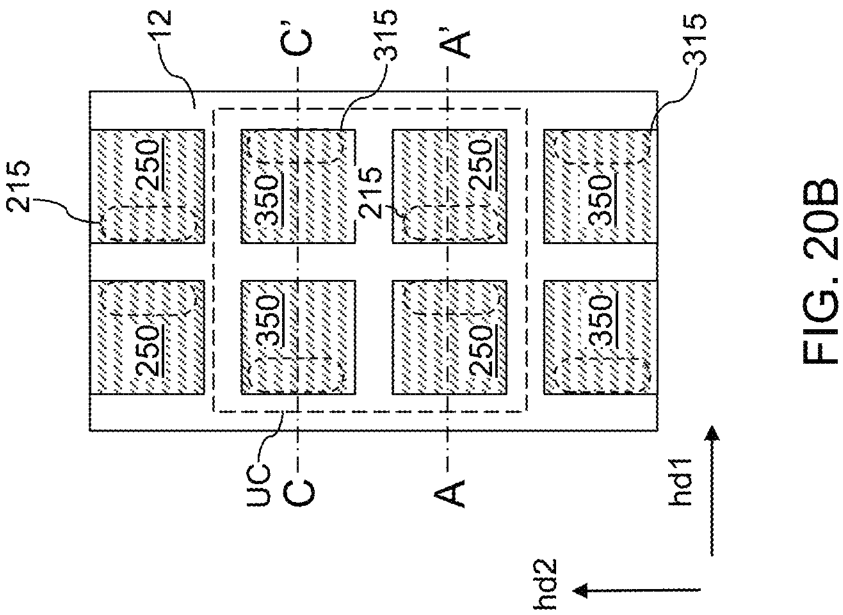
FIGS. 20A-20C are views of a region of the third exemplary structure after formation of patterned layer stacks according to the third embodiment of the present disclosure.
Figure 20C:
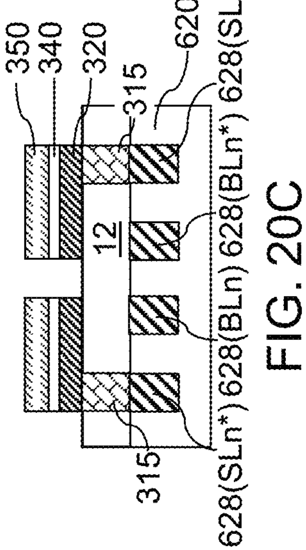
Figure 20A:
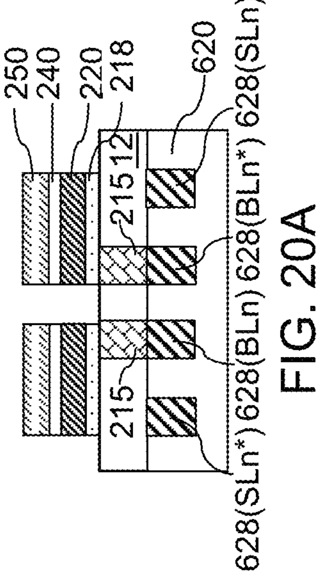

FIGS. 20A-20C are views of a region of the third exemplary structure after formation of patterned layer stacks according to the third embodiment of the present disclosure. FIG. 20A is a first vertical cross-sectional view. FIG. 20B is a top-down view. FIG. 20C is a second vertical cross-sectional view. The vertical plane A-A' in FIG. 20B is a cut plane for the vertical cross-sectional view of FIG. 20A. The vertical plane C-C' in FIG. 20B is a cut plane for the vertical cross-sectional view of FIG. 20C.

Referring collectively to FIGS. 1, 8, and 20A-20C, a second subset of the processing steps described with reference to FIGS. 4A-4D may be performed to form a layer stack of a gate electrode material layer, a front gate dielectric layer, and a semiconductor material layer in the first area and the second area, i.e., in the entirety of the area for forming a four transistor ternary content-addressable memory array. The gate electrode material layer is formed directly on the second conductive via structures 315, and is spaced from the first conductive via structures 215. The layer stack and the backside gate dielectric layer may be patterned to form patterned layer stacks described with reference to FIGS. 4A-4D.

As discussed with reference to FIGS. 4A-4D, the layer stack and the backside gate dielectric layer may be patterned, for example, by applying and patterning a photoresist layer over the semiconductor material layer, and by performing an anisotropic etch process that transfers the pattern in the photoresist layer through the layer stack and the backside gate dielectric layer. First patterned portions of the layer stack and patterned portions of the backside gate dielectric layer are formed in the areas for the first memory transistor 221 and the second memory transistor 222. Second patterned portions of the layer stack are formed in the areas for the first non-hysteretic transistor 321 and the second non-hysteretic transistor 322.

A first vertical stack of a backside gate dielectric 218, a first gate electrode plate 220, a front gate dielectric 240, and a first semiconductor channel 250 may be formed within each area for the first memory transistor 221 and the second memory transistor 222. Sidewalls of the backside gate dielectric 218, the first gate electrode plate 220, the front gate dielectric 240, and the first semiconductor channel 250 may be vertically coincident to one another within each first vertical stack. A second vertical stack of a second gate electrode plate 320, a non-hysteretic gate dielectric 340, and a second semiconductor channel 350 may be formed within each area for the first non-hysteretic transistor 321 and the second non-hysteretic transistor 322. Sidewalls of the second gate electrode plate 320, the non-hysteretic gate dielectric 340, and the second semiconductor channel 350 may be vertically coincident to one another within each second vertical stack.

Each backside gate dielectric 218 is a patterned portion of the backside gate dielectric layers 218L, and may have a uniform thickness throughout. Each first gate electrode plate 220 and each second gate electrode plate 320 are patterned portions of the gate electrode material layer, and may have the same conductive material composition and the same thickness. Each front gate dielectric 240 and each non-hysteretic gate dielectric 340 are patterned portions of the front gate dielectric layer, and may have the same dielectric material composition and the same thickness. Each first semiconductor channel 250 and each second semiconductor channel 350 are patterned portions of the semiconductor material layer, and may have the same semiconductor material composition and the same thickness.

The first memory transistor 221 and the second memory transistor 222 comprise first patterned portions of the layer stack and patterned portions of the backside gate dielectric layer, and the first non-hysteretic transistor 321 and the second non-hysteretic transistor 322 comprise second patterned portions of the layer stack. Each second conductive via structure 315 may contact a peripheral portion of a bottom surface of a respective second gate electrode plate 320, and is off-centered relative to the respective second gate electrode plate 320 in a plan view. Each first conductive via structure 215 may contact a peripheral portion of a bottom surface of a respective backside gate dielectric 218, and is off-centered relative to the respective backside gate dielectric 218 in the plan view.

FIGS. 21A-21C are views of a region of the third exemplary structure after formation of a contact-level dielectric layer and contact via structures according to the third embodiment of the present disclosure. FIG. 21A is a first vertical cross-sectional view. FIG. 21B is a top-down view. FIG. 21C is a second vertical cross-sectional view. The vertical plane A-A' in FIG. 21B is a cut plane for the vertical cross-sectional view of FIG. 21A. The vertical plane C-C' in FIG. 21B is a cut plane for the vertical cross-sectional view of FIG. 21C.

Referring collectively to FIGS. 1, 8, and 21A-21C, a second subset of the processing steps described with reference to FIGS. 5A-5D may be performed to form various contact via structures (741, 742, 72, 78). The various contact via structures (741, 742, 72, 78) function as source/drain structures for the various transistors (221, 222, 321, 322). Generally, a first memory transistor 221, a second memory transistor 222, a first non-hysteretic transistor 321, and a second non-hysteretic transistor 322 may be formed. The first memory transistor 221 comprises a first memory element (such as a floating gate electrode or a ferroelectric gate dielectric 230 as shown in FIGS. 7A and 7B) configured to store a first binary bit, and the second memory transistor 222 comprises a second memory element (such as a floating gate electrode or a ferroelectric gate dielectric 230 as shown in FIGS. 7A and 7B) configured to store a second binary bit.

A first series connection of the first memory transistor 221 and the first non-hysteretic transistor 321 may be formed by the first contact via structure 741. A second series connection of the second memory transistor 222 and the second non-hysteretic transistor 322 may be formed by the second contact via structure 742. The first contact via structure 741 may be formed directly on the first memory transistor 221 and the first non-hysteretic transistor 321 to provide the first series connection; and the second contact via structure 742 may be formed directly on the second memory transistor 222 and the second non-hysteretic transistor 322 to provide the second series connection.

In the third exemplary structure, the first memory transistor 221 and the first non-hysteretic transistor 321 are neighboring transistors that are laterally spaced apart along second first horizontal direction hd2 within a unit cell UC, and the first contact via structure 741 functions as a first source/drain structure of the first memory transistor 221 and as a first source/drain structure of the first non-hysteretic transistor 321. The first contact via structure 741 also functions as an electrically conductive path connecting the first source/drain structure of the first memory transistor 221 and the first source/drain structure of the first non-hysteretic transistor 321.

Further, the second memory transistor 222 and the second non-hysteretic transistor 322 are neighboring transistors that are laterally spaced apart along the second horizontal direction hd2 within the unit cell UC, and the second contact via structure 742 functions as a first source/drain structure of the second memory transistor 222 and as a first source/drain structure of the second non-hysteretic transistor 322. The second contact via structure 742 also functions as an electrically conductive path connecting the first source/drain structure of the second memory transistor 222 and the first source/drain structure of the second non-hysteretic transistor 322.

In one embodiment, the first memory transistor 221 comprises a first semiconductor channel 250; the first non-hysteretic transistor 321 comprises a second semiconductor channel 350; and the first semiconductor channel 250 and the second semiconductor channel 350 have a same material composition and a same thickness. In one embodiment, the first memory transistor 221 comprises a floating gate electrode (comprising a first gate electrode plate 220); the first non-hysteretic transistor 321 comprises a non-floating gate electrode (comprising a second gate electrode plate 320); and the floating gate electrode (comprising a first gate electrode plate 220) and the non-floating gate electrode (comprising a second gate electrode plate 320) have a same material composition and a same thickness.

In one embodiment, the floating gate electrode (comprising a first gate electrode plate 220) is vertically spaced from a top surface of a dielectric material layer (such as the lower via-level dielectric layer 12) by a backside gate dielectric 218 that contacts a first segment of the top surface of the dielectric material layer; and the non-floating gate electrode (comprising a second gate electrode plate 320) is in contact with a second segment of the top surface of the dielectric material layer. In one embodiment, sidewalls of the floating gate electrode (comprising a first gate electrode plate 220) are vertically coincident with sidewalls of the backside gate dielectric 218.

In one embodiment, the first memory transistor 221 comprises a front gate dielectric 240 that contacts a first semiconductor channel 250 of the first memory transistor 221; the first non-hysteretic transistor 321 comprises a non-hysteretic gate dielectric 340 that contacts a second semiconductor channel 350 of the first non-hysteretic transistor 321; and the front gate dielectric 240 and the non-hysteretic gate dielectric 340 have a same material composition and a same thickness. In one embodiment, one of the front gate dielectric 240 and the backside gate dielectric 218 comprises a tunneling dielectric layer that provides charge tunneling therethrough; and another of the front gate dielectric 240 and the backside gate dielectric 218 comprises a blocking dielectric layer that suppresses charge tunneling therethrough.

FIGS. 22A-22C are views of a region of the third exemplary structure after formation of a via-level dielectric layer and connection via structures according to the third embodiment of the present disclosure. FIG. 22A is a first vertical cross-sectional view. FIG. 22B is a top-down view. FIG. 22C is a second vertical cross-sectional view. The vertical plane A-A' in FIG. 22B is a cut plane for the vertical cross-sectional view of FIG. 22A. The vertical plane C-C' in FIG. 22B is a cut plane for the vertical cross-sectional view of FIG. 22C.

Referring to FIGS. 22A-22C, a first subset of processing steps described with reference to FIGS. 7A-7D may be performed to form an upper via-level dielectric layer 80. Via cavities may be formed through the upper via-level dielectric layer 80 over the third contact via structures 72 and the fourth contact via structures 78, and may be filled with at least one conductive material to form first connection via structures 82 and second connection via structures 88. Each first connection via structure 82 may contact a top surface of a respective third contact via structure 72, and each second connection via structure 88 may contact a stop surface of a respective fourth contact via structure 78.

FIGS. 23A-23C are views of a region of the third exemplary structure after formation of a line-level dielectric layer, word line WLms, and match line MLms according to the third embodiment of the present disclosure. FIG. 23A is a first vertical cross-sectional view. FIG. 23B is a top-down view. FIG. 23C is a second vertical cross-sectional view. The vertical plane A-A' in FIG. 23B is a cut plane for the vertical cross-sectional view of FIG. 23A. The vertical plane C-C' in FIG. 23B is a cut plane for the vertical cross-sectional view of FIG. 23C.

Referring to FIGS. 1, 8, and 23A-23C, a second subset of processing steps described with reference to FIGS. 7A-7D may be performed to form a line-level dielectric layer 90 over the upper via-level dielectric layer 80. Line cavities may be formed through the line-level dielectric layer 90 so that top surfaces of the connection via structures (82, 88) are physically exposed. Word lines 92 and match lines 98 may be formed in the line cavities. The word lines 92 may contact top surfaces of the first connection via structures 82, and the match lines 98 may contact top surfaces of the second connection via structures 88. Generally, match lines 98 and word lines 92 may be formed such that the first series connection 741 and the second series connection 742 may be connected in parallel between a match line 98 and a word line 92 within each unit cell UC. A four transistor ternary content-addressable memory cell C_mn may be formed within each unit cell. FIGS. 23A-23C illustrate a portion of a unit cell that is electrically connected to an (m−1)-th match line ML(m−1), a unit cell UC that is electrically connected to an m-th word line WLm and an m-th match line MLm, and a portion of a unit cell that is electrically connected to an (m+1)-th word line WL(m+1). In one embodiment, each match line 98 and each word line 92 may laterally extend along the first horizontal direction hd1, and may be laterally spaced apart along the second horizontal direction hd2. In one embodiment, the match lines 98 and the word lines 92 may comprise third metal line structures, and the line-level dielectric layer 90 may function as a component of a third interconnect-level dielectric material layer.

Generally, a four transistor ternary content-addressable memory cell C_mn may be formed by forming a match line MLm and a word line WLm and by connecting the first series connection and the second series connection in parallel between the match line MLm and the word line WLm. In one embodiment, a primary bit line BLn may be connected to a gate electrode (comprises a first gate electrode plate 220) of the first memory transistor 221; and a complementary bit line BLn* may be connected to a gate electrode (comprises another first gate electrode plate 220) of the second memory transistor 222. In one embodiment, a primary search line SLn may be connected to a gate electrode of the second non-hysteretic transistor 322; and a complementary search line SLn* may be connected to a gate electrode of the first non-hysteretic transistor 321.

Figures 24D, 24E:
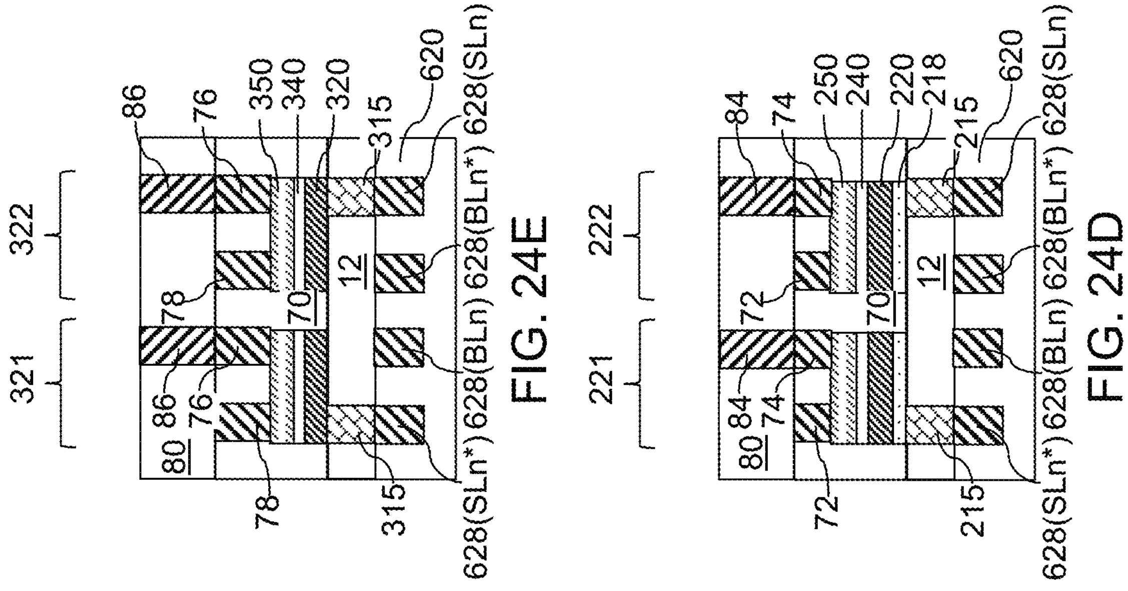

FIGS. 24A-24E are views of a region of an alternative configuration of the third exemplary structure after formation of a via-level dielectric layer and connection via structures according to the third embodiment of the present disclosure. FIG. 24A is a first vertical cross-sectional view. FIG. 24B is a top-down view. FIG. 24C is a second vertical cross-sectional view. FIG. 24D is a third vertical cross-sectional view. FIG. 24E is a fourth vertical cross-sectional view. The vertical plane A-A' in FIG. 24B is a cut plane for the vertical cross-sectional view of FIG. 24A. The vertical plane C-C' in FIG. 24B is a cut plane for the vertical cross-sectional view of FIG. 24C. The vertical plane D-D' in FIG. 24B is a cut plane for the vertical cross-sectional view of FIG. 24D. The vertical plane E-E' in FIG. 24B is a cut plane for the vertical cross-sectional view of FIG. 24E.

Referring to FIGS. 24A-24E, the alternative configuration of the third exemplary structure may be derived from the third exemplary structure illustrated in FIGS. 22A-22C by forming a first pair of contact via structures (74, 76) in lieu of a first contact via structure 741, and by forming a second pair of contact via structures (74, 76) in lieu of a second contact via structure 742. Each first contact via structure 74 contacts a first end portion of a first semiconductor channel 250 of a first memory transistor 221 or a first end portion of a first semiconductor channel 250 of a second memory transistor 222. The two first contact via structures 74 in each unit cell US are laterally spaced apart from each other along the first horizontal direction hd1. The third contact via structures 72 may be interlaced with the first contact via structures 74 along the first horizontal direction hd1.

Each second contact via structure 76 contacts a first end portion of a first semiconductor channel 350 of a first non-hysteretic transistor 321 or a first end portion of a second semiconductor channel 350 of a second non-hysteretic transistor 322. The two second contact via structures 76 in each unit cell US are laterally spaced apart from each other along the second horizontal direction hd2. The fourth contact via structures 78 may be interlaced with the second contact via structures 76.

A first subset of processing steps described with reference to FIGS. 7A-7D may be performed to form an upper via-level dielectric layer 80. Via cavities may be formed through the upper via-level dielectric layer 80 over the contact via structures (74, 76, 72, 78), and may be filled with at least one conductive material to form first connection via structures 82, second connection via structures 88, and additional connection via structures that include third connection via structures 84 and fourth connection via structures 86. Each first connection via structure 82 may contact a top surface of a respective third contact via structure 72, and each second connection via structure 88 may contact a stop surface of a respective fourth contact via structure 78. Each third connection via structure 84 may contact a top surface of a respective first contact via structure 74, and each fourth connection via structure 86 may contact a top surface of a respective second contact via structure 76.

Figures 25D, 25E:
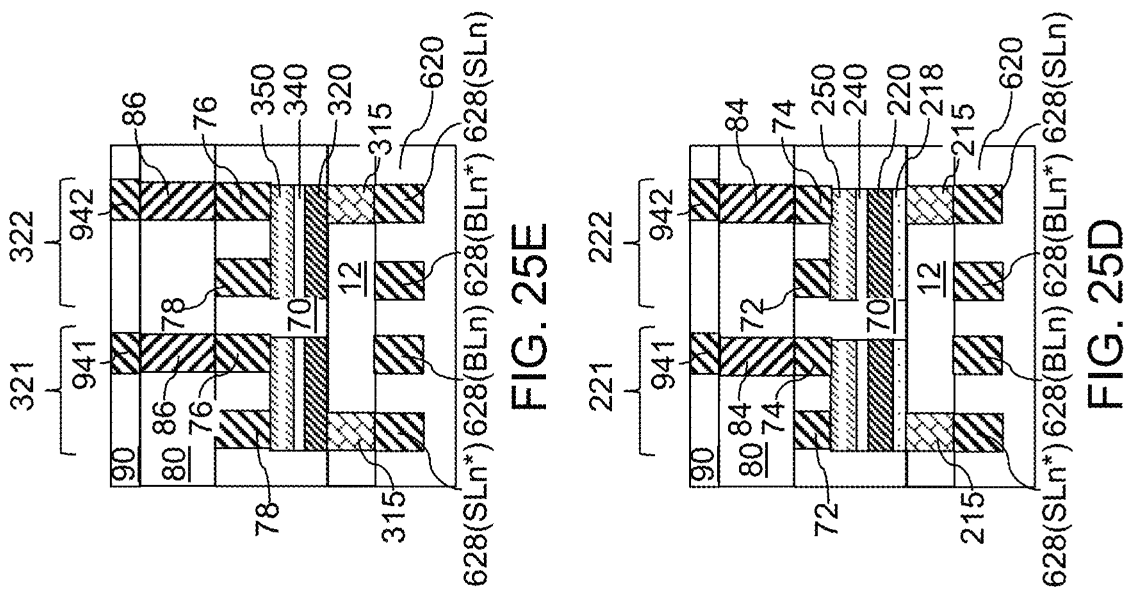

FIGS. 25A-25E are views of a region of the alternative configuration of the third exemplary structure after formation of a line-level dielectric layer, word line WLms, and match line MLms according to the third embodiment of the present disclosure. FIG. 25A is a first vertical cross-sectional view. FIG. 25B is a top-down view. FIG. 25C is a second vertical cross-sectional view. FIG. 25D is a third vertical cross-sectional view. FIG. 25E is a fourth vertical cross-sectional view. The vertical plane A-A' in FIG. 25B is a cut plane for the vertical cross-sectional view of FIG. 25A. The vertical plane C-C' in FIG. 25B is a cut plane for the vertical cross-sectional view of FIG. 25C. The vertical plane D-D' in FIG. 25B is a cut plane for the vertical cross-sectional view of FIG. 25D. The vertical plane E-E' in FIG. 25B is a cut plane for the vertical cross-sectional view of FIG. 25E.

Referring to FIGS. 1, 8, and 25A-25E, a second subset of processing steps described with reference to FIGS. 7A-7D may be performed to form a line-level dielectric layer 90 over the upper via-level dielectric layer 80. Line cavities may be formed through the line-level dielectric layer 90 so that top surfaces of the connection via structures (82, 88, 84, 86) are physically exposed. Word lines 92 and match lines 98 may be formed in the line cavities. The word lines 92 may contact top surfaces of the first connection via structures 82, and the match lines 98 may contact top surfaces of the second connection via structures 88.

A first metal line structure 941 may contact a top surface of a third connection via structure 84 that contacts a third contact via structure 74 of the first memory transistor 221 and may contact a top surface of a fourth connection via structure 86 that contacts a fourth contact via structure 76 of the first non-hysteretic transistor 321. The first metal line structure 941 functions as a portion of a first electrically conductive path electrically connecting the first memory transistor 221 and the first non-hysteretic transistor 321. A second metal line structure 942, functioning as a second electrically conductive path, may contact a top surface of a third connection via structure 84 that contacts a third contact via structure 74 of the second memory transistor 222 and may contact a top surface of a fourth connection via structure 86 that contacts a fourth contact via structure 76 of the second non-hysteretic transistor 322. The second metal line structure 942 functions as a portion of a second electrically conductive path electrically connecting the second memory transistor 222 and the second non-hysteretic transistor 322.

Generally, match lines 98 and word lines 92 may be formed such that the first series connection 941 and the second series connection 942 may be connected in parallel between a match line 98 and a word line 92 within each unit cell UC. A four transistor ternary content-addressable memory cell C_mn may be formed within each unit cell. FIGS. 25A-25E illustrate a portion of a unit cell that is electrically connected to an (m−1)-th match line ML(m−1), a unit cell UC that is electrically connected to an m-th word line WLm and an m-th match line MLm, and a portion of a unit cell that is electrically connected to an (m+1)-th word line WL(m+1). In one embodiment, each match line 98 and each word line 92 may laterally extend along the first horizontal direction hd1, and may be laterally spaced apart along the second horizontal direction hd2. In one embodiment, the match lines 98, the word lines 92, the first metal line structures 941, and the second metal line structures 942 may comprise third metal line structures, and the line-level dielectric layer 90 may function as a component of a third interconnect-level dielectric material layer.

Generally, a four transistor ternary content-addressable memory cell C_mn may be formed by forming a match line MLm and a word line WLm and by connecting the first series connection and the second series connection in parallel between the match line MLm and the word line WLm. In one embodiment, a primary bit line BLn may be connected to a gate electrode (comprising a first gate electrode plate 220) of the first memory transistor 221; and a complementary bit line BLn* may be connected to a gate electrode (comprising another first gate electrode plate 220) of the second memory transistor 222 and configured to be biased at a complementary voltage of a voltage at the primary bit line BLn. In one embodiment, a primary search line SLn may be connected to a gate electrode of the second non-hysteretic transistor 322; and a complementary search line SLn* may be connected to a gate electrode of the first non-hysteretic transistor 321.

FIGS. 26A-29F illustrate a manufacturing sequence for forming a fourth exemplary structure, which may be derived from the third exemplary structure illustrated in FIGS. 20A-20C. While the fourth exemplary structure is illustrated for an embodiment in which the memory transistors (221, 222) are formed as flash memory transistors, embodiments are expressly contemplated herein in which the memory transistors (221, 222) are formed as ferroelectric memory transistors described with reference to FIGS. 7A-7D.

Figure 26B:
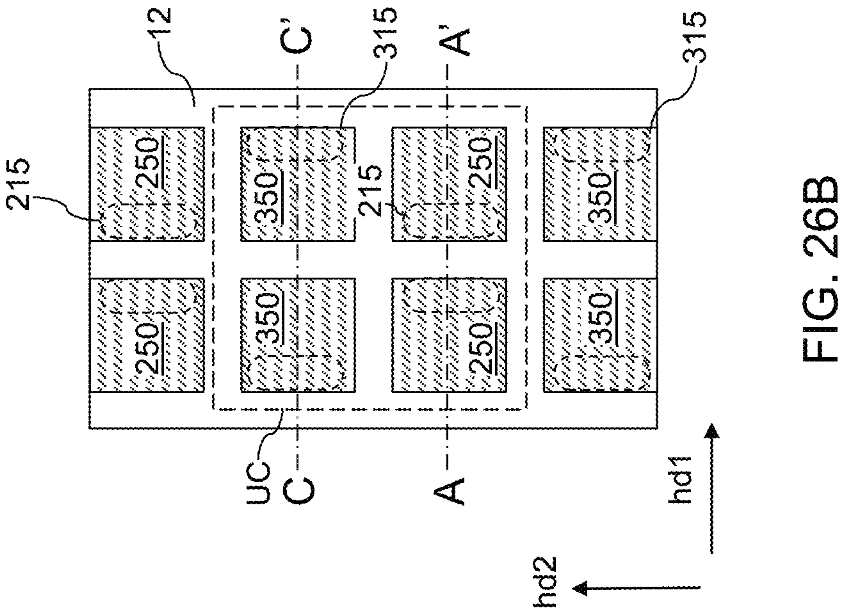
FIGS. 26A-26C are views of a region of a fourth exemplary structure after formation of patterned layer stacks according to a fourth embodiment of the present disclosure.
Figure 26C:
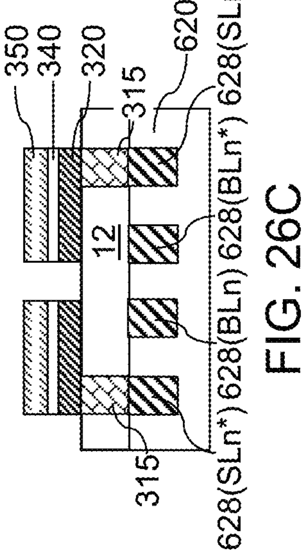
Figure 26A:
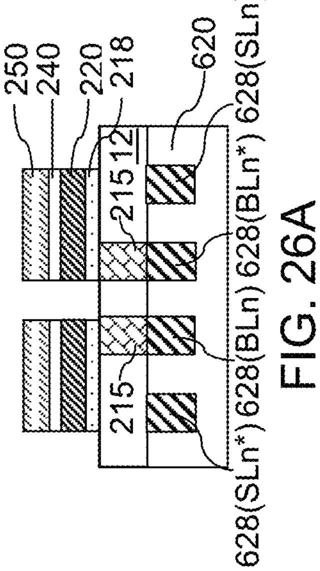

FIGS. 26A-26C are views of a region of a fourth exemplary structure after formation of patterned layer stacks according to a fourth embodiment of the present disclosure. FIG. 26A is a first vertical cross-sectional view. FIG. 26B is a top-down view. FIG. 26C is a second vertical cross-sectional view. The vertical plane A-A' in FIG. 26B is a cut plane for the vertical cross-sectional view of FIG. 26A. The vertical plane C-C' in FIG. 26B is a cut plane for the vertical cross-sectional view of FIG. 26C.

Referring to FIGS. 26A-26C, the fourth exemplary structure according to the fourth embodiment of the present disclosure may be the same as the third exemplary structure illustrated in FIGS. 20A-20C.

FIGS. 27A-27F are views of a region of the fourth exemplary structure after formation of a contact-level dielectric layer and contact via structures according to the fourth embodiment of the present disclosure. FIG. 27A is a first vertical cross-sectional view. FIG. 27B is a top-down view. FIG. 27C is a second vertical cross-sectional view. FIG. 27D is a third vertical cross-sectional view. FIG. 27E is a fourth vertical cross-sectional view. FIG. 27F is a fifth vertical cross-sectional view. The vertical plane A-A' in FIG. 27B is a cut plane for the vertical cross-sectional view of FIG. 27A. The vertical plane C-C' in FIG. 27B is a cut plane for the vertical cross-sectional view of FIG. 27C. The vertical plane D-D' in FIG. 27B is a cut plane for the vertical cross-sectional view of FIG. 27D. The vertical plane E-E' in FIG. 27B is a cut plane for the vertical cross-sectional view of FIG. 27E. The vertical plane F-F' in FIG. 27B is a cut plane for the vertical cross-sectional view of FIG. 27F.

Referring collectively to FIGS. 1, 8, and 27A-27F, processing steps described with reference to FIGS. 5A-5D may be performed to form a contact-level dielectric layer 70 and to form various contact via structures (741, 742, 72, 78). The various contact via structures (741, 742, 72, 78) function as source/drain structures for the various transistors (221, 222, 321, 322). Each of the transistors (221, 222, 321, 322) may be thin film transistors. Generally, a first memory transistor 221, a second memory transistor 222, a first non-hysteretic transistor 321, and a second non-hysteretic transistor 322 may be formed. The first memory transistor 221 comprises a first memory element (such as a floating gate electrode or a ferroelectric gate dielectric 230) configured to store a first binary bit, and the second memory transistor 222 comprises a second memory element (such as a floating gate electrode or a ferroelectric gate dielectric 230) configured to store a second binary bit.

A first series connection of the first memory transistor 221 and the first non-hysteretic transistor 321 may be formed by the first contact via structure 741. A second series connection of the second memory transistor 222 and the second non-hysteretic transistor 322 may be formed by the second contact via structure 742. The first contact via structure 741 may be formed directly on the first memory transistor 221 and the first non-hysteretic transistor 321 to provide the first series connection; and the second contact via structure 742 may be formed directly on the second memory transistor 222 and the second non-hysteretic transistor 322 to provide the second series connection.

In the fourth exemplary structure, the first memory transistor 221 and the first non-hysteretic transistor 321 are neighboring transistors that are laterally spaced apart along the second horizontal direction hd2 within a unit cell UC, and the first contact via structure 741 functions as a first source/drain structure of the first memory transistor 221 and as a first source/drain structure of the first non-hysteretic transistor 321. The first contact via structure 741 also functions as an electrically conductive path connecting the first source/drain structure of the first memory transistor 221 and the first source/drain structure of the first non-hysteretic transistor 321 along the second horizontal direction hd2.

Further, the second memory transistor 222 and the second non-hysteretic transistor 322 are neighboring transistors that are laterally spaced apart along the second horizontal direction hd2 within the unit cell UC, and the second contact via structure 742 functions as a first source/drain structure of the second memory transistor 222 and as a first source/drain structure of the second non-hysteretic transistor 322. The second contact via structure 742 also functions as an electrically conductive path connecting the first source/drain structure of the second memory transistor 222 and the first source/drain structure of the second non-hysteretic transistor 322 along the second horizontal direction hd2.

In one embodiment, the first memory transistor 221 comprises a first semiconductor channel 250; the first non-hysteretic transistor 321 comprises a second semiconductor channel 350; and the first semiconductor channel 250 and the second semiconductor channel 350 have a same material composition and a same thickness. In one embodiment, the first memory transistor 221 comprises a floating gate electrode (comprising a first gate electrode plate 220); the first non-hysteretic transistor 321 comprises a non-floating gate electrode (comprising a second gate electrode plate 320); and the floating gate electrode (comprising a first gate electrode plate 220) and the non-floating gate electrode (comprising a second gate electrode plate 320) have a same material composition and a same thickness.

In one embodiment, the floating gate electrode (comprising a first gate electrode plate 220) is vertically spaced from a top surface of a dielectric material layer (such as the lower via-level dielectric layer 12) by a backside gate dielectric 218 that contacts a first segment of the top surface of the dielectric material layer; and the non-floating gate electrode (comprising a second gate electrode plate 320) is in contact with a second segment of the top surface of the dielectric material layer. In one embodiment, sidewalls of the floating gate electrode (comprising a first gate electrode plate 220) are vertically coincident with sidewalls of the backside gate dielectric 218.

In one embodiment, the first memory transistor 221 comprises a front gate dielectric 240 that contacts a first semiconductor channel 250 of the first memory transistor 221; the first non-hysteretic transistor 321 comprises a non-hysteretic gate dielectric 340 that contacts a second semiconductor channel 350 of the first non-hysteretic transistor 321; and the front gate dielectric 240 and the non-hysteretic gate dielectric 340 have a same material composition and a same thickness. In one embodiment, one of the front gate dielectric 240 and the backside gate dielectric 218 comprises a tunneling dielectric layer that provides charge tunneling therethrough; and another of the front gate dielectric 240 and the backside gate dielectric 218 comprises a blocking dielectric layer that suppresses charge tunneling therethrough.

FIGS. 28A-28F are views of a region of the fourth exemplary structure after formation of a via-level dielectric layer, connection via structures, a line-level dielectric layer, word line WLms, and match line MLms according to the fourth embodiment of the present disclosure. FIG. 28A is a first vertical cross-sectional view. FIG. 28B is a top-down view. FIG. 28C is a second vertical cross-sectional view. FIG. 28D is a third vertical cross-sectional view. FIG. 28E is a fourth vertical cross-sectional view. FIG. 28F is a fifth vertical cross-sectional view. The vertical plane A-A' in FIG. 28B is a cut plane for the vertical cross-sectional view of FIG. 28A. The vertical plane C-C' in FIG. 28B is a cut plane for the vertical cross-sectional view of FIG. 28C. The vertical plane D-D' in FIG. 28B is a cut plane for the vertical cross-sectional view of FIG. 28D. The vertical plane E-E' in FIG. 28B is a cut plane for the vertical cross-sectional view of FIG. 28E. The vertical plane F-F' in FIG. 28B is a cut plane for the vertical cross-sectional view of FIG. 28F.

Referring collectively to FIGS. 1, 8, and 28A-28F, processing steps described with reference to FIGS. 7A-7D may be performed to form an upper via-level dielectric layer 80. Via cavities may be formed through the upper via-level dielectric layer 80 over the third contact via structures 72 and the fourth contact via structures 78, and may be filled with at least one conductive material to form first connection via structures 82 and second connection via structures 88. Each first connection via structure 82 may contact a top surface of a respective third contact via structure 72, and each second connection via structure 88 may contact a stop surface of a respective fourth contact via structure 78.

A line-level dielectric layer 90 may be formed over the upper via-level dielectric layer 80. Line cavities may be formed through the line-level dielectric layer 90 so that top surfaces of the connection via structures (82, 88) are physically exposed. Word lines 92 and match lines 98 may be formed in the line cavities. The word lines 92 may contact top surfaces of the first connection via structures 82, and the match lines 98 may contact top surfaces of the second connection via structures 88. Generally, match lines 98 and word lines 92 may be formed such that the first series connection and the second series connection may be connected in parallel between a match line 98 and a word line 92 within each unit cell UC. A four transistor ternary content-addressable memory cell C_mn may be formed within each unit cell. FIGS. 28A-28F illustrate a portion of a unit cell that is electrically connected to an (m−1)-th match line ML(m−1), a unit cell UC that is electrically connected to an m-th word line WLm and an m-th match line MLm, and a portion of a unit cell that is electrically connected to an (m+1)-th word line WL(m+1). In one embodiment, each match line 98 and each word line 92 may laterally extend along the first horizontal direction hd1, and may be laterally spaced apart along the second horizontal direction hd2. In one embodiment, the match lines 98 and the word lines 92 may comprise third metal line structures, and the line-level dielectric layer 90 may function as a component of a third interconnect-level dielectric material layer.

Generally, a four transistor ternary content-addressable memory cell C_mn may be formed by forming a match line MLm and a word line WLm and by connecting the first series connection and the second series connection in parallel between the match line MLm and the word line WLm. In one embodiment, a primary bit line BLn may be connected to a gate electrode (comprises a first gate electrode plate 220) of the first memory transistor 221; and a complementary bit line BLn* may be connected to a gate electrode (comprises another first gate electrode plate 220) of the second memory transistor 222 and configured to be biased at a complementary voltage of a voltage at the primary bit line BLn. In one embodiment, a primary search line SLn may be connected to a gate electrode of the second non-hysteretic transistor 322; and a complementary search line SLn* may be connected to a gate electrode of the first non-hysteretic transistor 321.

FIGS. 29A-29F are views of a region of an alternative embodiment of the fourth exemplary structure after formation of a via-level dielectric layer, connection via structures, a line-level dielectric layer, word line WLms, and match line MLms according to the fourth embodiment of the present disclosure. FIG. 29A is a first vertical cross-sectional view. FIG. 29B is a top-down view. FIG. 29C is a second vertical cross-sectional view. FIG. 29D is a third vertical cross-sectional view. FIG. 29E is a fourth vertical cross-sectional view. FIG. 29F is a fifth vertical cross-sectional view. The vertical plane A-A' in FIG. 29B is a cut plane for the vertical cross-sectional view of FIG. 29A. The vertical plane C-C' in FIG. 29B is a cut plane for the vertical cross-sectional view of FIG. 29C. The vertical plane D-D' in FIG. 29B is a cut plane for the vertical cross-sectional view of FIG. 29D. The vertical plane E-E' in FIG. 29B is a cut plane for the vertical cross-sectional view of FIG. 29E. The vertical plane F-F' in FIG. 29B is a cut plane for the vertical cross-sectional view of FIG. 29F.

Referring collectively to FIGS. 1, 8, and 29A-29F, the alternative configuration of the fourth exemplary structure may be derived from the fourth exemplary structure illustrated in FIGS. 27A-27F by using the electrical wiring schemes described with reference to FIGS. 24A-24E and 25A-25E. Specifically, within each unit cell UC, a first pair of contact via structures (74, 76) may be formed in lieu of a first contact via structure 741, and a second pair of via structures (74, 76) may be formed in lieu of a second contact via structure 742. Each first contact via structure 74 contacts a first end portion of a first semiconductor channel 250 of a first memory transistor 221 or of a second memory transistor 222. The two first contact via structures 74 in each unit cell US are laterally spaced apart from each other along the first horizontal direction hd1. The third contact via structures 72 may be interlaced with the first contact via structures 74 along the first horizontal direction hd1.

Each second contact via structure 76 contacts a a first end portion of a second semiconductor channel 350 of a first non-hysteretic transistor 321 or of a second non-hysteretic transistor 322. The two second contact via structures 76 in each unit cell US are laterally spaced apart from each other along the first horizontal direction hd1. The fourth contact via structures 78 may be interlaced with the second contact via structures 76.

An upper via-level dielectric layer 80 may be formed over the contact-level dielectric layer 70. First connection via structures 82, second connection via structures 88, and additional connection via structures that include third connection via structures 84 and fourth connection via structures 86 are formed through the upper via-level dielectric layer 80. Each first connection via structure 82 may contact a top surface of a respective third contact via structure 72, and each second connection via structure 88 may contact a stop surface of a respective fourth contact via structure 78. Each third connection via structure 84 may contact a top surface of a respective first contact via structure 74, and each fourth connection via structure 86 may contact a top surface of a respective second contact via structure 76.

A line-level dielectric layer 90 may be formed over the upper via-level dielectric layer 80. Line cavities may be formed through the line-level dielectric layer 90 so that top surfaces of the connection via structures (82, 88, 84, 86) are physically exposed. Word lines 92 and match lines 98 may be formed in the line cavities. The word lines 92 may contact top surfaces of the first connection via structures 82, and the match lines 98 may contact top surfaces of the second connection via structures 88.

A first metal line structure 941 may contact a top surface of a third connection via structure 84 that contacts a third contact via structure 74 of the first memory transistor 221 and may contact a top surface of a fourth connection via structure 86 that contacts a fourth contact via structure 76 of the first non-hysteretic transistor 321. The first metal line structure 941 functions as a portion of a first electrically conductive path electrically connecting the first memory transistor 221 and the first non-hysteretic transistor 321. A second metal line structure 942, functioning as a second electrically conductive path, may contact a top surface of a third connection via structure 84 that contacts a third contact via structure 74 of the second memory transistor 222 and may contact a top surface of a fourth connection via structure 86 that contacts a fourth contact via structure 76 of the second non-hysteretic transistor 322. The second metal line structure 942 functions as a portion of a second electrically conductive path electrically connecting the second memory transistor 222 and the second non-hysteretic transistor 322.

Generally, match lines 98 and word lines 92 may be formed such that the first series connection and the second series connection may be connected in parallel between a match line 98 and a word line 92 within each unit cell UC. A four transistor ternary content-addressable memory cell C_mn may be formed within each unit cell. FIGS. 25A-25E illustrate a portion of a unit cell that is electrically connected to an (m−1)-th match line ML(m−1), a unit cell UC that is electrically connected to an m-th word line WLm and an m-th match line MLm, and a portion of a unit cell that is electrically connected to an (m+1)-th word line WL(m+1). In one embodiment, each match line 98 and each word line 92 may laterally extend along the first horizontal direction hd1, and may be laterally spaced apart along the second horizontal direction hd2. In one embodiment, the match lines 98, the word lines 92, the first metal line structures 941, and the second metal line structures 942 may comprise third metal line structures, and the line-level dielectric layer 90 may function as a component of a third interconnect-level dielectric material layer.

Generally, a four transistor ternary content-addressable memory cell C_mn may be formed by forming a match line MLm and a word line WLm and by connecting the first series connection and the second series connection in parallel between the match line MLm and the word line WLm. In one embodiment, a primary bit line BLn may be connected to a gate electrode (comprising a first gate electrode plate 220) of the first memory transistor 221; and a complementary bit line BLn* may be connected to a gate electrode (comprising another first gate electrode plate 220) of the second memory transistor 222. In one embodiment, a primary search line SLn may be connected to a gate electrode of the second non-hysteretic transistor 322; and a complementary search line SLn* may be connected to a gate electrode of the first non-hysteretic transistor 321.

Figure 30:
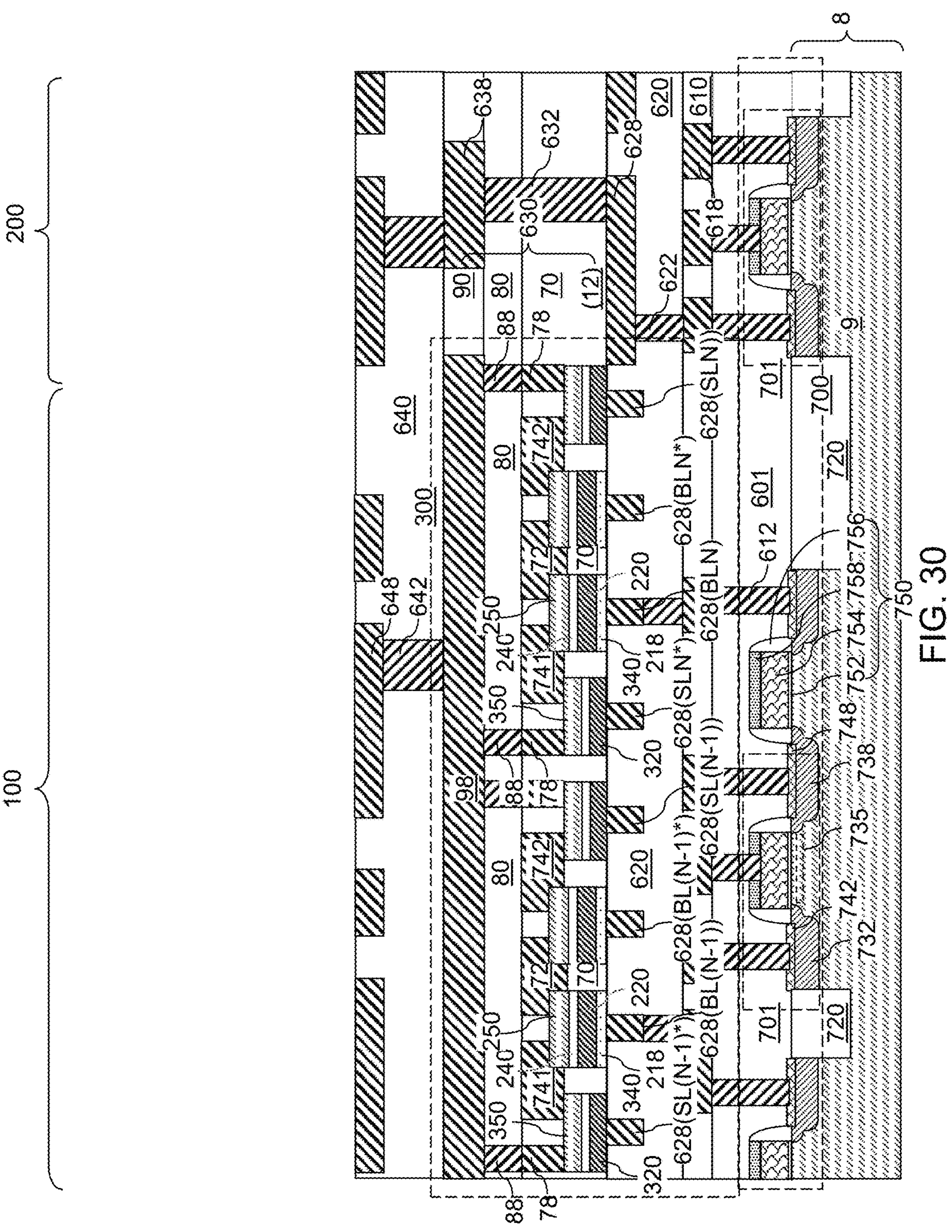
FIG. 30 is a vertical cross-sectional view of an exemplary structure after formation of at least one upper-level dielectric layer and upper-level metal interconnect structures according to an embodiment of the present disclosure.

Referring to FIG. 30, an exemplary structure is illustrated after formation of at least one upper-level dielectric layer and upper-level metal interconnect structures according to an embodiment of the present disclosure. The exemplary structure illustrated in FIG. 30 may be derived from any of the first, second, third, and fourth exemplary structures and alternative embodiments thereof. Specifically, an M×N array 300 (of which only a portion is illustrated) of four transistor ternary content-addressable memory cells is formed as a structure formed within the level of a third interconnect-level dielectric material layer 630, which includes an optional lower via-level dielectric layer 12, a contact-level dielectric layer 70 (which is also referred to as a memory-level dielectric layer), an upper via-level dielectric layer 80, and a line-level dielectric layer 90. Second metal via structures 632 and third metal line structures 638 may be formed in the third interconnect-level dielectric material layer 630. The word lines 92 and the match lines 98 may comprise a subset of the third metal line structures 638.

The at least one upper-level dielectric layer may comprise, for example, a fourth interconnect-level dielectric material layer 640. The upper-level metal interconnect structures may comprise, for example, third metal via structures 642 and fourth metal line structures 648.

While the present disclosure is described using an embodiment in which the search lines SLn, SLn*, and the bit lines BLn, BLn* ($1<n<N$) are formed as a subset of the second metal line structures 628, and in which the word lines WLm, WLm*, and the match lines MLm, MLm*($1<m<M$) are formed as a subset of the third metal line structures 638, embodiments are expressly contemplated herein in which the M×N array 300 of four transistor ternary content-addressable memory cells is level-shifted either upward or downward, and is formed at a different metal interconnect level. Further, where FIG. 30 shows a case of a single array 300, multiple arrays 300 can be stacked over each other.

In one embodiment, the substrate 8 may be a semiconductor substrate comprising a single-crystalline semiconductor material within the semiconductor material layer 9, and a field effect transistor 701 may be formed on the semiconductor material layer 9. The field effect transistor 701 may include a semiconductor channel containing a portion of the single-crystalline semiconductor material (as in the embodiment of a planar field effect transistor of a fin field effect transistor), or comprising a same material as the single-crystalline semiconductor material (as in the embodiment of a gate-all-around field effect transistor). A dielectric material layer (such as a lower via-level dielectric layer 12 and/or a second interconnect-level dielectric material layer 620) may overlie the field effect transistor 701. The four transistor ternary content-addressable memory cells C_mn may be formed above the dielectric material layer.

FIG. 31 is a table illustrating programming conditions and search conditions that may be used during operation of a four-transistor ternary content-addressable memory cell C_mn of the present disclosure. As discussed above, three states are used for a ternary-bit operation of each four transistor ternary content-addressable memory cell C_mn. Operation of the four transistor ternary content-addressable memory cell C_mn may be performed in the same manner as other transistor ternary content-addressable memory cells known in the art. However, the four transistor ternary content-addressable memory cell C_mn uses only four transistors. Compared to the requirement of ten or more transistors in previously known ternary content-addressable memory cells, the four transistor ternary content-addressable memory cell C_mn of the present disclosure require a fewer number of transistors, and thus, occupies a much smaller area and provides a higher device density.

Referring to FIG. 1 and FIG. 31, a first memory transistor 221 of memory cell_mn may be programmed in a low-resistance "1" state by applying an appropriate voltage, for instance a large positive voltage, between BLn and WLm. Alternatively, a first memory transistor 221 of memory cell_mn may be programmed in a high-resistance "0" state by applying an appropriate voltage, for instance a large negative voltage, between BLn and WLm. A second memory transistor 222 of memory cell_mn may be programmed in a low-resistance "1" state by applying an appropriate voltage, for instance a large positive voltage, between BLn* and WLm. Alternatively, a second memory transistor 222 of memory cell_mn may be programmed in a high-resistance "0" state by applying an appropriate voltage, for instance a large negative voltage, between BLn* and WLm. The cell may therefore be programmed in four states represented by the respective states of a first memory transistor 221 and a second memory transistor 222. In application as a ternary content addressable memory cell, the state where both memory transistor 221 and 222 are programmed as "0" may be called "X", or "don't care". The state where both memory transistor 221 and 222 are programmed as "1" may not be utilized (i.e. the cell may never be programmed in that state).

During search operation, a match line MLm may be precharged. A search pattern may be applied to SLn and SLn* (SLn=SNn*="0"; SLn="0"; SLn*="1"; SNn="1"; SLn*="0"; the fourth search pattern SLn=SLn*="1" may again not be used). The match line MLm may discharge if the search pattern does not match the programmed pattern. The match line may not discharge if the search pattern matches the programmed pattern, or if any of the programmed or search pattern is in "X" or "don't" care state. In an N×M array, match line MLm may be discharged by any of the cells on row n (1<n<N). A discharge of match line MLm may be detected by a sense amplifier.

Figure 32:
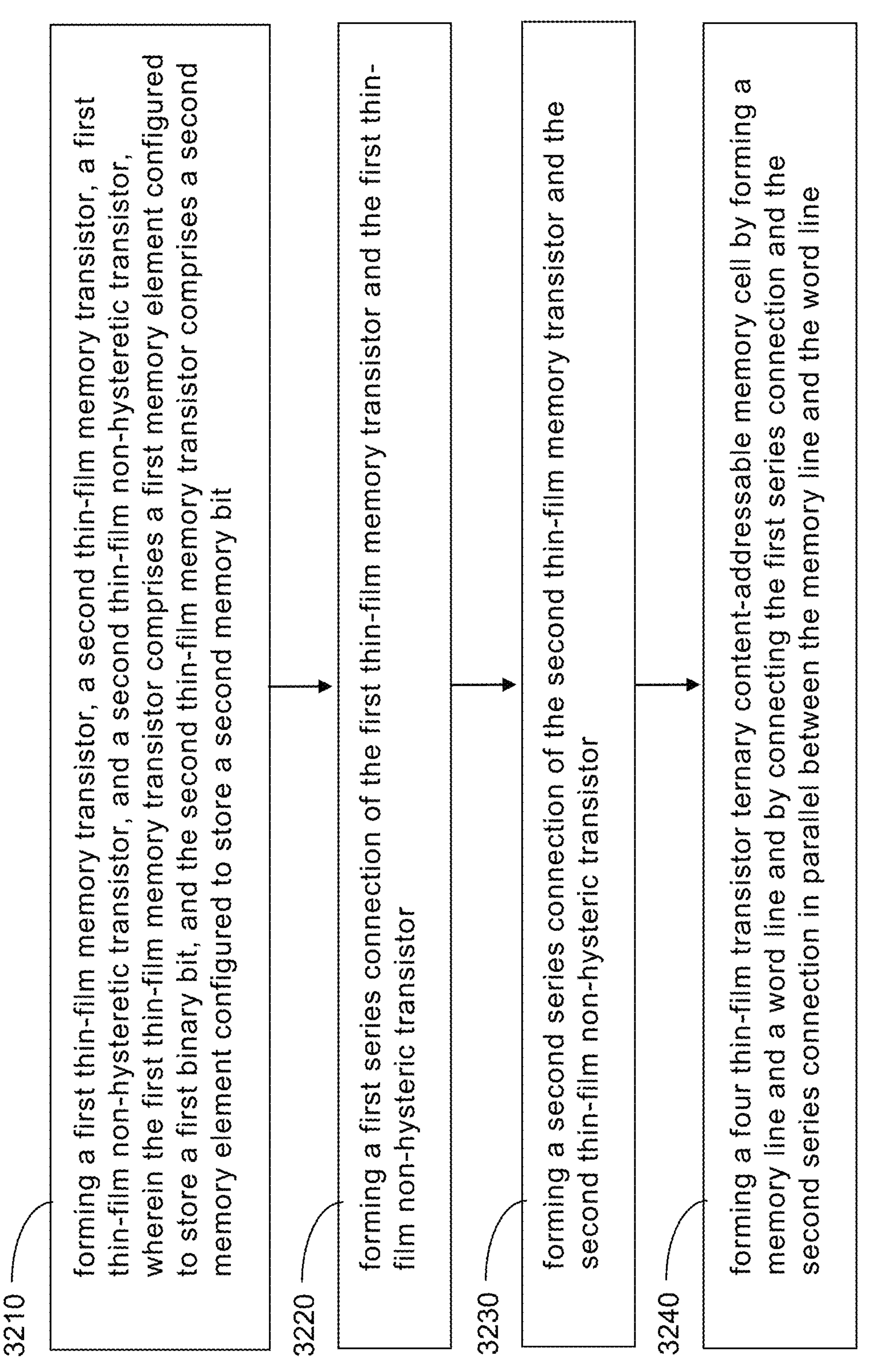
FIG. 32 is a flow chart illustrating a set of processing steps that may be used to form a device structure according to an embodiment of the present disclosure.

FIG. 32 is a flow chart illustrating a set of processing steps that may be used to form a device structure according to an embodiment of the present disclosure.

Referring to step 3210 and FIGS. 1-5D, 7A-7D, 8, 9A-13B, 16A-21C, 24A-24E, 26A-27F, 29A-29F, and 30, a first memory transistor 221, a second memory transistor 222, a first non-hysteretic transistor 321, and a second non-hysteretic transistor 322 may be formed. In some embodiments, each of the first memory transistor 221, the second memory transistor 222, the first non-hysteretic transistor 321 and the second non-hysteretic transistor 322 may be a thin-film transistor. The first memory transistor 221 comprises a first memory element (such as a floating gate electrode or a ferroelectric gate dielectric 230) configured to store a first binary bit, and the second memory transistor 222 comprises a second memory element (such as a floating gate electrode or a ferroelectric gate dielectric 230) configured to store a second binary bit.

Referring to step 3220 and FIGS. 5A-5D, 7A-7D, 13A and 13B, 16A-16C, 21A-21C, 24A-25E, 27A-27F, 29A-29F, and 30, a first series connection of the first memory transistor 221 and the first non-hysteretic transistor 321 may be formed.

Referring to step 3230 and FIGS. 5A-5D, 7A-7D, 13A and 13B, 16A-16C, 21A-21C, 24A-25E, 27A-27F, 29A-29F, and 30, a second series connection of the second memory transistor 222 and the second non-hysteretic transistor 322 may be formed.

Referring to step 3240 and FIGS. 6A-6D, 7A-7D, 14A-16C, 22A-25E, 28A-29F, and 30, a four transistor ternary content-addressable memory cell C_mn may be formed by forming a match line MLm and a word line WLm and by connecting the first series connection and the second series connection in parallel between the match line MLm and the word line WLm.

Referring to all drawings and according to various embodiments of the present disclosure, a device structure comprising a four transistor ternary content-addressable memory cell C_mn, is provided. The four transistor ternary content-addressable memory cell C_mn comprises: a first series connection of a first non-hysteretic transistor 321 and a first memory transistor 221 comprising a first memory element (such as a floating gate electrode or a ferroelectric gate dielectric 230) configured to store a first binary bit; and a second series connection of a second non-hysteretic transistor 322 and a second memory transistor 222 comprising a second memory element (which may be a floating gate electrode comprising a first gate electrode 220, or a ferroelectric gate dielectric 230) configured to store a second binary bit, wherein the first series connection and the second series connection are connected in parallel between a match line MLm and a word line WLm.

In one embodiment, the first memory transistor 221 comprises a first semiconductor channel 250; the first non-hysteretic transistor 321 comprises a second semiconductor channel 350; and the first semiconductor channel 250 and the second semiconductor channel 350 have a same material composition and a same thickness. In one embodiment, the first memory transistor 221 comprises a floating gate electrode (comprising a first gate electrode plate 220); the first non-hysteretic transistor 321 comprises a non-floating gate electrode (comprising a second gate electrode plate 320); and the floating gate electrode (comprising a first gate electrode plate 220) and the non-floating gate electrode (comprising a second gate electrode plate 320) have a same material composition and a same thickness.

In one embodiment, the floating gate electrode (comprising a first gate electrode plate 220) is vertically spaced from a top surface of a dielectric material layer (such as a lower via-level dielectric layer 12 and/or a second interconnect-level dielectric material layer 620) by a backside gate dielectric 218 that contacts a first segment of the top surface of the dielectric material layer; and the non-floating gate electrode (comprising a second gate electrode plate 320) is in contact with a second segment of the top surface of the dielectric material layer.

In one embodiment, sidewalls of the floating gate electrode (comprising a first gate electrode plate 220) are vertically coincident with sidewalls of the backside gate dielectric 218. In one embodiment, the first memory transistor 221 comprises a front gate dielectric 240 that contacts a first semiconductor channel 250 of the first memory transistor 221; the first non-hysteretic transistor 321 comprises a non-hysteretic gate dielectric 340 that contacts a second semiconductor channel 350 of the first non-hysteretic transistor 321; and the front gate dielectric 240 and the non-hysteretic gate dielectric 340 have a same material composition and a same thickness.

In one embodiment, one of the front gate dielectric 240 and the backside gate dielectric 218 comprises a tunneling dielectric layer that provides charge tunneling therethrough; and another of the front gate dielectric 240 and the backside gate dielectric 218 comprises a blocking dielectric layer that suppresses charge tunneling therethrough.

In one embodiment, the first memory transistor 221 comprises a ferroelectric gate dielectric 230, a first semiconductor channel 250, and a first gate electrode (comprising a first gate electrode plate 220); and the first non-hysteretic transistor 321 comprises a non-hysteretic gate dielectric 340, a second semiconductor channel 350, and a second gate electrode (comprising a second gate electrode plate 320).

In one embodiment, the device structure further comprises a primary bit line BLn connected to a gate electrode (comprising a first gate electrode plate 220) of the first memory transistor 221; and a complementary bit line BLn* connected to a gate electrode (comprising another first gate electrode plate 220) of the second memory transistor 222. In one embodiment, the device structure comprises a primary search line SLn connected to a gate electrode of the second non-hysteretic transistor 322; and a complementary search line SLn* connected to a gate electrode of the first non-hysteretic transistor 321.

In one embodiment, the device structure comprises: a semiconductor substrate comprising a single-crystalline semiconductor material; a field effect transistor 701 that includes a semiconductor channel containing a portion of the single-crystalline semiconductor material or comprising a same material as the single-crystalline semiconductor material; and a dielectric material layer (such as a lower via-level dielectric layer 12 and/or a second interconnect-level dielectric material layer 620) overlying the field effect transistor 701, wherein the four transistor ternary content-addressable memory cell C_mn is located above the dielectric material layer.

According to another aspect of the present disclosure, a device structure is provided, which comprises: a first dielectric material layer (such as a lower via-level dielectric layer 12 and/or a second interconnect-level dielectric material layer 620) overlying a substrate 8; a first series connection of a first non-hysteretic transistor 321 and a first memory transistor 221 comprising a first memory element (such as a floating gate electrode or a ferroelectric gate dielectric 230) configured to store a first binary bit, the first series connection overlying the dielectric material layer; a second series connection of a second non-hysteretic transistor 322 and a second memory transistor 222 comprising a second memory element (such as a floating gate electrode or a ferroelectric gate dielectric 230) configured to store a second binary bit, wherein the first non-hysteretic transistor 321, the first memory transistor 221, the second non-hysteretic transistor 322, and the second memory transistor 222 are formed within a second dielectric material layer (such as a contact-level dielectric layer 70); and a match line MLm and a word line WLm may be formed within in a third dielectric material layer (such as a line-level dielectric layer 90), wherein the first series connection and the second series connection are connected in parallel between the match line MLm and the word line WLm.

In one embodiment, the first memory transistor 221 comprises a first gate electrode (comprising a first gate electrode plate 220), a first gate dielectric (such as a front gate dielectric 240 or a ferroelectric gate dielectric 230), and a first semiconductor channel 250; and sidewalls of the first gate electrode (comprising a first gate electrode plate 220), the first gate dielectric (such as the front gate dielectric 240 or the ferroelectric gate dielectric 230), and the first semiconductor channel 250 are vertically coincident to one another.

In one embodiment, the first non-hysteretic transistor 321 comprises a second gate electrode (comprising a second gate electrode plate 320), a second gate dielectric (such as a non-hysteretic gate dielectric 340), and a second semiconductor channel 350; the first semiconductor channel 250 and the second semiconductor channel 350 have a same semiconductor material composition and a same semiconductor material thickness; and the first gate electrode (comprising a first gate electrode plate 220) and the second gate electrode (comprising a second gate electrode plate 320) have a same conductive material composition and a same conductive material thickness.

In one embodiment, the device structure comprises: a first contact via structure 741 formed within the second dielectric material layer (such as a contact-level dielectric layer 70) and contacting each of the first non-hysteretic transistor 321 and the first memory transistor 221; and a second contact via structure 742 formed within the second dielectric material layer (such as the contact-level dielectric layer 70) and contacting each of the second non-hysteretic transistor 322 and the second memory transistor 222.

The various embodiments of the present disclosure may be used to provide a memory array 300 of four transistor ternary content-addressable memory cells C_mn that are addressable by search lines, bit lines, word lines, and match lines. Each four transistor ternary content-addressable memory cell may function as a ternary content-addressable memory cell as known in the art. However, the four transistor ternary content-addressable memory cell configures four transistors, and as such, provide a very compact device footprint. In addition, the four transistor ternary content-addressable memory cell may be formed within a back-end-of-line metal interconnect level, and thus, does not occupy any footprint at the front-end-of-line device level. Thus, the four transistor ternary content-addressable memory cell provides a compact and cost-effective solution for manufacture of a ternary content-addressable memory cell.

The foregoing outlines features of several embodiments so that those skilled in the art may better understand the aspects of the present disclosure. Each embodiment described using the term "comprises" also inherently discloses additional embodiments in which the term "comprises" is replaced with "consists essentially of" or with the term "consists of," unless expressly disclosed otherwise herein. Whenever two or more elements are listed as alternatives in a same paragraph of in different paragraphs, a Markush group including a listing of the two or more elements is also impliedly disclosed. Whenever the auxiliary verb "can" is used in this disclosure to describe formation of an element or performance of a processing step, an embodiment in which such an element or such a processing step is not performed is also expressly contemplated, provided that the resulting apparatus or device can provide an equivalent result. As such, the auxiliary verb "can" as applied to formation of an element or performance of a processing step should also be interpreted as "may" or as "may, or may not" whenever omission of formation of such an element or such a processing step is capable of providing the same result or equivalent results, the equivalent results including somewhat superior results and somewhat inferior results. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device structure comprising a four transistor ternary content-addressable memory cell, which comprises:

a first series connection of a first non-hysteretic transistor and a first memory transistor comprising a first memory element configured to store a first binary bit;

a second series connection of a second non-hysteretic transistor and a second memory transistor comprising a second memory element configured to store a second binary bit, wherein the first series connection and the second series connection are connected in parallel between a match line and a word line;

a primary bit line connected to a gate electrode of the first memory transistor; and a complementary bit line connected to a gate electrode of the second memory transistor.

2. The device structure of claim 1, wherein:

the first memory transistor comprises a first semiconductor channel;

the first non-hysteretic transistor comprises a second semiconductor channel; and the first semiconductor channel and the second semiconductor channel have a same material composition and a same thickness.

3. The device structure of claim 1, wherein:

the first memory transistor comprises a floating gate electrode;

the first non-hysteretic transistor comprises a non-floating gate electrode; and the floating gate electrode and the non-floating gate electrode have a same material composition and a same thickness.

4. The device structure of claim 3, wherein:

the floating gate electrode is vertically spaced from a top surface of a dielectric material layer by a backside gate dielectric that contacts a first segment of the top surface of the dielectric material layer; and the non-floating gate electrode is in contact with a second segment of the top surface of the dielectric material layer.

5. The device structure of claim 4, wherein sidewalls of the floating gate electrode are vertically coincident with sidewalls of the backside gate dielectric.

6. The device structure of claim 4 wherein:

the first memory transistor comprises a front gate dielectric that contacts a first semiconductor channel of the first memory transistor;

the first non-hysteretic transistor comprises a non-hysteretic gate dielectric that contacts a second semiconductor channel of the first non-hysteretic transistor; and the front gate dielectric and the non-hysteretic gate dielectric have a same material composition and a same thickness.

7. The device structure of claim 6, wherein:

one of the front gate dielectric and the backside gate dielectric comprises a tunneling dielectric layer that provides charge tunneling therethrough; and another of the front gate dielectric and the backside gate dielectric comprises a blocking dielectric layer that suppresses charge tunneling therethrough.

8. The device structure of claim 1, wherein:

the first memory transistor comprises a ferroelectric gate dielectric, a first semiconductor channel, and a first gate electrode; and the first non-hysteretic transistor comprises a non-hysteretic gate dielectric, a second semiconductor channel, and a second gate electrode.

9. The device structure of claim 1, further comprising:

a primary search line connected to a gate electrode of the second non-hysteretic transistor; and a complementary search line connected to a gate electrode of the first non-hysteretic transistor.

10. The device structure of claim 1, further comprising:

a semiconductor substrate comprising a single-crystalline semiconductor material;

a field effect transistor that includes a semiconductor channel containing a portion of the single-crystalline semiconductor material or comprising a same material as the single-crystalline semiconductor material; and a dielectric material layer overlying the field effect transistor, wherein the four transistor ternary content-addressable memory cell is located above the dielectric material layer.

11. A device structure comprising:

a first dielectric material layer overlying a substrate;

a first series connection of a first non-hysteretic transistor and a first memory transistor comprising a first memory element configured to store a first binary bit, the first series connection overlying the first dielectric material layer;

a second series connection of a second non-hysteretic transistor and a second memory transistor comprising a second memory element configured to store a second binary bit, wherein the first non-hysteretic transistor, the first memory transistor, the second non-hysteretic transistor, and the second memory transistor are embedded in a second dielectric material layer; and a match line and a word line embedded in a third dielectric material layer, wherein the first series connection and the second series connection are connected in parallel between the match line and the word line.

12. The device structure of claim 11, wherein:

the first memory transistor comprises a first gate electrode, a first gate dielectric, and a first semiconductor channel; and sidewalls of the first gate electrode, the first gate dielectric, and the first semiconductor channel are vertically coincident to one another.

13. The device structure of claim 12, wherein:

the first non-hysteretic transistor comprises a second gate electrode, a second gate dielectric, and a second semiconductor channel;

the first semiconductor channel and the second semiconductor channel have a same semiconductor material composition and a same semiconductor material thickness; and the first gate electrode and the second gate electrode have a same conductive material composition and a same conductive material thickness.

14. The device structure of claim 11, further comprising:

a first contact via structure formed within the second dielectric material layer and contacting each of the first non-hysteretic transistor and the first memory transistor; and a second contact via structure formed within the second dielectric material layer and contacting each of the second non-hysteretic transistor and the second memory transistor.

15. The device structure of claim 11, further comprising:

a primary search line connected to a gate electrode of the second non-hysteretic transistor; and a complementary search line connected to a gate electrode of the first non-hysteretic transistor.

16. The device structure of claim 11, further comprising:

a semiconductor substrate comprising a single-crystalline semiconductor material;

a field effect transistor that includes a semiconductor channel containing a portion of the single-crystalline semiconductor material or comprising a same material as the single-crystalline semiconductor material; and a dielectric material layer overlying the field effect transistor, wherein the four transistor ternary content-addressable memory cell is located above the dielectric material layer.

17. A method of forming a device structure, the method comprising:

forming a first memory transistor, a second memory transistor, a first non-hysteretic transistor, and a second non-hysteretic transistor, wherein the first memory transistor comprises a first memory element configured to store a first binary bit, and the second memory transistor comprises a second memory element configured to store a second binary bit;

forming a first series connection of the first memory transistor and the first non-hysteretic transistor;

forming a second series connection of the second memory transistor and the second non-hysteretic transistor;

forming a four transistor ternary content-addressable memory cell by forming a match line and a word line and by connecting the first series connection and the second series connection in parallel between the match line and the word line;

forming a first contact via structure directly on the first memory transistor and the first non-hysteretic transistor to provide the first series connection; and forming a second contact via structure directly on the second memory transistor and the second non-hysteretic transistor to provide the second series connection.

18. The method of claim 17, further comprising:

forming a first dielectric material layer over a substrate;

forming a backside gate dielectric layer over a first area of the first dielectric material layer without covering a second area of the first dielectric material layer;

forming a layer stack of a gate electrode material layer, a front gate dielectric layer, and a semiconductor material layer in the first area and the second area; and patterning the layer stack and the backside gate dielectric layer, wherein the first memory transistor and the second memory transistor comprise first patterned portions of the layer stack and patterned portions of the backside gate dielectric layer, and the first non-hysteretic transistor and the second non-hysteretic transistor comprise second patterned portions of the layer stack.

19. The method of claim 18, further comprising forming first conductive via structures and second conductive via structures within the first dielectric material layer, wherein:

the backside gate dielectric layer is formed directly on the first conductive via structures; and the gate electrode material layer is formed directly on the second conductive via structures.

20. The method of claim 17, further comprising:

forming a first dielectric material layer over a substrate;

forming a gate electrode material layer over the first dielectric material layer;

forming a ferroelectric dielectric layer over the gate electrode material layer in a first area;

forming a gate dielectric layer over the gate electrode material layer in a second area;

forming a semiconductor material layer over the ferroelectric dielectric layer and the gate dielectric layer; and patterning the semiconductor material layer, the gate dielectric layer, the ferroelectric dielectric layer, and the gate electrode material layer, wherein:

the first memory transistor and the second memory transistor comprise first patterned portions of the semiconductor material layer and the gate electrode material layer and patterned portions of the ferroelectric dielectric layer, and the first non-hysteretic transistor and the second non-hysteretic transistor comprise second patterned portions of the semiconductor material layer and the gate electrode material layer and patterned portions of the gate dielectric layer.

* * * * *